United States Patent
Ware et al.

(10) Patent No.: US 9,515,008 B2
(45) Date of Patent: Dec. 6, 2016

(54) TECHNIQUES FOR INTERCONNECTING STACKED DIES USING CONNECTION SITES

(71) Applicant: Rambus Inc., Sunnyvale, CA (US)

(72) Inventors: Frederick A. Ware, Los Altos Hills, CA (US); Ely Tsern, Los Altos, CA (US); Thomas Vogelsang, Mountain View, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 15/019,867

(22) Filed: Feb. 9, 2016

(65) Prior Publication Data

US 2016/0172271 A1    Jun. 16, 2016

Related U.S. Application Data

(63) Continuation of application No. 13/641,680, filed as application No. PCT/US2011/032197 on Apr. 13, 2011, now Pat. No. 9,287,239.

(60) Provisional application No. 61/328,116, filed on Apr. 26, 2010, provisional application No. 61/353,605, filed on Jun. 10, 2010.

(51) Int. Cl.
| | |
|---|---|
| H01L 23/538 | (2006.01) |
| H01L 23/48 | (2006.01) |
| H01L 25/065 | (2006.01) |
| H01L 25/18 | (2006.01) |
| G06F 3/06 | (2006.01) |

(52) U.S. Cl.
CPC ........... *H01L 23/481* (2013.01); *G06F 3/0604* (2013.01); *G06F 3/0629* (2013.01); *G06F 3/0673* (2013.01); *H01L 25/0657* (2013.01); *H01L 25/18* (2013.01); *G06F 2213/0038* (2013.01); *H01L 2224/131* (2013.01); *H01L 2224/16146* (2013.01); *H01L 2225/06544* (2013.01)

(58) Field of Classification Search
CPC ............................... H01L 23/538; H01L 25/16
See application file for complete search history.

(56) References Cited

U.S. PATENT DOCUMENTS

| | | |
|---|---|---|
| 7,623,365 B2 | 11/2009 | Jeddeloh |
| 2005/0233496 A1 | 10/2005 | Haba et al. |
| 2008/0054493 A1 | 3/2008 | Leddige et al. |
| 2009/0052218 A1 | 2/2009 | Kang |
| 2009/0103345 A1 | 4/2009 | McLaren et al. |
| 2009/0103855 A1 | 4/2009 | Binkert et al. |
| 2009/0161401 A1 | 6/2009 | Bilger et al. |
| 2009/0210600 A1 | 8/2009 | Jeddeloh |
| 2009/0219743 A1 | 9/2009 | Leedy |
| 2009/0321893 A1 | 12/2009 | Somasekhar et al. |
| 2010/0020583 A1 | 1/2010 | Kang et al. |
| 2010/0078790 A1 | 4/2010 | Ito et al. |

(Continued)

OTHER PUBLICATIONS

Anigundi et al., "Architecture Design Exploration of Three-Dimensional (3D) Integrated DRAM," Quality of Electronic Design, 2009, ISQED 2009, Mar. 16-18, 2009, pp. 86-90, 5 pages.

(Continued)

*Primary Examiner* — S. V. Clark
*Assistant Examiner* — Krista Soderholm
(74) *Attorney, Agent, or Firm* — Fenwick & West LLP

(57) ABSTRACT

An integrated circuit die includes conductive connection sites located at least on a surface of the integrated circuit die within a contiguous region thereof. The integrated circuit also includes a core circuit located outside the contiguous region. The core circuit is coupled to at least one of the connection sites.

20 Claims, 47 Drawing Sheets

(56) References Cited

U.S. PATENT DOCUMENTS

2011/0156284 A1  6/2011  Zhang et al.

OTHER PUBLICATIONS

Loh, Gabriel H., "3D-Stacked Memory Architectures for Multi-Core Processors," International Symposium on Computer Architecture, Jun. 21-25, 2008, pp. 453-464. 12 pages.

PCT Search Report and the Written Opinion dated Nov. 30, 2011 re Int'l. Application No. PCT/US2011/032197. 9 Pages.

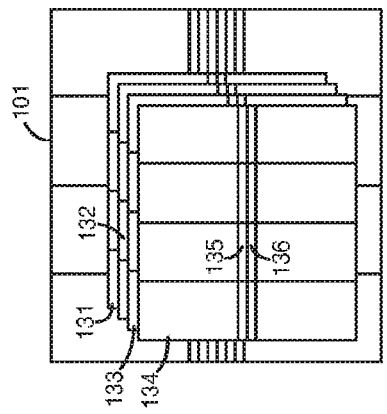
FIG. 1C
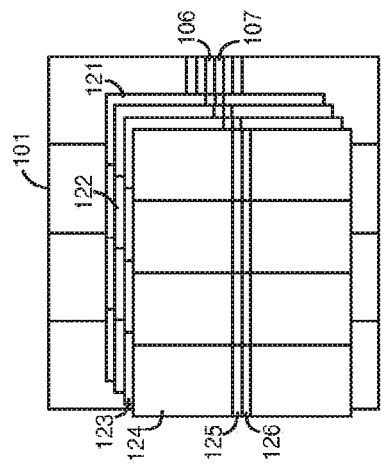
FIG. 1B
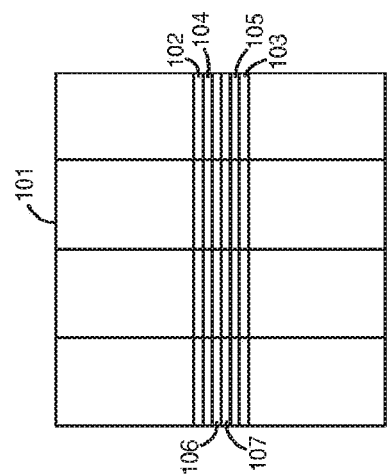
FIG. 1D
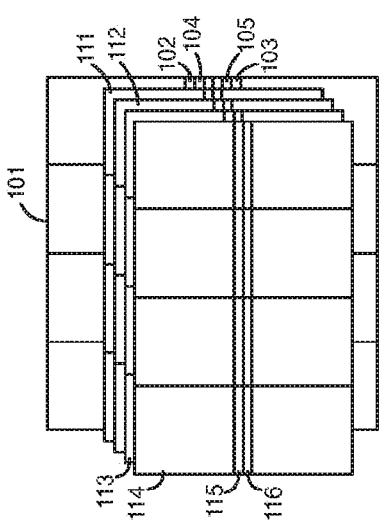
FIG. 1A
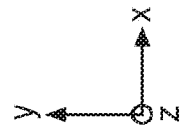

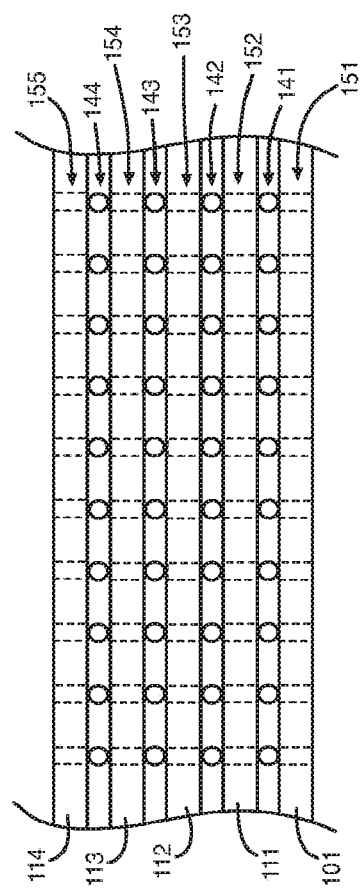
FIG. 1E
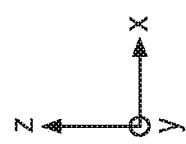

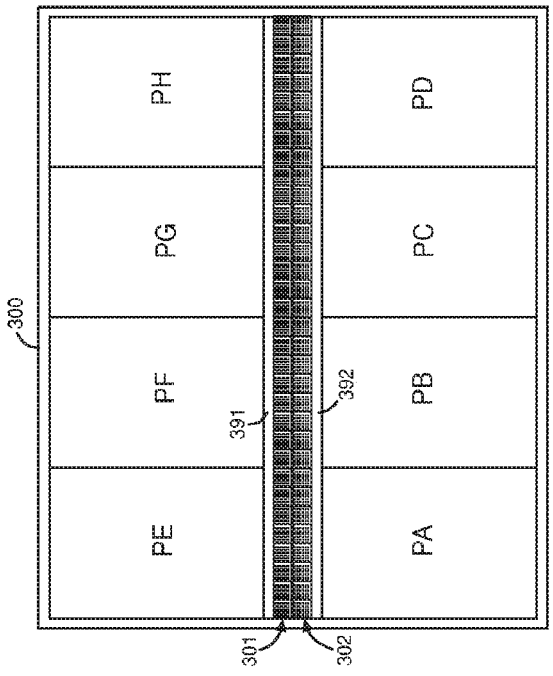
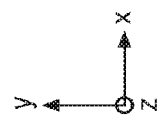
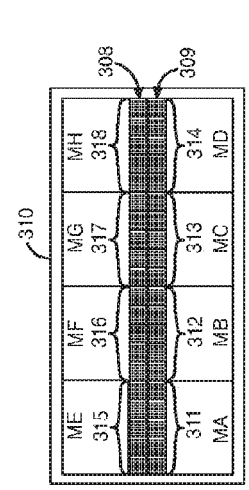
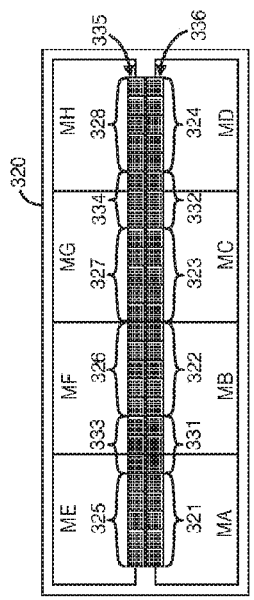
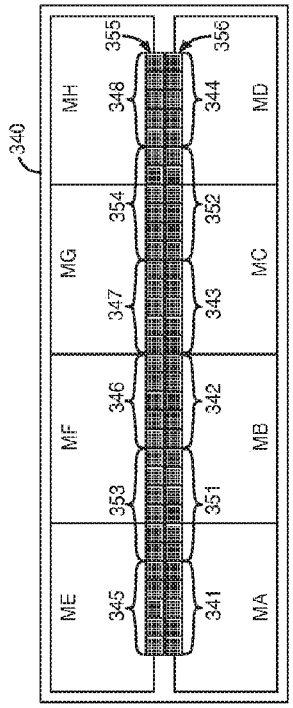

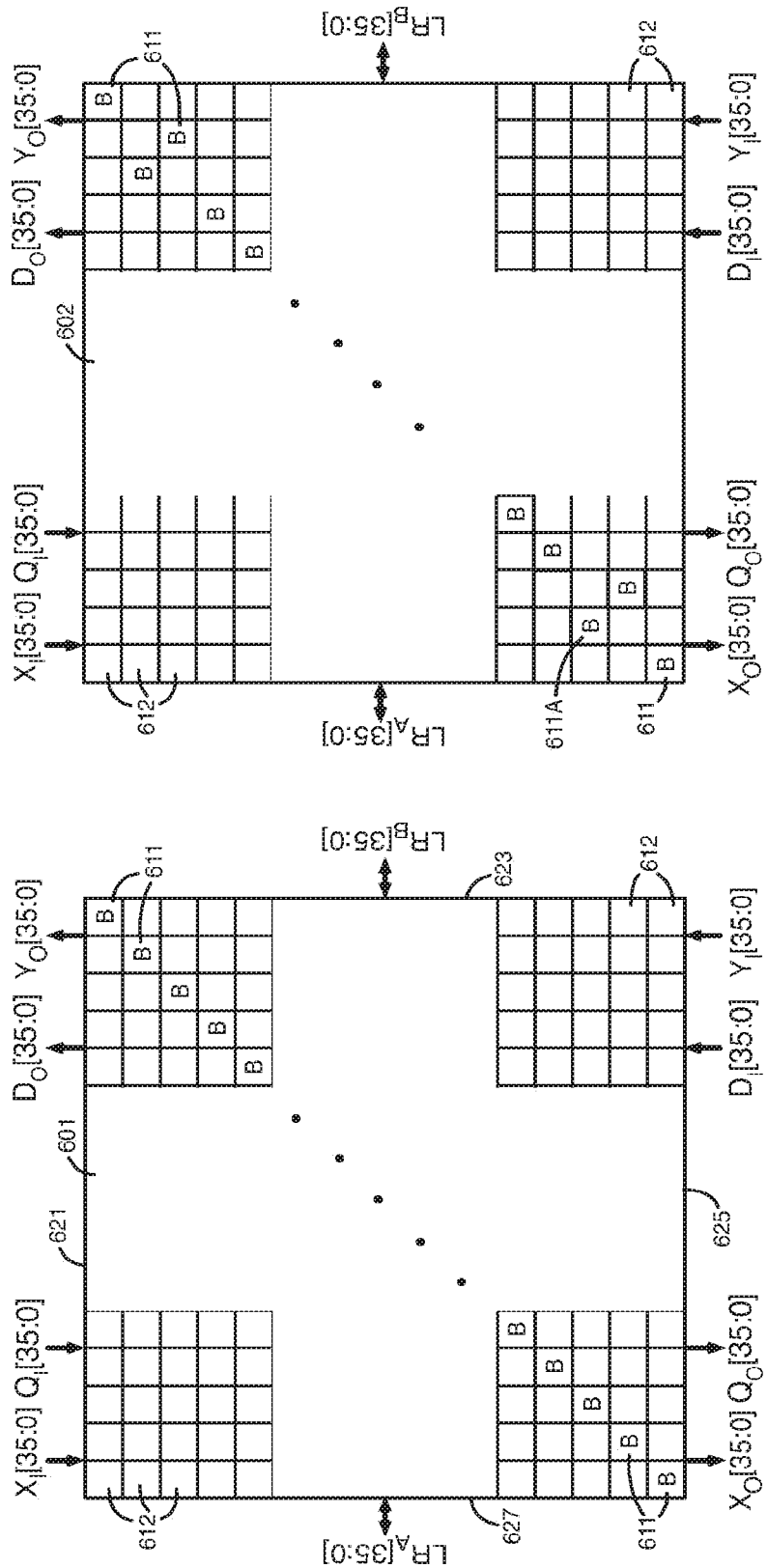

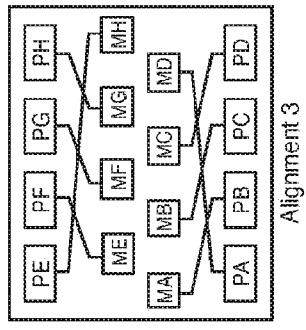
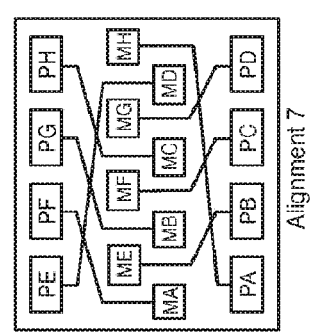
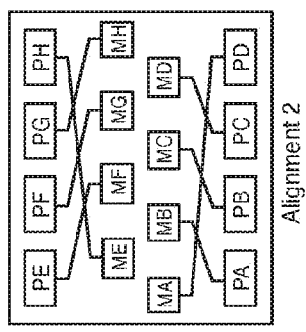
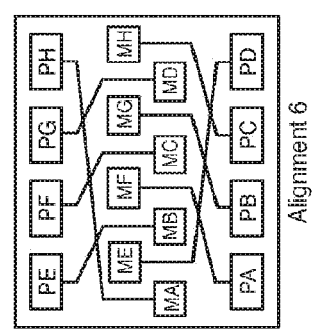
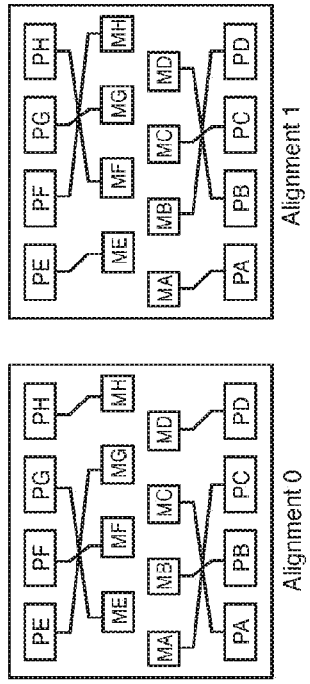
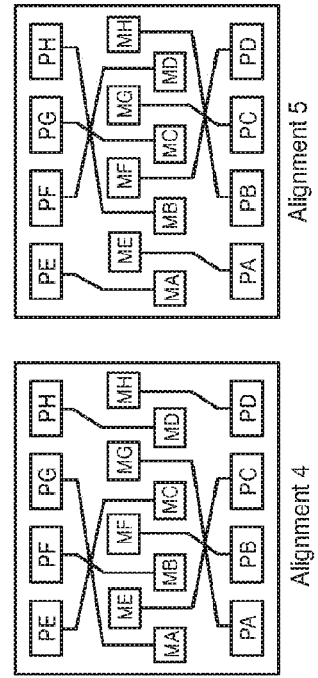

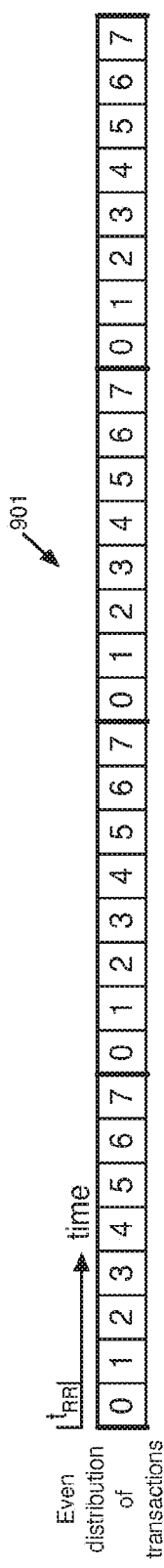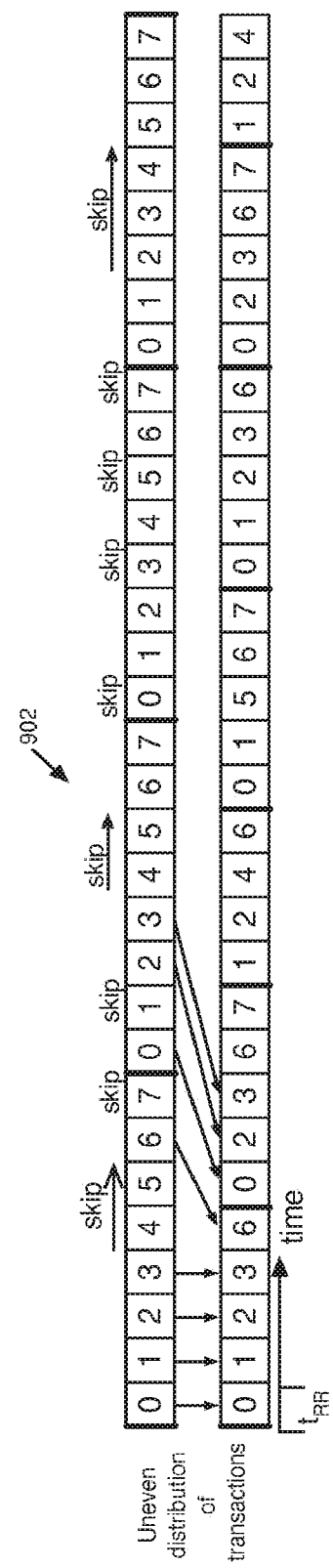
FIG. 9I
FIG. 9J

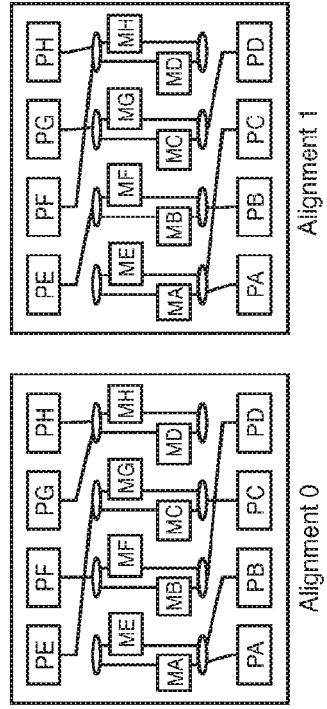

TECHNIQUES FOR INTERCONNECTING STACKED DIES USING CONNECTION SITES

CROSS REFERENCES TO RELATED APPLICATIONS

This patent application is a continuation of U.S. patent application Ser. No. 13/641,680, titled "Techniques For Interconnecting Stacked Dies Using Connection Sites" and filed on Oct. 16, 2012, which is a U.S. national stage application of international application number PCT/US2011/032197, filed Apr. 13, 2011, which claims the benefit of U.S. provisional patent application 61/328,116, filed Apr. 26, 2010, and U.S. provisional patent application 61/353,605, filed Jun. 10, 2010, all of which are incorporated by reference herein in their entireties.

BACKGROUND

Many computing systems, in particular mobile systems, have stacked processor and memory integrated circuit (IC) dies. For small form factor mobile systems, the stacking of IC dies helps to reduce the overall size of the system. In high performance systems, stacking IC dies using high density interconnect packaging techniques, such as through-silicon-via (TSV), can improve system bandwidth between processor and memory IC dies.

To date, the most widely used stacked packaging solutions utilize wire-bond technology to connect stacked IC dies or stacked packages, where connections between IC dies are made at the periphery of the stacked dies or packages. Emerging packaging alternatives, such as through-silicon-via (TSV) or chip-on-chip (COC), allow for connections between stacked IC dies using a two dimensional area array of connection sites.

COC packaging can be attractive when a single IC die is stacked on top of a processor IC die. TSV packaging is attractive when more than one IC die needs to be stacked on top of a processor IC die. One challenge with these approaches is the problem of matching up the connection sites between the wide variety of memory and processor IC die sizes.

One known solution involves using an interposer substrate to connect the processor IC die to the memory IC die. The interposer substrate reroutes signals to accommodate differences in the connection site placement between the two IC dies. Using an interposer substrate adds material and design cost, as well as complexity to the production flow, and is therefore undesirable.

A through-silicon-via (TSV) is an electrical connection that passes completely through an integrated circuit die from one surface of the die to the opposite surface of the die. "Silicon" in "through-silicon-via" does not limit the material of the integrated circuit die to silicon. The integrated circuit die may be a die of another semiconductor material. A TSV is typically a hole that extends through an integrated circuit die and is subsequently filled with electrically-conductive material to form the electrical connection. Two or more integrated circuit dies can be stacked on top on one another and connected together using through-silicon-vias (TSVs). The TSVs in adjacent integrated circuit dies can be connected together using, for example, solder bumps.

Individual integrated circuit dies that are stacked and connected together using TSVs are typically housed in a single package rather than being housed in separate packages. Because the integrated circuit dies are housed in a single package, they occupy less space than integrated circuit dies that are packaged separately and connected together through a printed circuit board (PCB). TSVs can also significantly reduce the amount and length of wiring that is used to connect together multiple integrated circuit dies, because the connections between the integrated circuit dies do not need to be routed through packages or a PCB. The shorter wires reduce power consumption and increase the performance of the integrated circuits.

In order for two integrated circuit dies to be connected together through TSVs, the TSVs need to have the same connection array structure in each integrated circuit die. Using the same TSV array structure in two integrated circuit dies allows corresponding TSVs in each die to be aligned when the two dies are stacked so that the TSVs can be connected using, e.g., solder bumps. This constraint limits the selection of integrated circuit dies that can be connected together using TSVs.

A processor IC die may be produced in multiple different die sizes as the design of the processor is shrunk due to a die shrink or a manufacturing process change. A processor IC die may need to attach to a variety of memory IC dies that are made by different manufacturers, have different capacities, and/or have different designs. If the dimensions of one of the integrated circuit dies is reduced, the TSVs in the two integrated circuit dies are no longer aligned when the integrated circuit dies are stacked and the TSVs cannot be connected together.

BRIEF DESCRIPTION OF THE DRAWINGS

FIGS. 1A-1D illustrate examples of stacked integrated circuit dies that are directly coupled through connection sites arranged in horizontal stripes.

FIG. 1E is a side view of a portion of the stacked integrated circuit dies shown in FIG. 1A.

FIGS. 3A-3D illustrate examples of four integrated circuit dies having different sizes that can be stacked on top of each other and directly connected together through connection sites in the integrated circuit dies.

FIGS. 6A-6D illustrate alternative examples of circuits that can be used to implement the alignment circuitry.

FIGS. 9A-9H illustrate examples of 8 alignment configurations of the alignment circuitry that can be used to connect processor core circuits to memory core circuits in one or more of the stacked integrated circuit dies using the circuitry shown in FIGS. 5A-5F.

FIGS. 9I-9J are timing diagrams that illustrate examples of even and uneven distributions, respectively, of the alignment configurations of FIGS. 9A-9H.

FIGS. 10A-10H illustrate examples of another 8 alignment configurations of the alignment circuitry that can be used to connect processor core circuits to memory core circuits in one or more of the stacked integrated circuit dies using the circuitry shown in FIGS. 6A-6D.

DETAILED DESCRIPTION

Figure 2A:
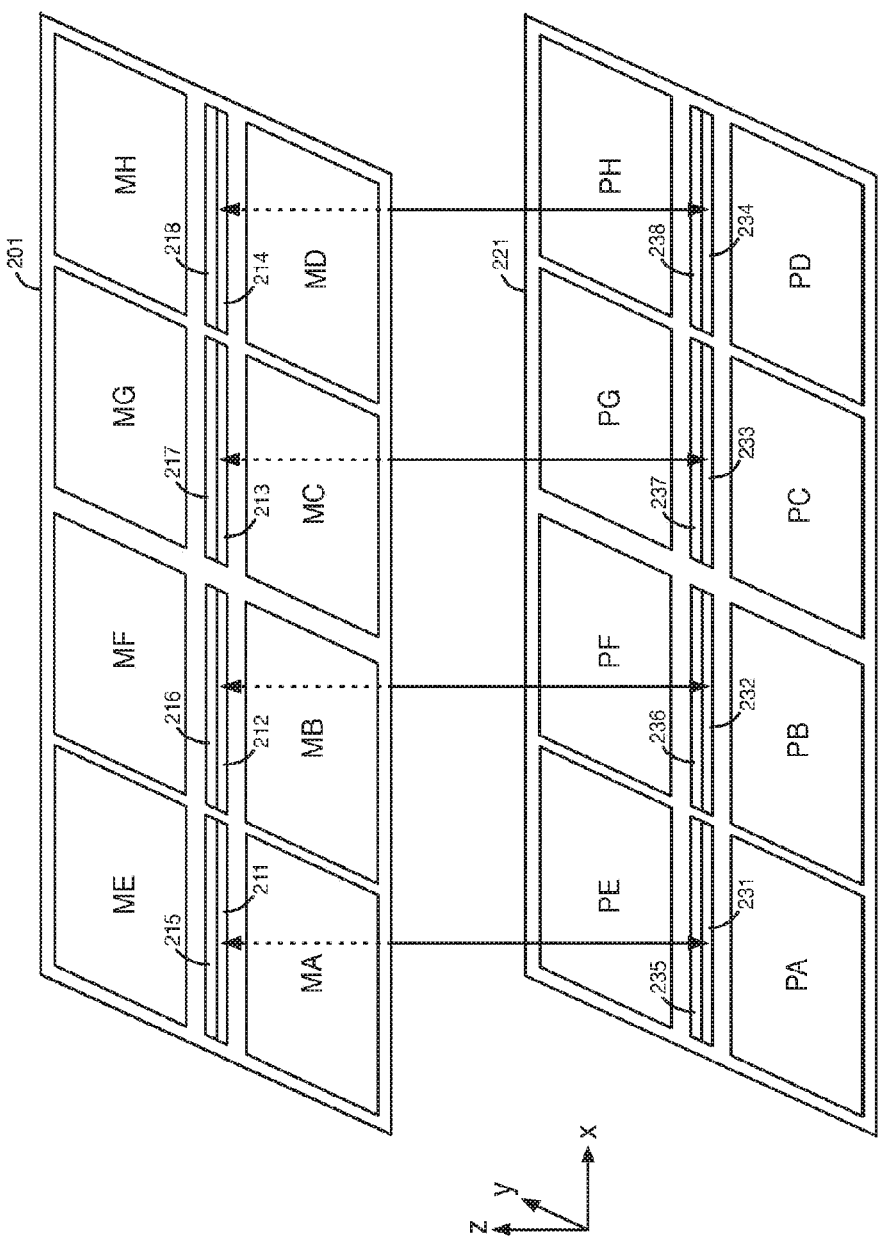
FIG. 2A is a more detailed diagram that shows how two stacked integrated circuit dies can communicate with each other through the connections sites.

In this disclosure, an "integrated circuit die" is a thin piece of material, typically square or rectangular in shape, on or in which an integrated circuit is fabricated. The "top" surface of an integrated circuit die is the surface in or on which all or most of the integrated circuit is located, regardless of the spatial orientation of the die. The "bottom" surface is the surface of the die opposite the top surface. The top surface and the bottom surface are the major surfaces of the die. The direction parallel to the longer side of the die in the plane of the top surface will be referred to as the "x-direction," the direction orthogonal to the x-direction in the plane of the top surface of the die will be referred to as the "y-direction," and the direction orthogonal to the plane of the top surface will be referred to as the "z-direction." Terms such as "vertical," "up," "upward," "down," "downward," "on top of," and "underneath" relate to the z-direction, regardless of the spatial orientation of the die.

Two or more integrated circuit dies can be directly attached together without inserting an interposer layer between them. Connection sites defined in conductive layers on the top or bottom surface of a first integrated circuit die can be directly coupled to corresponding connection sites defined in respective conductive layers on either or both the top or bottom surface of a second integrated circuit die. Connection sites defined in respective conductive layers on either or both the top or bottom surfaces of additional integrated circuit dies can be directly coupled to corresponding connection sites defined in the conductive layer on the exposed surface of previously stacked integrated circuit dies. The connection sites of the stacked integrated circuit dies are matched in the same relative locations on the facing surfaces of adjacent integrated circuit dies in the stack. The connection site patterns on surfaces of first and second integrated circuit dies are identical when the surface of the first integrated circuit die is directly coupled to the surface of the second integrated circuit die. In accordance with some embodiments, the connection sites on each stacked integrated circuit die are limited to a predefined subset of the surface area of each integrated circuit die.

In some embodiments, the connection sites on the facing surfaces of two adjacent integrated circuit dies have the same density per unit area. For example, the connection sites on the facing surfaces of two adjacent integrated circuit dies have the same width and length as well as the same spacing between the connection sites.

In some embodiments, a first integrated circuit die (e.g., a processor IC die) has an interface including an array of connection sites that have a fixed pitch between adjacent connection sites. The first integrated circuit die has a larger number of connection sites than a second integrated circuit die that is stacked on the first integrated circuit die. The second integrated circuit die (e.g., a memory IC die) has an interface including an array of connections sites that have the same fixed pitch between adjacent connection sites as the first integrated circuit die. The second integrated circuit die has fewer connection sites than the first integrated circuit die. When the first and the second integrated circuit dies are stacked, the connection sites of the second integrated circuit die are in contact with a subset of the connection sites on the first integrated circuit die. The first integrated circuit die interface also has configurable alignment circuits that route signals between the connection sites in contact with the second integrated circuit die and the internal logic circuits of the first integrated circuit die. In some embodiments, the configurable alignment circuits are connected together by conductors that pass between the connection sites.

Conductive material such as solder balls or solder bumps may be used to couple together the connection sites of the stacked integrated circuit dies. Alternatively, the connection sites can be directly bonded using, for example, thermal compression bonding, as described for example in U.S. Pat. No. 5,915,167. The connection sites on the top and bottom surfaces of the stacked integrated circuit dies may be electrically connected by conductive vias (e.g., TSVs) that pass completely through the integrated circuit die from the top surface of the die to the bottom surface of the die. Alternatively, some or all of the connection sites in one or more of the integrated circuit dies can be exposed on only one major surface of each integrated circuit die. The integrated circuit die on the top or bottom of a stack of directly coupled integrated circuit IC dies can have connection sites that are only exposed on one surface the die.

FIGS. 1A-1D illustrate examples of stacked integrated circuit dies in which direct electrical connections are provided through connection sites all located in one or more connection regions. The examples shown in FIGS. 1A-1D have two long, narrow, rectangular connection regions that extend along each integrated circuit die in the x-direction, approximately half-way across the width of the integrated circuit die. Other connection region configurations and locations are possible and may be used. In an example, the exposed ends of through-silicon-vias (TSVs) provide the connection sites. Each TSV is composed of conductive material located in a hole that extends all the way through the die from the top surface of the die to the bottom surface of the die.

According to some embodiments, any of the TSVs described herein can extend through the die to connect a first connection site located on the top surface of the die to a second connection site on the bottom surface of the die. The second connection site is offset from the first connection site in the z-direction, and is aligned with the first connection site in the x-y plane.

According to other embodiments, some of the TSVs described herein do not extend straight through the die from the top surface of the die to the bottom surface of the die. A TSV can extend through the die in the z-direction and additionally in one or both of the x- and y-directions to connect together first and second connection sites when the first connection site on the top surface of the die and the second connection site on the bottom surface of the die are not aligned in the x-y plane. In these embodiments, the connection sites on the top surface of the integrated circuit die may have a different pattern than the connection sites on the bottom surface of the integrated circuit die that are coupled to the connection sites on the first surface by TSVs extending through the die.

According to alternative embodiments, the connection sites are located on only one surface of the integrated circuit die. In these embodiments, the connection sites are not connected to respective TSVs. The connection sites are primarily described herein as being electrically connected by TSVs for the purpose of illustration. Any of the connection sites described herein as being connected by TSVs in integrated circuit dies that are on the top and bottom of a stack of directly coupled integrated circuit dies can be replaced with connection sites that are exposed on only one surface of each of these integrated circuit dies.

The integrated circuit dies shown in FIGS. 1A-1C are stacked in the z-direction orthogonal to the major surfaces of the dies shown in these Figures. The integrated circuit dies shown in FIGS. 1A-1C are connected together by bonding the connection sites located on the opposed surfaces of adjacent ones of the dies together. The integrated circuit dies shown in FIGS. 1A-1C can be stacked and bonded together without inserting a package or an interposer substrate between the adjacent ones of the dies in the stack.

Referring to FIGS. 1A-1D, an integrated circuit (IC) die 101 includes several connection sites (provided, e.g., by the exposed ends of respective TSVs) located in two common connection regions 106-107. In the example shown, connection regions 106-107 are each a long, narrow, rectangular region that extends across the die in the x-direction. A region that is rectangular, long and narrow will be referred to herein as a stripe, and a stripe in which connection sites are located will be referred to as a connection stripe. The connection stripes may alternatively extend in the y-direction. IC die 101 also includes controller circuits in regions 102-103 and routing circuitry in regions 104-105, which are described in detail below. Regions 102-105 are also stripes disposed parallel to connection stripes 106-107, as shown in FIG. 1D.

According to the example shown in FIG. 1A, four integrated circuit dies 111-114 are stacked on top of integrated circuit die 101. Each of the integrated circuit dies 111-114 has several connection sites (electrically connected, e.g., to respective TSVs) located in respective connection stripes. For example, IC die 114 has connection sites located in connection stripes 115 and 116. Integrated circuits dies 101 and 111-114 only have connection sites located in their respective connection stripes. The connection sites on each of IC dies 101 and 111-114 are arranged within the respective connection stripes in the same pattern so that the connection sites in each die are directly on top of or directly underneath the corresponding connection sites in the adjacent die when the die are stacked.

The connection stripes in which the connection sites are located are the same width (y-direction dimension) in each of the dies that are stacked. However, these connection stripes do not need to be the same length (x-direction dimension) in each die that is stacked. For example, integrated circuit dies 121-124 can be stacked on top of IC die 101, as shown in FIG. 1B. Each of IC dies 121-124 has several connection sites that are located in two connection stripes. In an example, IC die 124 has connection sites located in connection stripes 125-126 on the top surface of the IC die. Each connection site is electrically connected to a respective TSV that extends through IC die 124 to a respective connection site located on the bottom surface of the IC die. The connection sites on the bottom surface of IC die 124 are located in connection stripes (not shown) aligned in the x-y plane with connection stripes 125-126.

Respective connection stripes in IC dies 121-123 in which the connection sites are located have the same widths as connection stripes 106-107. IC dies 121-124 have shorter lengths than IC dies 101 and 111-114. The connection sites on each IC die in the stack are arranged in layout patterns within the connection stripes that allow each of these connection sites to be connected to a respective one of the connection sites in the adjacent IC dies in the stack. Because IC dies 121-124 have fewer connection sites than IC die 101, some of the connection sites in IC die 101 are not connected to any connection site on IC dies 121-124.

The connection sites on each IC die are arranged in the same layout pattern within the connection stripes that have the same width. If different IC manufacturers form the connection sites in their ICs in accordance with this layout pattern, then ICs made by these manufacturers can be stacked on top of each other, and the connection sites in these stacked ICs can be bonded together without placing a package or interposer substrate between the ICs. ICs stacked and connected in the manner just described require less space, use less wiring, and perform faster than ICs that are connected using conventional packaging techniques.

According to another example, integrated circuit dies 131-134 are stacked on top of IC die 101, as shown in FIG. 1C. As shown in FIGS. 1A-1C, IC die 101 is configurable to be coupled to IC dies having different dimensions, such as IC dies 111-114, 121-124, and 131-134, through the connection sites in connection stripes 106-107.

Each of the IC dies 131-134 shown in FIG. 1C also has several connection sites located in two connection stripes on each die. In an example, IC die 134 has several connection sites located in connection stripes 135-136 on the top surface of the IC die. Each connection site on IC dies 131-134 is electrically connected to a respective TSV that extends through the IC die to a respective connection site on the bottom surface of the IC die. The connection sites on the bottom surface of IC die 134 are located in connection stripes (not shown) aligned in the x-y plane with connection stripes 135-136. Connection stripes 135-136 and similar connection stripes in IC dies 131-133 have the same widths as connection stripes 106-107 described above with reference to FIG. 1D. IC dies 131-134 have shorter lengths than IC dies 101 and 121-124 in FIG. 1B. The connection sites on the top surface of each IC die in the stack are arranged within their respective connection stripes in layout patterns that allow the connection sites to be aligned directly above or below the corresponding connection sites in the connection stripes on the bottom surface of the adjacent IC die. Because IC dies 131-134 have fewer connection sites than IC die 101, some of the connection sites on IC die 101 are not connected to any connection site on IC dies 131-134.

IC dies 101, 111-114, 121-124, and 131-134 can be any types of IC dies. According to some embodiments, IC dies 101 are processor IC dies, and IC dies 111-114, 121-124, and 131-134 are memory IC dies. According to some embodiments, multiple memory IC dies of different sizes are stacked on top of a single processor IC die and are connected to the processor IC die using connection sites and TSVs as described herein. In other embodiments, the memory IC dies are all of the same size. In yet other embodiments, the memory IC dies and the processor IC dies are all of the same size. Moreover, after a die shrink, the memory IC dies are smaller than the processor IC die, but memory IC dies of either size can be stacked on top of the processor IC die and can be connected thereto using connection sites and TSVs as described herein.

FIG. 1E is a side view of a portion of the stacked integrated circuit dies 101 and 111-114 shown in FIG. 1A. FIG. 1E illustrates an example of how integrated circuit dies 101 and 111-114 can be coupled together through solder balls. In the example of FIG. 1E, connection sites in IC dies 101 and 111 are connected together via solder balls 141, connection sites in IC dies 111 and 112 are connected together via solder balls 142, connection sites in IC dies 112 and 113 are connected together via solder balls 143, and connection sites in IC dies 113 and 114 are connected together via solder balls 144.

In the example of FIG. 1E, IC die 101 has TSVs 151 that connect to solder balls 141, IC die 111 has TSVs 152 that connect to solder balls 141 and 142, IC die 112 has TSVs 153 that connect to solder balls 142 and 143, and IC die 113 has TSVs 154 that connect to solder balls 143 and 144. IC die 114 has TSVs 155 that connect solder balls 144 to circuitry on the upper surface of IC die 114. Connection sites (not shown) on the bottom surface of IC die 101 may, for example, connect TSVs 151 to a printed circuit board through a package (not shown) or directly through solder balls (not shown).

FIG. 2A is a more detailed diagram that shows how two stacked integrated circuit dies 201 and 221 can communicate with each other through connection sites, such as connection sites electrically connected by through-silicon-vias (TSVs), located in one or more connection stripes. In the example of FIG. 2A, integrated circuit (IC) dies 201 and 221 have the same width and the same length. IC die 201 has 8 core circuits MA-MH, each having a respective connection stripe 211-218. In the example shown, connection stripes 211-214 are concatenated to form a larger connection stripe similar to connection stripe 115 in FIG. 1A, as are connection stripes 215-218 to form a larger connection stripe similar to connection stripe 116. IC die 221 has 8 core circuits PA-PH, each having a respective connection stripe 231-238. In the example shown, connection stripes 231-234 are concatenated to form a larger connection stripe similar to connection stripe 106 in FIG. 1D, as are connection stripes 235-238 to form a larger connection stripe similar to connection stripe 107. IC dies 201 and 221 can be any types of IC dies. In one embodiment, IC die 201 is a memory IC die having 8 separate memory core circuits MA-MH, and IC die 221 is a processor IC die having 8 separate processor core circuits PA-PH.

IC die 201 has numerous connection sites electrically connected to respective TSVs, or single surface connection sites, in connection stripes 211-218. IC die 221 has numerous connection sites electrically connected to TSVs, or single surface connection sites, in connection stripes 231-238. Connection stripes 211-218 and 231-238 can differ in shape from the example shown in FIG. 2A. In the example shown, connection stripes 211-218 and 231-238 all have the same width and the same length.

IC dies 201 and 221 are connected together by placing IC die 201 directly on top of IC die 221 so that connection stripes 211-218 completely overlap connection stripes 231-238, respectively, and the connection sites in connection stripes 211-218 are directly over corresponding connection sites in stripes 231-238, respectively. The connection sites in connection stripes 211-218 and 231-238 have the same layout patterns, respectively. Bottom-side connection sites (not shown) aligned with the connection sites in connection stripes 211-218 are located on the bottom surface of IC die 201 and are connected to respective ones of the connection sites in connection stripes 211-218 by respective TSVs. Each of the bottom-side connection sites in IC die 201 is connected to a corresponding connection site in IC die 221 that it overlies directly, or through, for example, a solder connection. The arrows shown in FIG. 2A indicate that the connection sites in connection stripes 211-214 are connected to the connection sites in connection stripes 231-234, respectively, via respective TSVs.

In the example shown, the connection sites in connection stripes 211-218 are connected to memory core circuits MA-MH, respectively, through routing wires and configurable connections in IC 201. The connection sites in connection stripes 231-238 are connected to processor core circuits PA-PH, respectively, through routing wires and configurable connections in IC die 221. Thus, the connection sites in each connection stripe 211-218 and 231-238 are connected to the core circuit located adjacent thereto.

Figure 2B:
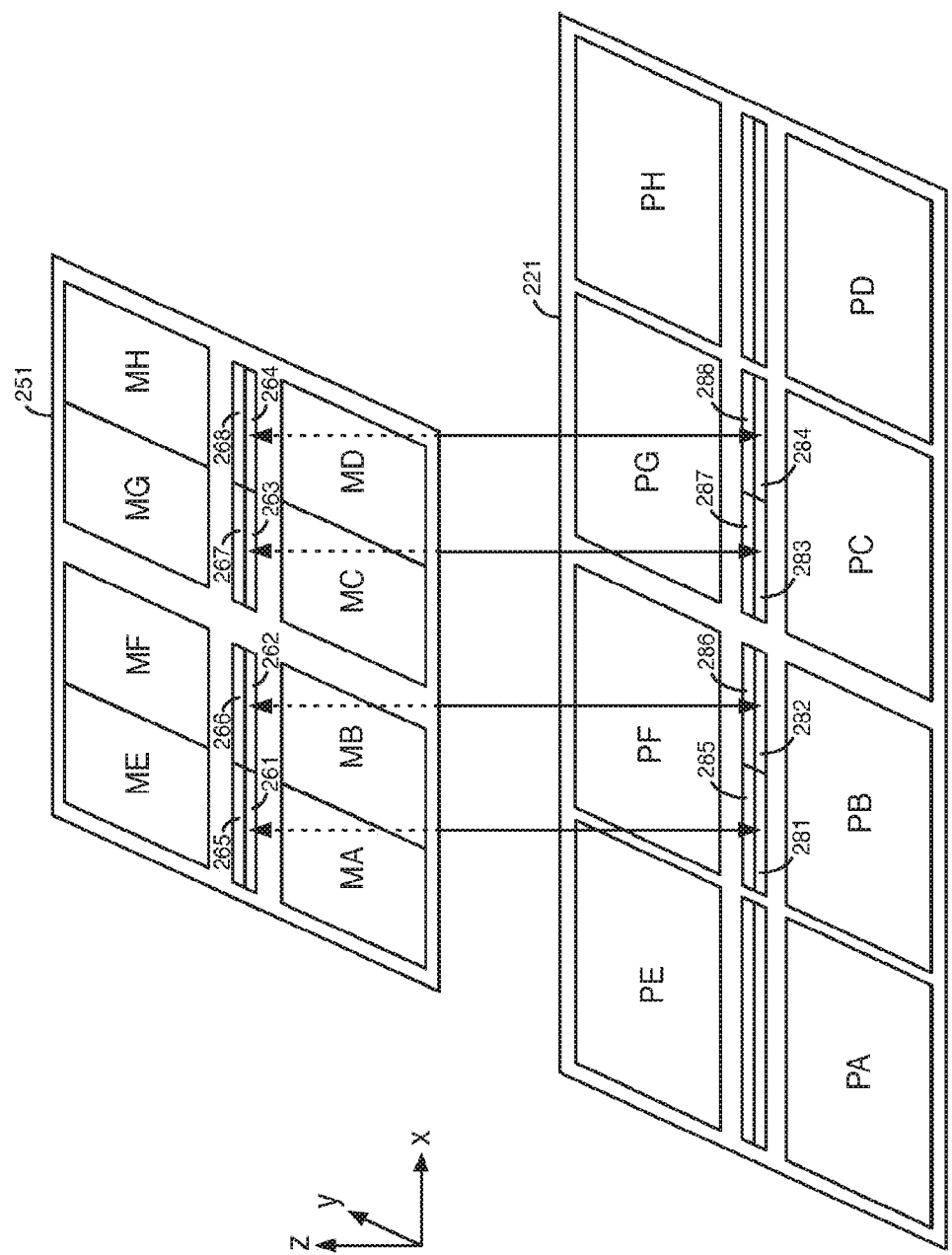
FIG. 2B is a diagram that shows how two stacked integrated circuit dies having different dimensions can communicate with each other through connection sites.

FIG. 2B is a diagram that shows how two integrated circuit dies 251 and 221 having different dimensions can communicate with each other through connection sites, such as connection sites connected by respective TSVs. IC die 221 in FIG. 2B is the same IC die 221 shown in FIG. 2A. FIGS. 2A-2B illustrate that IC die 221 can be coupled to two IC dies 201 and 251 that have different dimensions.

As shown in FIG. 2B, integrated circuit die 251 is smaller than IC die 221. IC die 251 has 8 memory core circuits MA-MH. IC die 251 also has 8 connection stripes 261-268 in which connection sites are located. Each of the connection stripes 261-268 has the same width and, in the example shown, the same length. The connection sites in each of the connection stripes 261-268, 231-238, and 211-218 have the same dimensions and are located the same distances apart from each other to accommodate connections between connection sites on facing surfaces of different IC dies.

IC die 251 can be any type of IC die. In one embodiment, IC die 251 is a memory IC die. Connection stripes 232-233 and 236-237 in IC die 221 are shown as being subdivided into 8 connection stripes 281-288 of connection sites in FIG. 2B.

IC dies 221 and 251 are connected together by placing IC die 251 directly on top of IC die 221 so that connection stripes 261-268 completely overlap connection stripes 281-288, respectively, and the TSVs that extend through IC die 251 from the connection sites in connection stripes 261-268 are directly over the connection sites in connection stripes 281-288, respectively, in IC die 221. The connection sites in connection stripes 261-268 and the TSVs that extend therefrom have the same layout patterns as the connection sites in connection stripes 281-288, respectively. Each of the TSVs that extend from the connection sites in connection stripes 261-268 is electrically connected to the connection site in one of the connection stripes 281-288 that it overlies. The connection is a direct connection, or the connection is provided through, for example, a solder connection. The arrows in FIG. 2B show that the connection sites in connection stripes 261-264 are connected to the connection sites in connection stripes 281-284, respectively.

In an example, the connection sites in connection stripes 261-268 are connected to memory core circuits MA-MH, respectively, through routing conductors and configurable connections in IC die 251. The connection sites in connection stripes 281-288 are connected to processor core circuits PA-PH, respectively, through routing conductors and configurable connections in IC die 221. Further details of these routing conductors and configurable connections are described below.

FIGS. 3A-3D respectively illustrate examples of four integrated circuit dies 300, 310, 320, and 340 having different sizes that can be stacked on top of each other and connected together through connection sites and TSVs in the integrated circuit dies. FIG. 3 shows top views of integrated circuit dies 300, 310, 320, and 340.

Each of the four integrated circuit dies 300, 310, 320, and 340 has a respective length that is different from the lengths of the other three integrated circuit dies shown in FIG. 3. Each of the three integrated circuit dies 310, 320, and 340 has the same width. Each of the integrated circuit dies 300, 310, 320, and 340 has connection sites located in two connection stripes extending across the center of each integrated circuit die. Through-silicon-vias (TSVs) extend from the connection sites in the two integrated circuit dies 320 and 340 that are located in the middle of the stack through the thickness of the respective die.

Integrated circuit (IC) die 300 has connection sites located in two connection stripes 301-302. IC die 310 has connection sites located in two connection stripes 308-309. IC die 320 has connection sites located in two connection stripes 335-336, and respective TSVs extending through the thickness of IC die 320. IC die 340 has connection sites located in two connection stripes 355-356, and respective TSVs extending through the thickness of IC die 340.

In the example shown in FIGS. 3C and 3D, each of connection stripes 301-302 and 355-356 is composed of 32 blocks of connection sites. In the example shown in FIG. 3A, each of connection stripes 308-309 is composed of 20 blocks of connection sites. In the example shown in FIG. 3B, each of connection stripes 335-336 is composed of 26 blocks of connection sites. Such blocks of connection sites will be referred to herein as connection site blocks. In the examples shown, each of the connection site blocks is square and is composed of, for example, 36 connection sites.

The connection sites in each connection site block in FIGS. 3A-3C can, for example, transmit data signals, mask signals, control signals, and command-address signals that are not shared between the 8 core circuits PA-PH of IC die 300 and the 8 core circuits MA-MH of each of IC dies 310, 320, and 340. These signals can be transmitted through any of the connection sites that are used to transmit signals between IC dies. Other signals transmitted through the connection sites can be shared between the 8 core circuits PA-PH of IC die 300 and the 8 core circuits MA-MH of each of IC dies 310, 320, and 340. These shared signals can be, for example, power signals, ground signals, clock signals, test signals, sideband signals, etc. These shared signals can, for example, be transmitted using fixed, dedicated connection sites located in a separate connection site area adjacent connection stripes 301-302, 308-309, 335-336, and 355-356. In other embodiments, these shared signals are transmitted using connection sites located the connection stripes 301-302, 308-309, 335-336, and 355-356.

In IC dies 320 and 340, a TSV extends from each connection site in the connection site block through the thickness of the respective IC die. According to other embodiments, the numbers of connection site blocks constituting connection stripes 301-302, 308-309, 335-336, and 355-356 are different from those illustrated, and/or the connection site blocks have other shapes and/or are composed of other suitable numbers of connection sites.

IC die 340 is stacked on top of IC die 300 in a position in which connection stripes 355 and 356 completely and exactly overlap connection stripes 301 and 302, respectively. The connection sites in connection stripes 301-302 and 355-356 have the same layout patterns. Thus, each of the connection sites in connection stripes 355 and 356 is located directly above a respective one of the connection sites in connection stripes 301 and 302, respectively. The connection sites in connection stripes 301-302 are bonded to the ends of the respective TSVs that extend from corresponding connection sites in connection stripes 355-356 without placing a package or an interposer substrate between IC dies 300 and 340.

IC die 320 can then be stacked on top of IC die 340 in a position in which connection stripes 335 and 336 overlie parts of connection stripes 355 and 356, respectively. Connection site blocks 322-323 and 326-327 completely overlap connection site blocks 342-343 and 346-347, respectively. Connection site blocks 321 and 331 overlap connection site blocks 351 and two of the connection site blocks 341. Connection site blocks 325 and 333 overlap connection site blocks 353 and two of the connection site blocks 345. Connection site blocks 332 and 324 overlap connection site blocks 352 and two of the connection site blocks 344. Connection site blocks 334 and 328 overlap connection site blocks 354 and two of the connection site blocks 348. The connection sites in IC die 340 are bonded to the TSVs that extend from the overlapping connection sites in IC die 320 without placing a package or an interposer substrate between the two IC dies. The connection sites in the overlapping connection site blocks have the same layout patterns. The connection sites in 12 of the connection site blocks in IC die 340 (i.e., 3 on the right side and 3 on the left side of each of connection stripes 355 and 356) are not connected to the ends of TSVs that extend from connection sites in IC die 320.

IC die 310 can then be stacked on top of IC die 320 in a position that causes connection stripes 308 and 309 to overlie parts of connection stripes 335 and 336, respectively. Connection site blocks 312-313 and 316-317 completely overlap connection site blocks 322-323 and 326-327, respectively. Connection site blocks 311 overlap connection site blocks 331 and two of connection site blocks 321. Connection site blocks 315 overlap connection site blocks 333 and two of connection site blocks 325. Connection site blocks 314 overlap connection site blocks 332 and two of connection site blocks 324. Connection site blocks 318 overlap connection site blocks 334 and two of connection site blocks 328. The connection sites in IC die 320 are bonded to the TSVs that extend from the overlapping connection sites in IC die 310 without placing a package or an interposer substrate between the two IC dies. The connection sites in the overlapping connection site blocks have the same layout patterns. The connection sites in 12 of the connection site blocks of IC die 320 (i.e., 3 on the right side and 3 on the left side of each of connection stripes 335 and 336) are not connected to connection sites in IC die 310.

IC die 300 also includes 8 core circuits PA-PH and alignment stripes 391-392 that contain configurable alignment circuitry for connecting core circuits PA-PH to any of the connection sites in connection stripes 301-302. IC dies 300, 310, 320, and 340 can be any types of IC dies. For example, IC die 300 can be a processor IC die, and IC dies 310, 320, and 340 can be memory IC dies. In an alternative embodiment, the TSVs in IC die 300 can be omitted.

Figure 4A:
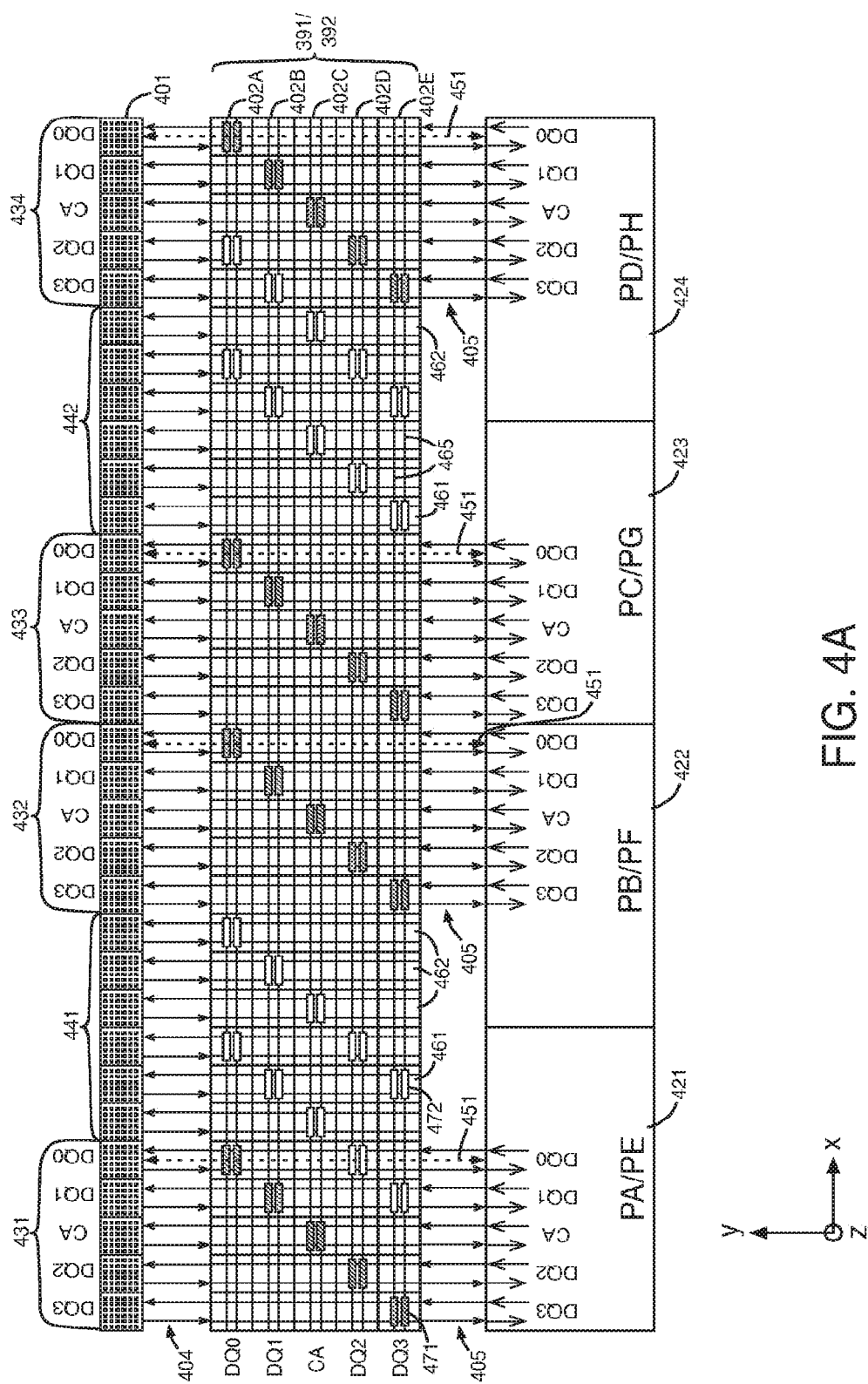
FIGS. 4A-4C illustrate examples of how alignment circuitry in an integrated circuit die can directly couple together different core circuits to stacked integrated circuit dies having different sizes.
Figure 4B:
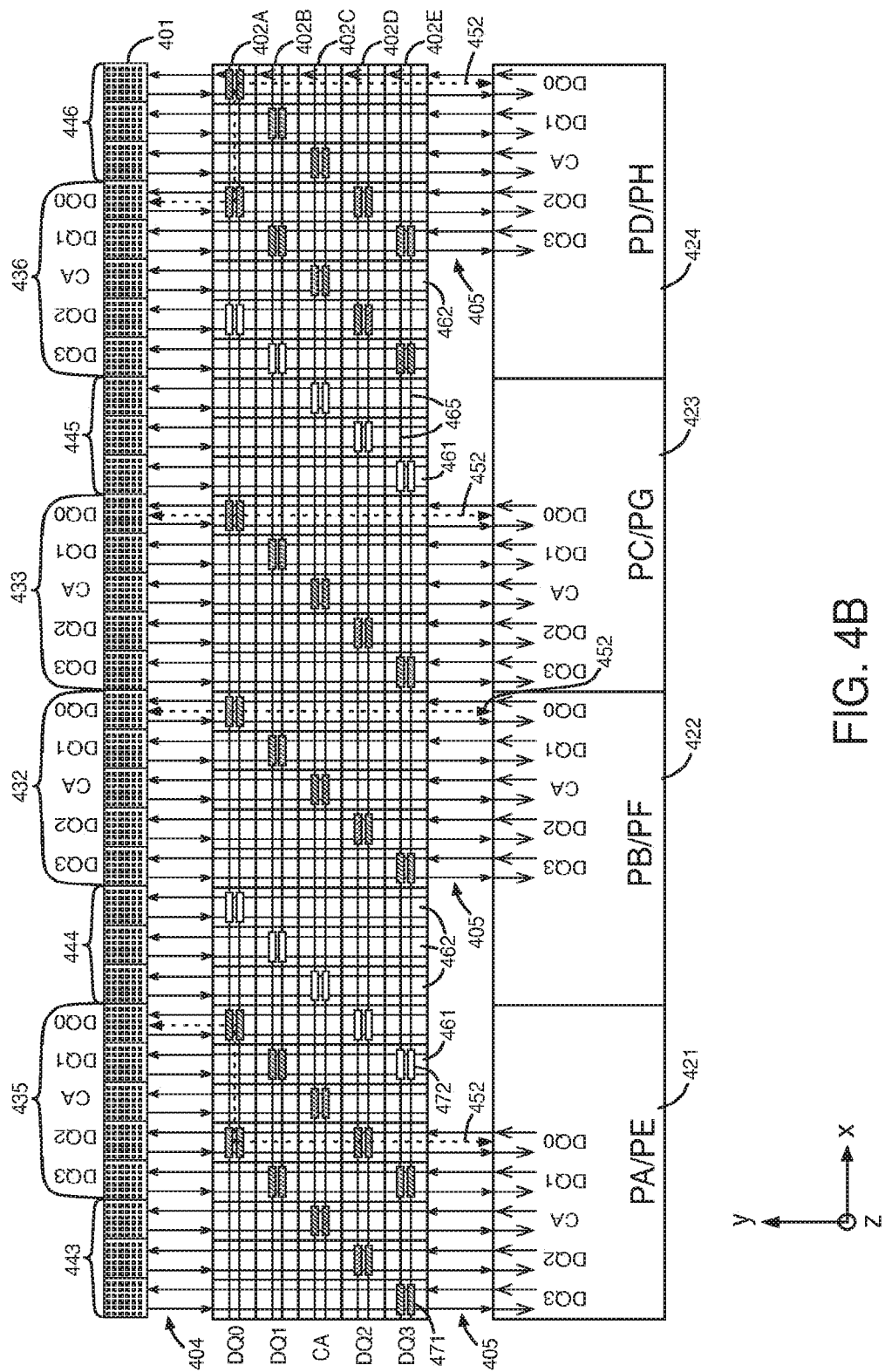
Figure 4C:
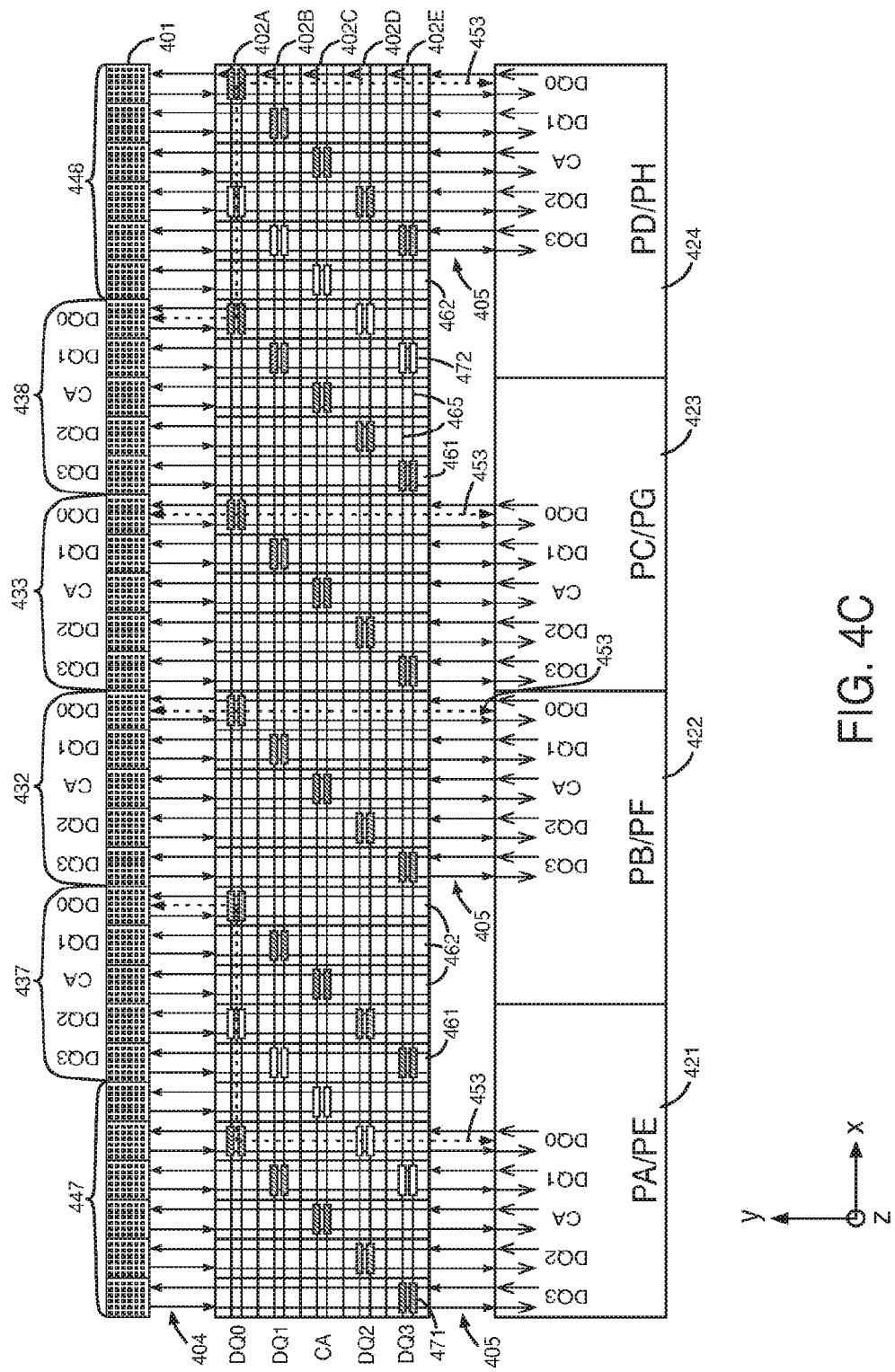

FIGS. 4A-4C illustrate further details of the alignment circuitry of alignment stripes 391-392 and the connection sites in one-half of integrated circuit (IC) die 300. A connection stripe 401 that contains 32 connection site blocks of connection sites is shown in FIGS. 4A-4C. Connection stripe 401 is representative of each connection stripe 301 and 302 shown in FIG. 3D. FIG. 4A illustrates a footprint configuration for connection stripe 401 that is used to connect IC die 300 to IC die 340. FIG. 4B illustrates a footprint configuration for connection stripe 401 that is used to connect IC die 300 to IC die 320. FIG. 4C illustrates a footprint configuration for connection stripe 401 that is used to connect IC die 300 to IC die 310.

The example of the alignment circuitry shown has 5 lateral tracks 402A-402E composed of conductors and configurable routing circuitry, which are collectively referred to herein as alignment circuitry 402. The alignment circuitry in each of the alignment stripes 391 and 392 contains the structure of alignment circuitry 402 shown in FIGS. 4A-4C. The alignment circuitry in alignment stripes 391-392 can be configured to route signals between any of the 8 core circuits PA-PH in IC die 300 and any of the core circuits MA-MH in any of the stacked IC dies 310, 320, and 340 through the connection sites and TSVs.

The alignment circuitry 402 can be configured to route signals between any core circuit of IC die 300 and any core circuit of any of the IC dies 310, 320, and 340 that are stacked on top of and connected to IC die 300. FIGS. 4A, 4B, and 4C illustrate the configurations of the alignment circuitry used to implement the routing of signals from any core circuit of IC die 300 to any core circuit of each of IC dies 340, 320, and 310, respectively. Core circuits 421-424 can be core circuits PA-PD or PE-PH, respectively.

Referring to FIGS. 3C, 3D and 4A, signals are routed from core circuits 421-424 in IC die 300 through alignment circuitry 402 to the connection sites in connection stripe 401, and thence to IC die 340. In this example, respective sets of five signals DQ0, DQ1, CA, DQ2, and DQ3 are transmitted from core circuits 421-424 to the connection sites in connection site blocks 431-434, respectively, through conductors 405, alignment circuitry 402, and conductors 404. The sets of five signals DQ0, DQ1, CA, DQ2, and DQ3 then pass through connection site blocks 431-434 to respective connection sites in connection site blocks 341-344, respectively, or in connection site blocks 345-348, respectively.

In FIGS. 4A-4C, signals DQ0, DQ1, DQ2, and DQ3 represent 4 sets of data signals that are transmitted to and from a memory IC to implement read and write data transactions. Signals CA represent row and column command-address (CA) signals that are transmitted to and from a memory IC to implement read and write data transactions. Each group of connection sites blocks 341-348 has 5 connection site blocks that are configurable to receive and transmit 5 sets of signals DQ0, DQ1, CA, DQ2, and DQ3.

Signals DQ0, DQ1, CA, DQ2, and DQ3 can be transmitted in the reverse direction from the connection sites in connection site blocks 341-344 or from the connection sites in connection site blocks 345-348 in IC die 340 to the connection sites in connection site blocks 431-434, respectively, in IC die 300. These signals are then routed from the connection sites in connection site blocks 431-434 to core circuits 421-424, respectively, through conductors 404, alignment circuitry 402, and conductors 405. The dotted arrows 451 in FIG. 4A illustrate the paths that signals DQ0 take through alignment circuitry 402 between core circuits 421-424 and the connection sites. In this example, the connection sites in connection site blocks 441-442 in IC die 300 and the connection sites in connection site blocks 351-354 in IC die 340 are not used for the transmission of signals between these two IC dies.

Each of the upward and downward pointing arrows 404 and 405 represents multiple conductors or wires. In an example, each arrow 404 and 405 represents 36 or more conductors. Alignment circuitry 402 routes signals between core circuits 421-424 and IC die 340 using only conductors oriented in the y-direction in tracks 402A-402E.

Referring to FIGS. 3B and 4B, signals are routed from core circuits 421-424 in IC die 300 to IC die 320. In this example, four sets of signals DQ0, DQ1, CA, DQ2, and DQ3 are transmitted from core circuits 421-424 to connection sites in connection site blocks 435, 432, 433, and 436, respectively, through conductors 405, alignment circuitry 402, and conductors 404. Alignment circuitry 402 routes signals between core circuits 421-424 and the connection sites in connection site blocks 435, 432, 433, and 436 using conductors that extend in the y-direction in tracks 402A-402E as well as conductors that extend in the x-direction in tracks 402A-402E. The signals DQ0, DQ1, CA, DQ2, and DQ3 then pass from the connection sites in connection site blocks 435, 432, 433, and 436 to connection sites in connection site blocks 321-324, respectively, or in connection site blocks 325-328, respectively, in IC die 320. Each group of connection site blocks 321-328 has 5 connection site blocks that are configurable to receive and transmit 5 sets of signals DQ0, DQ1, CA, DQ2, and DQ3.

Signals DQ0, DQ1, CA, DQ2, and DQ3 can be transmitted in the reverse direction from the connection sites in connection site blocks 321-324 or in connection site blocks 325-328 in IC die 320 to the connection sites in connection site blocks 435, 432, 433, and 436, respectively, in IC die 300. These signals are then routed from the connection sites in connection site blocks 435, 432, 433, and 436 to core circuits 421-424, respectively, through conductors 404, alignment circuitry 402, and conductors 405. The dotted arrows 452 in FIG. 4B illustrate paths that signals DQ0 may take through alignment circuitry 402 between core circuits 421-424 and the connection sites. In this example, the connection sites in connection site blocks 443-446 in IC die 300 and the connection sites in connection site blocks 331-334 in IC die 320 are not used for the transmission of signals between these two IC dies.

Referring to FIGS. 3A and 4C, signals are routed from core circuits 421-424 in IC die 300 to IC die 310. In this example, signals DQ0, DQ1, CA, DQ2, and DQ3 are transmitted from core circuits 421-424 to the connection sites in connection site blocks 437, 432, 433, and 438, respectively, through conductors 405, alignment circuitry 402, and conductors 404. Alignment circuitry 402 routes signals between core circuits 421-424 and the connection sites in connection site blocks 437, 432, 433, and 438 using conductors that extend in the y-direction in tracks 402A-402E in addition to the conductors that extend in the x-direction in tracks 402A-402E. The signals DQ0, DQ1, CA, DQ2, and DQ3 then pass from the connection sites in connection site blocks 437, 432, 433, and 438 to connection sites in connection site blocks 311-314, respectively, or in connection site blocks 315-318, respectively, in IC die 310. Each group of connection sites blocks 311-318 has 5 connection site blocks that are configurable to receive and transmit 5 sets of signals DQ0, DQ1, CA, DQ2, and DQ3.

Signals DQ0, DQ1, CA, DQ2, and DQ3 can be transmitted in the reverse direction from the connection sites in connection site blocks 311-314 or in connection site blocks 315-318 in IC die 310 to connection sites in connection site blocks 437, 432, 433, and 438, respectively. These signals are then routed from the connection sites in connection site blocks 437, 432, 433, and 438 to core circuits 421-424, respectively, through conductors 404, alignment circuitry 402, and conductors 405. The dotted arrows 453 in FIG. 4C illustrate paths that signals DQ0 may take through alignment circuitry 402 between core circuits 421-424 and the connection sites. In this example, the connection sites in connection site blocks 447 and 448 in IC die 300 are not used for the transmission of signals between IC dies 300 and 310. In the examples of FIGS. 4B and 4C, signals DQ0, DQ1, CA, DQ2, and DQ3 are selectively routed through conductors that extend in the x-direction in tracks 402A-402E, respectively, from core circuits 421 and 424 to connection sites in connection stripe 401.

Each of the lateral tracks 402A-402E of alignment circuitry 402 is composed of 8 configurable routing blocks 461 and 24 wire blocks 462. Configurable routing blocks 461 are shown as having two rectangular boxes at each of which a pair of the wire blocks terminate in FIGS. 4A-4C. In FIGS. 4A-4C, the configurable routing blocks 461 shown as having shaded rectangular boxes 471 represent configurable routing blocks that are configured to transmit the DQ0, DQ1, CA, DQ2, and DQ3 signals between the x-direction and the y-direction. The configurable routing blocks 461 shown as having rectangular boxes 472 that are not shaded represent configurable routing blocks that are configured to transmit the DQ0, DQ1, CA, DQ2, and DQ3 signals only in the x-direction or only in the y-direction.

In the example shown, each of the lateral tracks 402A-402E is composed of two segmented unidirectional conductors that extend the length of the lateral track or one segmented bidirectional conductor that extends the length of the lateral track. For example, lateral track 465 is composed of two unidirectional conductors or one bidirectional conductor.

In FIGS. 4A-4C, the connection site blocks in connection stripe 401 transmit the DQ3, DQ2, CA, DQ1, and DQ0 signals in contiguous groups of five connection site blocks. This configuration is shown in FIGS. 4A-4C merely as an example that is not intended to be limiting. In other embodiments, unused connection site blocks can be between any of the connection site blocks that transmit the DQ3, DQ2, CA, DQ1, and DQ0 signals. Alternate embodiments can also allow a connection site block to be configured as either a DQ3-DQ0 block or a CA block.

In some embodiments, the connection sites in a small region in a defined (and possibly standardized) location in connection stripe 401 are dedicated to provide a configuration interface (e.g., for transmitting clock and data signals). In an example, this region is located half-way along the length of connection stripe 401. In another example, this region is located at one end of connection stripe 401. By assigning the connection sites in a small region in a defined location in connection stripe 401 to provide the configuration interface, such configuration interface is connected between the stacked IC dies for any processor or memory IC die, regardless of the die size or configuration. Using this configuration interface, the processor IC can read information specifying the configuration of the memory IC die, if such information is stored on the memory IC die. The processor IC can then appropriately configure the alignment circuitry 402 to connect all the remaining connection sites used to provide contact with the memory IC die. Also, this configuration interface can be used to program configuration registers in the memory IC. Alternatively, the processor IC can obtain the memory configuration information from another source, such as another non-volatile memory IC that contains memory configuration information.

In some embodiments, the integrated circuit die 300 may be configured either in a face-up orientation (e.g., in wire-bond ball grid array packaging) or in a face-down orientation (e.g., in flip-chip ball grid array packaging). The alignment circuitry 402 can be reconfigured to support the connection sites in a face-up or face-down die orientation.

According to additional embodiments, 3 or more integrated circuit dies are stacked, and signals are transmitted between the top and the bottom IC dies in the stack through TSVs in the middle IC die(s). For example, IC dies 300, 310, 320, and 340 can be stacked, and signals can be transmitted between the top IC die 310 and the bottom IC die 300 through TSVs in IC dies 320 and 340.

According to an alternative embodiment, a processor integrated circuit die is stacked on top of a memory integrated circuit die that has a larger dimension in the x-direction than the processor integrated circuit die. In this embodiment, the memory IC die has a connection stripe that is longer in the x-direction than the processor IC die. The memory IC die has alignment circuitry 402 that is configurable to couple the memory core circuits to different sets of the connection sites in the memory IC die to accommodate different footprints of connection sites on the processor IC die, as shown in and described with respect to FIGS. 3A-3D and 4A-4C.

According to another embodiment, a processor integrated circuit die is also stacked on top of a memory integrated circuit die that has a larger dimension in the x-direction than the processor integrated circuit die. In this embodiment, connection sites on facing surfaces of the memory and processor IC dies are connected together through an interposer layer that is inserted between the IC dies. The interposer layer has routing wires that connect together the connection sites in the memory and processor IC dies.

Figure 5A:
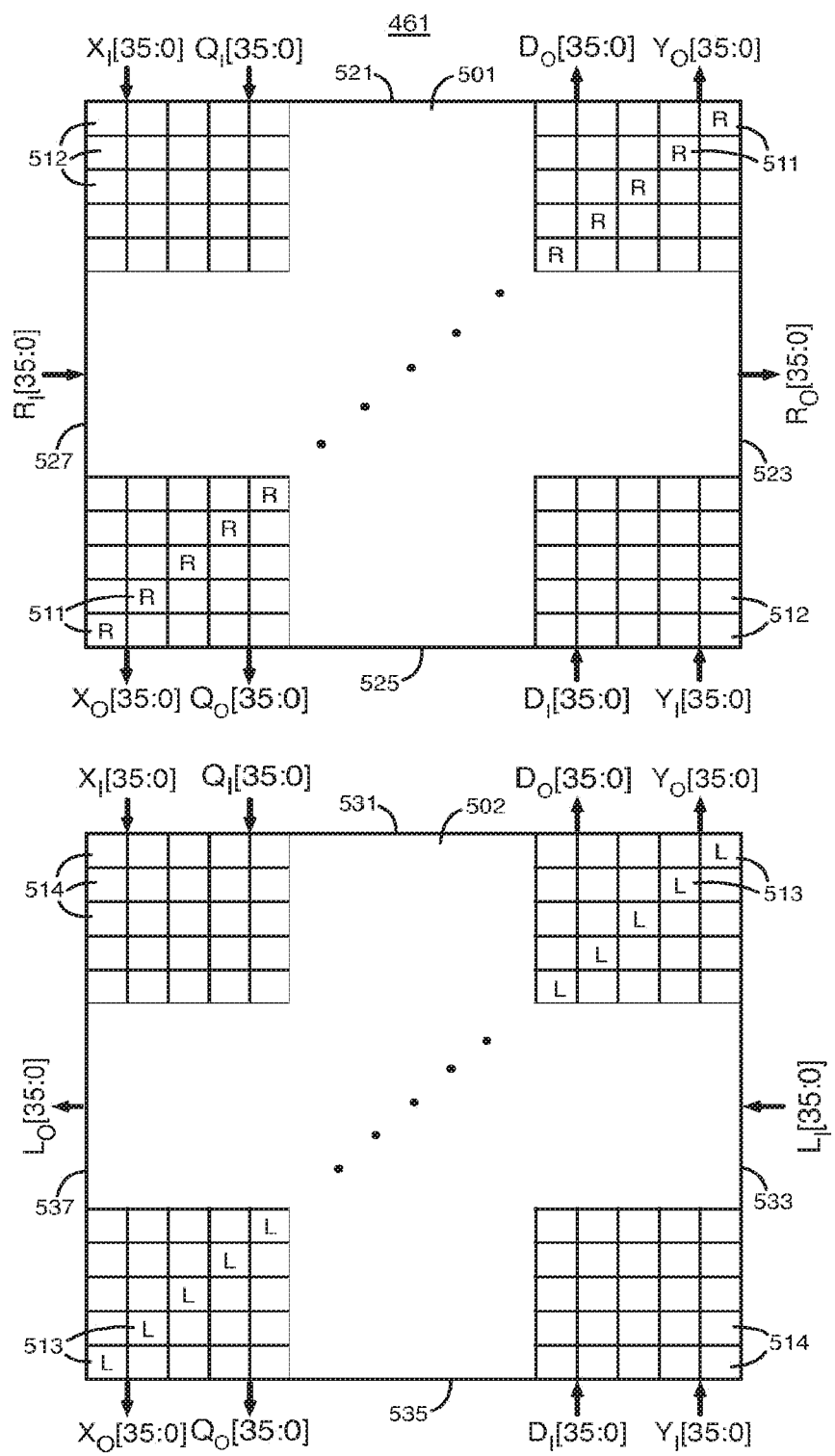
FIGS. 5A-5G illustrate examples of circuits that can be used to implement the alignment circuitry.

FIG. 5A shows examples of unidirectional circuit blocks that can be used together to implement the configurable routing blocks 461 in the tracks 402A-402E of alignment circuitry 402. FIG. 5A illustrates an example of what will be referred to herein as a right-direction circuit block 501, and an example of what will be referred to herein as a left-direction circuit block 502. The direction refers to the direction in which signals pass through the circuit block in the x-direction. Each of the 40 configurable routing blocks 461 in the example of alignment circuitry 402 shown in FIGS. 4A-4C is composed of a right-direction circuit block 501 and of a left-direction circuit block 502 having the architecture shown in FIG. 5A. Each of circuit blocks 501 and 502 includes a 36×36 array of smaller circuit blocks, most of which are composed simply of wires.

Circuit block 501 conducts signals referred to as $X_{I/O}[35:0]$, $Q_{I/O}[35:0]$, $D_{I/O}[35:0]$, $Y_{I/O}[35:0]$, and $R_{I/O}[35:0]$. Circuit block 502 conducts signals referred to as $X_{I/O}[35:0]$, $Q_{I/O}[35:0]$, $D_{I/O}[35:0]$, $Y_{I/O}[35:0]$, and $L_{I/O}[35:0]$. These signals can be, for example, signals DQ0, DQ1, CA, DQ2, or DQ3 that are transmitted in the x-direction and/or in the y-direction.

Referring to FIG. 5A, right-direction circuit block 501 is composed of 36 multiplexer blocks 511 located along the diagonal of the array constituting circuit block 501. Multiplexer blocks 511 are shown as boxes labeled with an R in FIG. 5A. Circuit block 501 also includes 1260 wiring blocks 512 that occupy the remaining locations in the array. Each of wiring blocks 512 is composed of conductors that extend in the x-direction and a greater number of conductors that extend in the y-direction, as will be described in greater detail below with reference to FIG. 5D. Wiring blocks 512 are shown as empty boxes in FIG. 5A. Not all of the blocks 511-512 in circuit block 501 are shown in FIG. 5A to simply the drawing.

Right-direction circuit block 501 has four orthogonal sides indicated, in clockwise order, by reference numerals 521, 523, 525 and 527. On side 521, circuit block 501 has 72 input ports through which it can receive 36 input signals $X_I[35:0]$, and 36 input signals $Q_I[35:0]$, and 72 output ports through which it can output 36 output signals $D_O[35:0]$ and 36 output signals $Y_O[35:0]$. On side 525, circuit block 501 has 72 input ports through which it can receive 36 input signals $D_I[35:0]$ and 36 input signals $Y_I[35:0]$, and 72 output ports through which it can output 36 output signals $X_O[35:0]$ and 36 output signals $Q_O[35:0]$. Circuit block 501 also has, on side 527, 36 input ports through which it can receive 36 input signals $R_I[35:0]$ from the x-direction conductors of one of tracks 402, and, on side 523, 36 output ports through which it can output 36 output signals $R_O[35:0]$ to the x-direction conductors of the one of tracks 402. The input signals $X_I[35:0]$, $Q_I[35:0]$, $D_I[35:0]$, $Y_I[35:0]$, and $R_I[35:0]$ are routed through the conductors and circuits in blocks 511 and 512 to provide the output signals $X_O[35:0]$, $Q_O[35:0]$, $D_O[35:0]$, $Y_O[35:0]$, and $R_O[35:0]$.

Multiplexers in each multiplexer block 511 can be configured to route one or more of input signals $X_I[35:0]$, $Q_I[35:0]$, $D_I[35:0]$, $Y_I[35:0]$, and $R_I[35:0]$ straight through block 511 to conductors oriented in the same direction as the conductors carrying the input signal. Alternatively, the multiplexers in each block 511 can be configured to route one or more of input signals $X_I[35:0]$, $Q_I[35:0]$, $D_I[35:0]$, $Y_I[35:0]$, and $R_I[35:0]$ to conductors oriented orthogonally to the conductors carrying the input signal. For example, the multiplexers in blocks 511 can be configured to output input signal $R_I[35:0]$ as one of output signals $X_O[35:0]$, $Q_O[35:0]$, $D_O[35:0]$, or $Y_O[35:0]$. As another example, the multiplexers in blocks 511 can be configured to output one of input signals $X_I[35:0]$, $Q_I[35:0]$, $D_I[35:0]$, or $Y_I[35:0]$ as output signal $R_O[35:0]$.

Left-direction circuit block 502 includes 36 multiplexer blocks 513 that are located along the diagonal of the array constituting circuit block 502. Multiplexer blocks 513 are shown as boxes labeled with an L in FIG. 5A. Although multiplexer blocks 511 and 513 are shown as arranged diagonally in blocks 501-502, multiplexer blocks 511 and 513 can be placed in off-diagonal locations, allowing more room to implement the multiplexing circuitry, for example, as shown in and described below with respect to FIG. 6B.

Circuit block 502 also includes 1260 wiring blocks 514 that occupy the remaining locations in the array. Each of wiring blocks 514 is composed of conductors that extend in the x-direction and a greater number of conductors that extend in the y-direction, as will be described in greater detail below with reference to FIG. 5E. Wiring blocks 514 are shown as empty boxes in FIG. 5A. Not all of the blocks 513-514 in circuit block 502 are shown in FIG. 5A to simply the drawing.

Left-direction circuit block 502 has four orthogonal sides indicated, in clockwise order, by reference numerals 531, 533, 535 and 537. On side 531, circuit block 502 has 72 input ports through which it can receive 36 input signals $X_I[35:0]$ and 36 input signals $Q_I[35:0]$, and additionally has 72 output ports through which it can output 36 output signals $D_O[35:0]$ and 36 output signals $Y_O[35:0]$. On side 535, circuit block 502 has 72 input ports through which it can receive 36 input signals $D_I[35:0]$ and 36 input signals $Y_I[35:0]$, and additionally has 72 output ports through which it can output or 36 output signals $X_O[35:0]$ and 36 output signals $Q_O[35:0]$. Pairs of circuit blocks 501 and 502 are interconnected such that the output signals $X_O[35:0]$ and $Q_O[35:0]$ of each left-direction circuit block 502 provide the input signals $X_I[35:0]$ and $Q_I[35:0]$, respectively, of the adjacent right-direction circuit block 501, and the output signals $D_O[35:0]$ and $Y_O[35:0]$ of each right-direction circuit block 501 provide the input signals $D_I[35:0]$ and $Y_I[35:0]$, respectively, of the adjacent left-direction circuit block 502. Also, pairs of circuit blocks 501 and 502 are interconnected such that the output signals $X_O[35:0]$ and $Q_O[35:0]$ of each right-direction circuit block 501 provide the input signals $X_I[35:0]$ and $Q_I[35:0]$, respectively, of the adjacent left-direction circuit block 502, and the output signals $D_O[35:0]$ and $Y_O[35:0]$ of each left-direction circuit block 502 provide the input signals $D_I[35:0]$ and $Y_I[35:0]$, respectively, of the adjacent right-direction circuit block 501.

Left-direction circuit block 502 also has, on side 533, 36 input ports through which it can receive 36 input signals $L_I[35:0]$ from the x-direction conductors of one of tracks 402, and, on side 537, 36 output ports through which it can output 36 output signals $L_O[35:0]$ to the x-direction conductors of the one of tracks 402. The input signals $X_I[35:0]$, $Q_I[35:0]$, $D_I[35:0]$, $Y_I[35:0]$, and $L_I[35:0]$ are routed through the conductors and circuits in blocks 513 and 514 to provide the output signals $X_O[35:0]$, $Q_O[35:0]$, $D_O[35:0]$, $Y_O[35:0]$, and $L_O[35:0]$. Multiplexers in each multiplexer block 513 can be configured to route one or more of input signals $X_I[35:0]$, $Q_I[35:0]$, $D_I[35:0]$, $Y_I[35:0]$, and $L_I[35:0]$ straight through the block 513 to conductors oriented in the same direction as the conductors carrying the input signal. The multiplexers in each multiplexer block 513 can alternatively be configured to change the direction of one or more of input signals $X_I[35:0]$, $Q_I[35:0]$, $D_I[35:0]$, $Y_I[35:0]$, and $L_I[35:0]$ to conductors oriented orthogonally to the conductors carrying the input signal, in a manner similar to that described above with respect to multiplexer blocks 511.

Figure 5D:
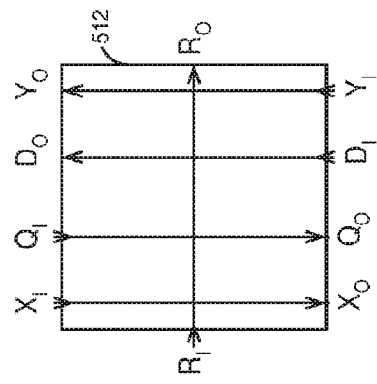
Figure 5E:
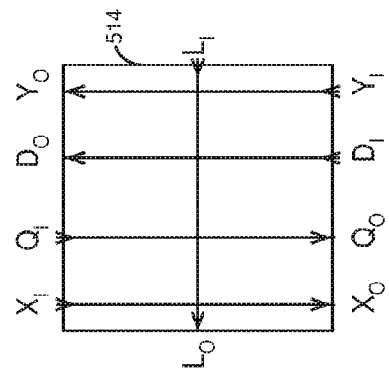
Figure 5B:
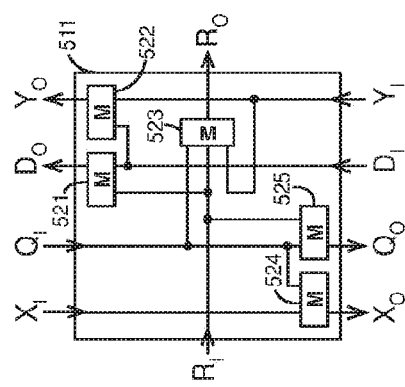
Figure 5C:
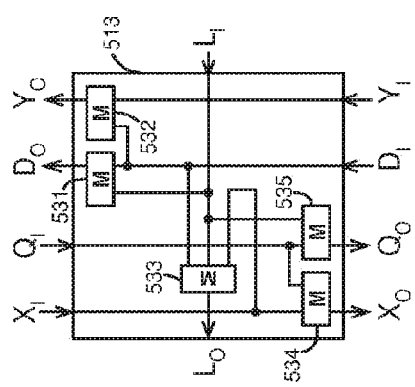

FIGS. 5B-5E illustrate further details of blocks 511-514. One example of each of blocks 511, 513, 512, and 514 is shown in FIGS. 5B, 5C, 5D, and 5E, respectively. Each of the blocks 511-514 in circuit blocks 501 and 502 has the architecture shown in one of FIGS. 5B-5E. Referring to FIGS. 5B and 5C, multiplexer blocks 511 are each composed of 5 multiplexer circuits 521-525, and multiplexer blocks 513 are each composed of 5 multiplexer circuits 531-535. Each of the multiplexer circuits has a control input through which it receives a respective control signal whose state determines which one of the inputs of the multiplexer circuit is connected to the output of the multiplexer circuit. The control inputs and control signals are omitted to simplify the drawing.

Corresponding multiplexer circuits 521-525 in all of the multiplexer blocks 511 in a given right-direction circuit block 501 receive the same control signal. Similarly, corresponding multiplexer circuits 531-535 in all of the multiplexer blocks 513 in a given left-direction circuit block 502 receive the same control signal. As will be described in greater detail below with reference to FIG. 24, the control signals depend on the location of the circuit block in alignment circuitry 402 and the alignment configuration being implemented. Each of the multiplexer blocks 511, 513 (and the constituent multiplexer circuits) operates on one respective bit of the input signals referred to in the descriptions of multiplexer blocks 511, 513 set forth below. The descriptions are simplified by referring to the entire input signals rather than the respective bit of such signals.

Multiplexer circuit 521 outputs either of input signals $R_I$ and $D_I$ as output signal $D_O$. Multiplexer circuit 522 outputs either of input signals $D_I$ or $Y_I$ as output signal $Y_O$. Multiplexer circuit 523 outputs any one of input signals $Q_I$, $R_I$, or $Y_I$ as output signal $R_O$. Multiplexer circuit 524 outputs either of input signals $X_I$ and $Q_I$ as output signal $X_O$. Multiplexer circuit 525 outputs either of input signals $Q_I$ and $R_I$ as output signal $Q_O$.

Multiplexer circuit 531 outputs either of input signals $L_I$ and $D_I$ as output signal $D_O$. Multiplexer 532 outputs either of input signals $D_I$ or $Y_I$ as output signal $Y_O$. Multiplexer circuit 533 outputs any one of input signals $D_I$, $L_I$, or $X_I$ as output signal $L_O$. Multiplexer circuit 534 outputs either of input signals $X_I$ and $Q_I$ as output signal $X_O$. Multiplexer circuit 535 outputs either of input signals $Q_I$ and $L_I$ as output signal $Q_O$.

Referring to FIG. 5D, wiring blocks 512 each have respective conductors that receive input signals $X_I$, $Q_I$, $D_I$, $Y_I$, and $R_I$ and output the input signal as output signals $X_O$, $Q_O$, $D_O$, $Y_O$, and $R_O$, respectively. Referring to FIG. 5E, wiring blocks 514 each have respective conductors that receive input signals $X_I$, $Q_I$, $D_I$, $Y_I$, and $L_I$ and output the input signals as output signals $X_O$, $Q_O$, $D_O$, $Y_O$, and $L_O$, respectively.

Figure 5F:
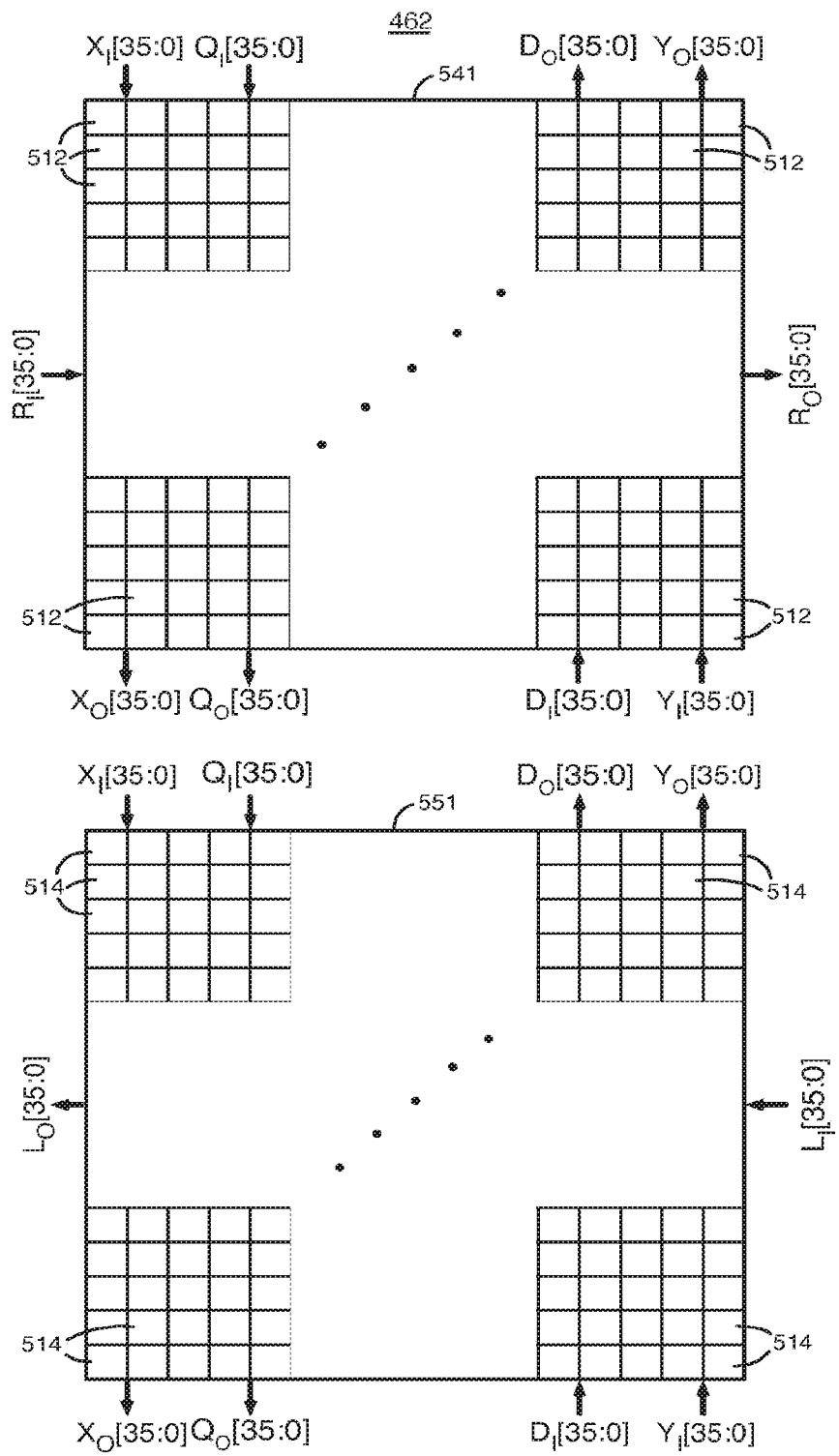

FIG. 5F shows an example of the wire block 462 in alignment circuitry 402. Each of the 120 wire blocks 462 in alignment circuitry 402 is composed of a wire block 541 and a wire block 551.

Each of wire blocks 541 has a 36×36 array of smaller wiring blocks 512 as shown in FIG. 5D. Each of wire blocks 551 has a 36×36 array of smaller wiring blocks 514 as shown in FIG. 5E.

Because each of the blocks 511-514 conducts 4 y-direction signals X, Q, D, and Y and only one x-direction signal R or L, alignment circuitry 402 has many more y-direction conductors than x-direction conductors. As a result, the width of alignment circuitry 402 in the y-direction is significantly smaller than the length of alignment circuitry 402 in the x-direction, which greatly reduces the additional area needed on the integrated circuit die for alignment circuitry 402.

According to an example of the alignment circuitry 402 that implements the architectures of FIGS. 5A-5F, the alignment circuitry 402 in each of the alignment stripes 391-392 has 4 bundles of wires, and each of the bundles of wires has 180 wires that extend in the x-direction in FIGS. 4A-4C.

Figure 5G:
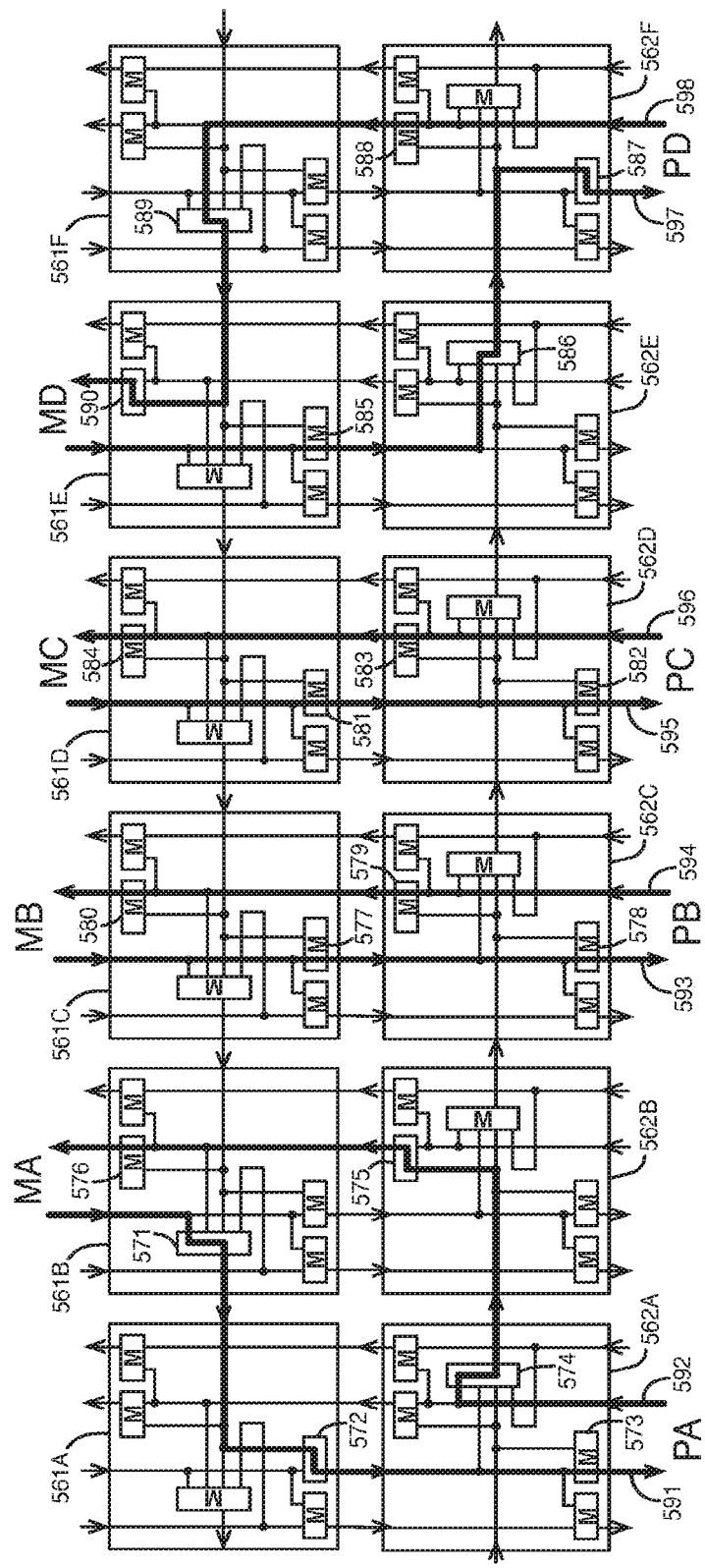

FIG. 5G illustrates an example of how the alignment circuitry 402 can be configured to transmit signals between processor core circuits PA-PD and memory core circuits MA-MD according to the footprint configuration shown in FIG. 4C. The multiplexer blocks 561A-561F and 562A-562F shown in FIG. 5G are part of the alignment circuitry 402 in this embodiment. Multiplexer blocks 561A-561F are alternative implementations of multiplexer blocks 513 in configurable routing blocks 461 according to the configuration shown in FIG. 5A. Multiplexer blocks 562A-562F are alternative implementations of multiplexer blocks 511 in configurable routing blocks 461 according to the configuration shown in FIG. 5A. The thick lines in FIG. 5G represent signal paths 591-598 between processor core circuits PA-PD and memory core circuits MA-MD through multiplexer blocks 561A-561F and 562A-562F.

In the example of FIG. 5G, a signal is transmitted from memory core circuit MA to processor core circuit PA through path 591 by multiplexers 571-573. A signal is transmitted from processor core circuit PA to memory core circuit MA through path 592 by multiplexers 574-576. A signal is transmitted from memory core circuit MB to processor core circuit PB through path 593 by multiplexers 577-578. A signal is transmitted from processor core circuit PB to memory core circuit MB through path 594 by multiplexers 579-580.

A signal is transmitted from memory core circuit MC to processor core circuit PC through path 595 by multiplexers 581-582. A signal is transmitted from processor core circuit PC to memory core circuit MC through path 596 by multiplexers 583-584. A signal is transmitted from memory core circuit MD to processor core circuit PD through path 597 by multiplexers 585-587. A signal is transmitted from processor core circuit PD to memory core circuit MD through path 598 by multiplexers 588-590.

FIG. 6A illustrates an example of a bidirectional configurable routing block 601 that can be used to implement each of the configurable routing blocks 461 in the lateral tracks of alignment circuitry 402, according to an alternative embodiment. Configurable routing block 601 includes a 36×36 array of smaller circuit blocks. Circuit block 601 is composed of 36 multiplexer blocks 611 that are bidirectional with respect to x-direction signals. Blocks 611 are arranged diagonally across circuit block 601 and are shown as boxes labeled B in FIG. 6A. Circuit block 601 also includes 1260 wiring blocks 612 that that occupy the remaining locations in the array. Each of wiring blocks 612 is composed of conductors that extend in the x-direction and a greater number of conductors that extend in the y-direction. Blocks 612 are shown as empty boxes in FIG. 6A.

In the embodiment of FIG. 6A, each configurable routing block 461 in alignment circuitry 402 uses only one circuit block 601 to achieve the same functionality as using two circuit blocks 501 and 502 shown in FIG. 5A. Because blocks 611 and 612 are bidirectional with respect to x-direction signals, the embodiment of FIG. 6A has one-half as many lateral conductors as the embodiment of FIG. 5A. As a result, the embodiment of FIG. 6A reduces the width of alignment circuitry 402. However, the embodiment of FIG. 6A needs a larger number of configurations of alignment circuitry 402 than the embodiment of FIG. 5A to connect each core circuit PA-PH to each core circuit MA-MH. Therefore, more time is used to cycle through the larger number of configurations.

If a bidirectional configurable routing block 601 is used to implement each of the configurable routing blocks 461, then each lateral track 402A-402E of the alignment circuitry 402 can be divided into segments that conduct x-direction signals in opposite directions at the same time.

Circuit block 601 has four orthogonal sides indicated, in clockwise order, by reference numerals 621, 623, 625 and 627. Circuit block 601 has, on side 621, 72 input ports through which it can receive 36 input signals $X_I[35:0]$ and 36 input signals $Q_I[35:0]$, and, on side 625, 72 input ports through which it can receive 36 input signals $D_I[35:0]$, and 36 input signals $Y_I[35:0]$. Circuit block 601 additionally has, on side 621, 72 output ports through which it can output 36 output signals $D_O[35:0]$ and 36 output signals $Y_O[35:0]$, and, on side 625, 72 output ports through which it can output, 36 output signals $X_O[35:0]$, and 36 output signals $Q_O[35:0]$. Additionally, circuit block 601 has, on side 623, 36 input/output (I/O) ports, through which it can receive or output 36 signals $LR_B[35:0]$, and, on side 627, 36 I/O ports, through which it can receive or output 36 signals $LR_A[35:0]$. The 36 signals $LR_A[35:0]$ and the 36 $LR_B[35:0]$ can be routed through circuit block 601 as input signals or output signals. The input signals of block 601 are routed through the conductors and circuits in blocks 611 and 612 prior to being output from block 601.

FIG. 6B illustrates another example of a bidirectional configurable routing block 602 that can be used to implement each of the configurable routing blocks 461 in the lateral tracks of alignment circuitry 402. In the embodiment of FIG. 6B, each configurable routing block 461 in alignment circuitry 402 includes only one circuit block 602 to achieve the same functionality as using two circuit blocks 501 and 502. The embodiment of FIG. 6B also has one-half as many lateral wire tracks as the embodiment of FIG. 5A. Configurable routing block 602 includes a 36×36 array of smaller circuit blocks 611 and 612.

Each row and each column in block 602 includes one multiplexer block 611. As shown in FIG. 6B, some of the multiplexer blocks 611 are not located along a diagonal line in block 602. For example, multiplexer block 611A is in an off-diagonal location in block 602.

The input signals $X_I[35:0]$, $Q_I[35:0]$, $D_I[35:0]$, $Y_I[35:0]$, and $LR_A[35:0]/LR_B[35:0]$ of block 602 are routed through the conductors and circuits in blocks 611 and 612 to generate the output signals $X_O[35:0]$, $Q_O[35:0]$, $D_O[35:0]$, $Y_O[35:0]$, and $LR_A[35:0]/LR_B[35:0]$ of block 602. The 36 signals $LR_A[35:0]$ and the 36 $LR_B[35:0]$ can be routed through circuit block 602 as input signals or output signals.

Figure 6D:
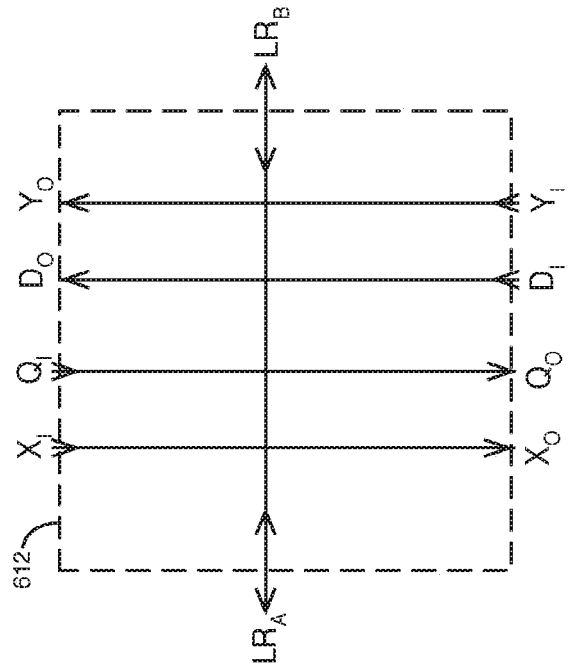
Figure 6C:
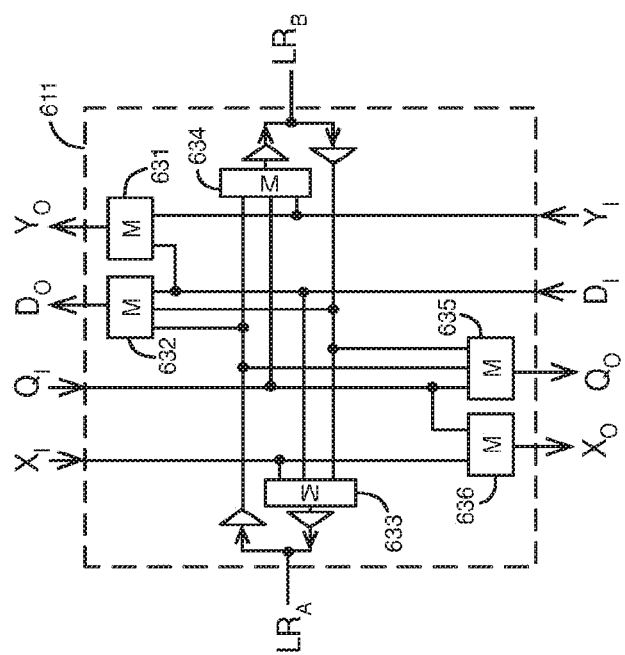

FIGS. 6C and 6D illustrate further details of multiplexer blocks 611 and wiring blocks 612. One example of each of multiplexer blocks 611 and wiring blocks 612 is shown in FIGS. 6C and 6D, respectively. Each of the blocks 611-612 in blocks 601 and 602 has the architectures shown in FIGS. 6C and 6D, respectively.

Blocks 611 and 612 are bidirectional blocks that can conduct x-direction signals travelling from right to left or from left to right along one lateral track of wires. Thus, in circuit blocks 611 and 612, signals $LR_A$ and $LR_B$ can be input signals or output signals. If signal $LR_A$ is an input signal, then signal $LR_B$ is an output signal. If signal $LR_B$ is an input signal, then signal $LR_A$ is an output signal.

Wiring blocks 612 each have conductors that receive input signals $X_I$, $Q_I$, $D_I$, and $Y_I$ and output such input signals as output signals $X_O$, $Q_O$, $D_O$, and $Y_O$, respectively. Each of the wiring blocks 612 has a conductor that receives signal $LR_A$ and outputs signal $LR_A$ as signal $LR_B$, or that receives signal $LR_B$ and outputs signal $LR_B$ as signal $LR_A$.

Multiplexer blocks 611 each have 6 multiplexer circuits 631-636. Multiplexer 631 outputs either of input signals $D_I$ or $Y_I$ as output signal $Y_O$. Multiplexer 632 outputs any one of input signals $LR_A$, $LR_B$, and $D_I$ as output signal $D_O$. Multiplexer 633 outputs any of input signals $X_I$, $D_I$, or $LR_B$ as output signal $LR_A$. Multiplexer 634 outputs any one of input signals $Q_I$, $LR_A$, or $Y_I$ as output signal $LR_B$. Multiplexer 635 outputs any one of input signals $Q_I$, $LR_A$, and $LR_B$ as output signal $Q_O$. Multiplexer 636 outputs either of input signals $X_I$ and $Q_I$ as output signal $X_O$. The identity of the signal that is output by each of multiplexers 631-636 depends on the state of a control signal (not shown) input to the multiplexer in a manner similar to that described above with reference to FIG. 5A.

According to an example of the alignment circuitry 402 that implements the architectures of FIGS. 6A-6D, the alignment circuitry 402 in each of regions 391-392 has 2 bundles of wires, and each of the bundles of wires has 180 wires that extend in the x-direction in FIGS. 4A-4C.

The alignment circuitry 402 in each of alignment stripes 391 and 392 in IC die 300 routes signals between core circuits PA-PH and any of the core circuits MA-MH in any of the stacked IC dies 310, 320, and 340 through the connection sites and TSVs using significantly fewer conductors than a crossbar implementation. In a crossbar implementation, each connection site is connected to each core circuit through a separate wire connection. Lateral tracks 402A-402E can be segmented horizontally using the circuitry described above to transmit signals between core circuits PA-PH and stacked ICs having different sizes and different connection site footprints using fewer conductors.

The foregoing description described static assignments between a core circuit of an IC die and a local core circuit of another IC die having a different size. The architectures described above can also be used to provide static assignments between a core circuit of an IC die and a non-local core circuit of another IC die, dynamic assignments between a core circuit of an IC die and a local or non-local core circuit of another IC die, and dynamic assignments between a core circuit of an IC die and parts of multiple local or non-local core circuits of another IC die. Embodiments providing these features are described below.

Figure 7C:
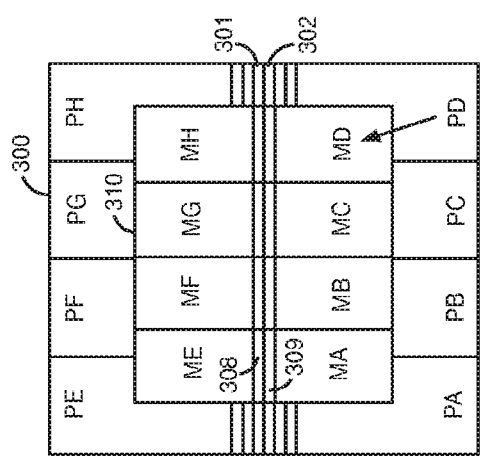
FIGS. 7A-7C show that a single core circuit in a first integrated circuit die can be connected to any of the core circuits in a second integrated circuit die that is stacked on top of the first integrated circuit die.
Figure 7B:
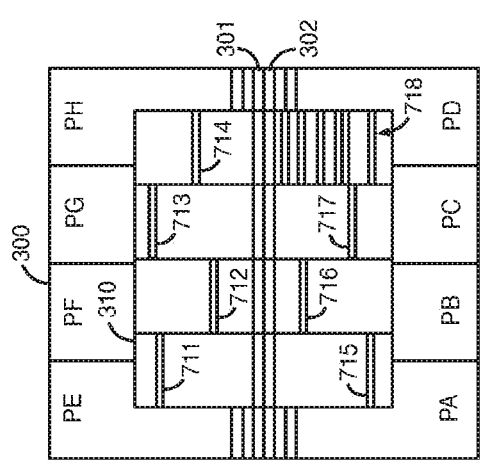
Figure 7A:
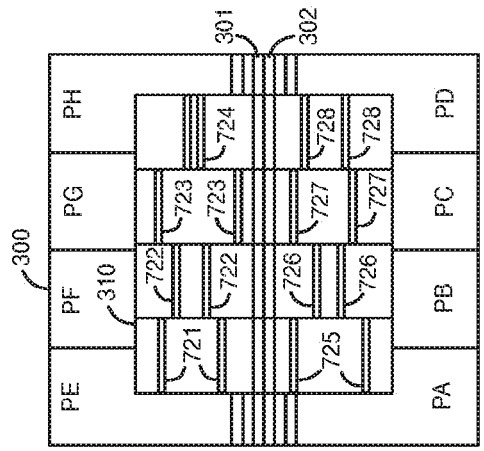

FIGS. 7A-7C show that a single core circuit in a first integrated circuit die 300 can be connected to any of the core circuits in a second integrated circuit die 310 that is stacked on integrated circuit die 300. Stacked IC dies 320 and 340 are not shown in FIGS. 7A-7C. Signals can be transmitted between any of the core circuits PA-PH in IC die 300 and any of the core circuits MA-MH in IC die 310 through connection sites and TSVs using alignment circuitry 402.

In the following discussion of FIGS. 7A-7C, it is assumed that IC die 300 is a processor IC die having 8 processor core circuits, and IC die 310 is a memory IC die having 8 memory core circuits, as an example. In the example shown in FIG. 7A, processor core circuit PD is connected to access any of the memory circuits in non-adjacent local memory core circuit MD through connection sites in each IC die. The connection of processor core circuit PD to memory core circuit MD can be dynamic or static. The configuration shown in FIGS. 7A-7C can be applied to any set of direct-coupled integrated circuit dies in which the alignment of multiple connection sites by configuring the alignment circuitry mainly occurs within one of the integrated circuit dies.

In FIG. 7A, the code and data structures of applications executing on processor core circuit PD reside entirely in local memory core circuit MD. In FIG. 7B, the code and data structures of applications executing on processor core circuit PD reside in physical pages 711-718 residing mainly in memory core circuit MD. In FIG. 7C, the code and data structures of applications executing on processor core circuit PD reside in physical pages 721-728 that are scattered uniformly across memory core circuits MA-MH. As the code and data structures are increasingly randomly distributed among the memory core circuits MA-MH, increasing efficiency is required by the alignment circuitry 402. Alignment circuitry 402 in alignment stripes 391-392 can be configured to connect processor core circuit PD to local and non-local memory core circuits MA-MH in IC die 310 and any of the other stacked IC dies.

Memory core circuits MA-MH in the stacked IC dies are local to processor core circuits PA-PH, respectively, in IC die 300. Other combinations of memory core circuits MA-MH and processor core circuits PA-PH are referred to as non-local core circuits. For example, memory core circuits MB-MH are non-local core circuits relative to processor core circuit PA, and memory core circuits MA and MC-MH are non-local core circuits relative to processor core circuit PB.

The alignment circuitry 402 can be configured statically or dynamically. When alignment circuitry 402 is configured statically, the configurations of the multiplexer circuits in configurable routing blocks 461 are established during manufacture, or when the stacked IC dies are first put into service and then do not change during the operation of the ICs. Thus, configurable routing blocks 461 provide fixed connections between processor core circuits PA-PH and the memory core circuits MA-MH in stacked IC dies 310, 320, and 340.

When alignment circuitry 402 is configured dynamically, the configurations of the multiplexer circuits in configurable routing blocks 461 change during the operation of the ICs to connect processor core circuits PA-PH to different memory core circuits MA-MH stacked IC dies 310, 320, and 340 at different times. In an example, the multiplexer circuits in configurable routing blocks 461 are reconfigured dynamically during the operation of the ICs to route signals between processor core circuit PD and each of the memory core circuits MA-MH. In some embodiments, more than one memory core circuit can be aligned with a single processor core circuit so that a memory core circuit can be dynamically assigned to a processor core circuit depending on processor demand.

Figure 8A:
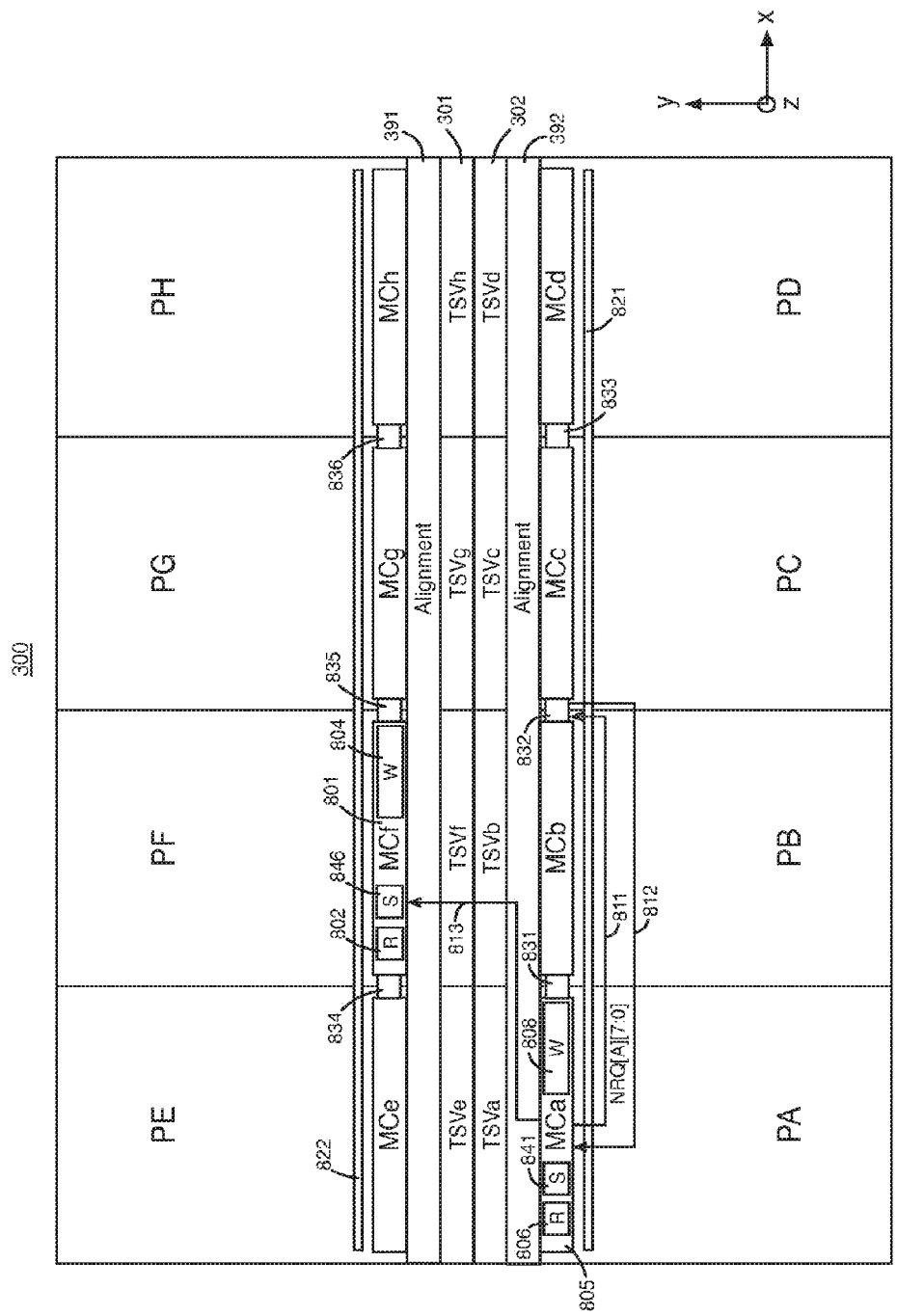
FIGS. 8A-8B illustrate an example of an arbitration sequence used to transmit signals between integrated circuit dies that are stacked and directly connected together through connection sites.

FIG. 8A illustrates an example of an arbitration sequence used to transmit signals between two integrated circuit dies that are stacked and electrically interconnected using connection sites and TSVs or otherwise. Each of the processor core circuits PA-PH of integrated circuit (IC) die 300 has a controller circuit MCa-MCh, respectively. Controller circuits MCa-MCh control the transmission of signals from processor core circuits PA-PH, respectively, to an IC die stacked thereon through connection sites and TSVs located in connection site blocks TSVa-TSVh, respectively. The controller circuits MCa-MCh control the transmission of signals from processor core circuits PA-PH to the connection sites in connection site blocks TSVa-TSVh.

According to an embodiment described herein, IC die 300 is a processor IC die having 8 processor core circuits PA-PH, the IC die (e.g., IC die 310, 320, or 340) stacked thereon is a memory IC die having 8 memory core circuits, and controller circuits MCa-MCh are memory controller circuits.

The memory controller circuits MCa-MCh may, for example, transmit to the stacked memory IC die instructions that have the instruction format shown in and described below with respect to FIG. 12A. A device field in the instruction format specifies the stacked IC die and which bank in the selected memory core circuit will be responding to a particular access.

Each of the memory controller circuits MCa-MCh includes a read queue storage circuit R, a write queue storage circuit W, and a state tracking circuit S. For example, memory controller circuit MCf 801 includes a read queue storage circuit 802, a state tracking circuit 846, and a write queue storage circuit 804, and memory controller circuit MCa 805 includes a read queue storage circuit 806, a state tracking circuit 841, and a write queue storage circuit 808. The remaining memory controller circuits are similar in structure. The read and write queue storage circuits 806 and 808 are associated with accesses from processor core circuit PA. State tracking circuit 841 is associated with access to the connection sites in connection site block TSVa.

IC die 300 includes lateral wire tracks 821-822. Lateral wire tracks 821-822 include a small number of wires that are used for the transmission of arbitration signals between the controller circuits MCa-MCh and arbitration circuit 832. Lateral wire tracks 821-822 typically have more conductors that extend in the y-direction than in the x-direction.

IC die 300 also has 6 arbitration circuits 831-836. Arbitration circuit 832 is a central arbitration circuit that controls the timing of the transmission of signals between processor core circuits PA-PH in IC die 300 and the memory core circuits MA-MH in the IC dies that are stacked on IC die 300. Central arbitration circuit 832 also controls the configuration of the alignment circuitry 402 by controlling the multiplexers in alignment circuitry 402. Further details of arbitration circuit blocks 831-836 are described below with respect to FIG. 24.

Figure 8B:
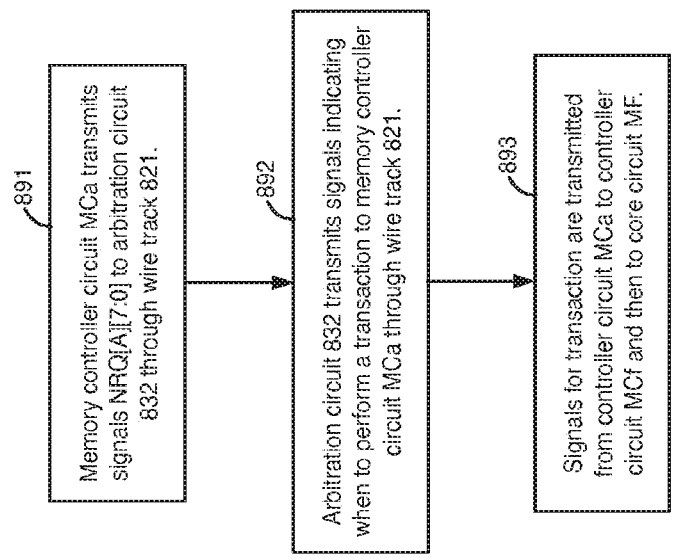

An arbitration sequence is now described with respect to FIG. 8B. In the following example, the arbitration sequence implements a transaction between processor core circuit PA and memory core circuit MF in the IC die stacked on IC die 300. Memory controller circuit MCa 805 stores read data transactions in read queue storage circuit 806. Memory controller circuit 805 stores write data transactions in write queue storage circuit 808. The read data is stored in the memory core circuit MF of the stacked memory IC die that processor core circuit PA requests to access. The write data is data in processor core circuit PA that is requested to be stored in the memory core circuit MF of the stacked memory IC die.

Memory controller circuit 805 in processor core circuit PA transmits 8 configuration signals NRQ[A][7:0] to central arbitration circuit 832 through lateral wire track 821, as illustrated graphically by arrow 811 in FIG. 8A and in box 891 in FIG. 8B. In addition, memory controller circuits MCb-MCh in IC die 300 also transmit sets of 8 configuration signals NRQ[B][7:0]-NRQ[H][7:0], respectively, to central arbitration circuit 832 via lateral wire track 821. Configuration signals NRQ[A][7:0]-NRQ[H][7:0] are set by processor core circuits PA-PH, respectively, to values that define the alignment configurations of the alignment circuitry 402 that are needed to provide access to the memory core circuits MA-MH for the pending read and write data transactions.

Central arbitration circuit 832 controls the sequencing of all of the read and write data transactions issued by processor core circuits PA-PH in IC die 300 requesting to access the memory core circuits MA-MH in the stacked IC die. The alignment circuitry 402 in alignment stripes 391-392 can connect every processor core circuit PA-PH in IC die 300 to every memory core circuit MA-MH, but the connections are sequential, not simultaneous.

Central arbitration circuit 832 allows only certain ones of the read and write data transactions issued by processor core circuits PA-PH to occur at one time. The read and write data transactions that central arbitration circuit 832 permits in each time interval are based on connections the alignment circuitry 402 in alignment stripes 391-392 can provide between processor core circuits PA-PH and the connection sites in connection stripes 301-302. Central arbitration circuit 832 causes alignment circuitry 402 in alignment stripes 391-392 to be dynamically reconfigured in different alignment configurations in different time intervals. Arbitration circuit 832 sends control signals to configurable routing blocks 461 to control the configuration of alignment circuitry 402. Further details of the operation and architecture of arbitration circuit 832 are shown in and described below with respect to FIG. 24. In each alignment configuration, alignment circuitry 402 transmits signals from each processor core circuit PA-PH in IC die 300 to a different one of the memory core circuits MA-MH in one or more stacked IC dies.

Central arbitration circuit 832 sends signals to memory controller circuit 805 through lateral wire track 821. Such signals indicate when to perform a particular read or write data transaction, as illustrated graphically by arrow 812 in FIG. 8A and in box 892 in FIG. 8B. Central arbitration circuit 832 also sends signals to the other memory controller circuits in IC die 300 indicating when to perform their requested read and write data transactions. During a defined time interval after the memory controller circuits receive these signals from central arbitration circuit 832, the memory controller circuits access the memory circuits through the selected alignment configuration of alignment circuitry 402 to implement their read and write data transactions. In the example shown in FIG. 8A, signals are transmitted from memory controller circuit 805 to memory controller circuit 801 local to memory core circuit MF, and then to memory core circuit MF in the stacked memory IC die through alignment circuitry 402 in alignment stripes 391-392 and the connection sites in connection site block TSVf, as illustrated graphically by arrow 813 in FIG. 8A and in box 893 in FIG. 8B, to implement the requested transaction. The functions and structures described and shown herein with respect to FIGS. 8A-8B can also be applied to three or more stacked IC dies.

FIGS. 9A-9H respectively illustrate examples of 8 alignment configurations of alignment circuitry 402 in alignment stripes 391-392 that can be used to connect processor core circuits PA-PH in IC die 300 to memory core circuits MA-MH in one or more of stacked IC dies 310, 320, and 340. An alignment configuration refers to a particular set of connections between processor core circuits PA-PH and memory core circuits MA-MH. When applied sequentially, the 8 alignment configurations shown in FIGS. 9A-9H couple each of the processor core circuits PA-PH to each of the local and non-local memory core circuits MA-MH.

As described above, alignment circuitry 402 in alignment stripes 391-392 has 5 lateral tracks 402A-402E, and each of processor core circuits PA-PH can transmit 5 sets of signals DQ0, DQ1, CA, DQ2, and DQ3 through alignment circuitry 402 to one of memory core circuits MA-MH. Each of the alignment configurations 0-7 of alignment circuitry 402 that are referred to as alignment 0, alignment 1, alignment 2, alignment 3, alignment 4, alignment 5, alignment 6, and alignment 7 in FIGS. 9A-9H, respectively, transmits two signals in opposite directions along an x-direction segment of at least one of lateral tracks 402A-402E. The alignment configurations 0-7 shown in FIGS. 9A-9H can be generated by implementing alignment circuitry 402 using the circuitry of FIGS. 5A-5F, because the circuitry of FIGS. 5A-5F allows signals to be transmitted in both the positive and negative x-directions through a segment of the same lateral track 402A-402E using circuit blocks 501-502.

The alignment configurations 0-7 are represented by the numbers 0-7 in the timing diagrams 901-902 shown in FIGS. 9I and 9J. The numbers 0-7 in the timing diagrams 901-902 are the 8 possible values of each set of alignment signals NRQ[A][7:0]-NRQ[H][7:0]. In one embodiment, central arbitration circuit 832 causes the alignment circuitry 402 in alignment stripes 391-392 to cycle repetitively through alignment configurations 0-7 in the order shown in timing diagram 901. Central arbitration circuit 832 may, for example, generate the order of alignment configurations shown in timing diagram 901 when processor core circuits PA-PH generate an even distribution of read and write transaction requests for accessing memory core circuits MA-MH.

In another embodiment, central alignment circuit block 832 causes alignment circuitry 402 to skip some of the alignment configurations 0-7. When, for example, processor core circuits PA-PH generate an uneven distribution of read and write transaction requests for accessing memory core circuits MA-MH, central arbitration circuit 832 causes the alignment circuitry 402 to skip those of the alignment configurations that are not needed at a particular time to execute a pending request to access memory core circuits MA-MH. Timing diagram 902 illustrates an example of how central arbitration circuit 832 can cause alignment circuitry 402 to skip those of the alignment configurations 0-7 that are not needed to execute pending requests to access memory core circuits MA-MH.

In general, central arbitration circuit 832 initially selects an alignment configuration and then configures alignment circuitry 402 according to the selected alignment configuration. Central arbitration circuit 832 communicates the selected alignment configuration to the processor core circuits PA-PH so that they can update the next access request to memory core circuits MA-MH. In some embodiments, the central arbitration circuit 832 can also cause the alignment circuitry 402 in alignment stripes 391-392 to generate only local connections between the core circuits in one or more alignment configurations.

Figure 9K:
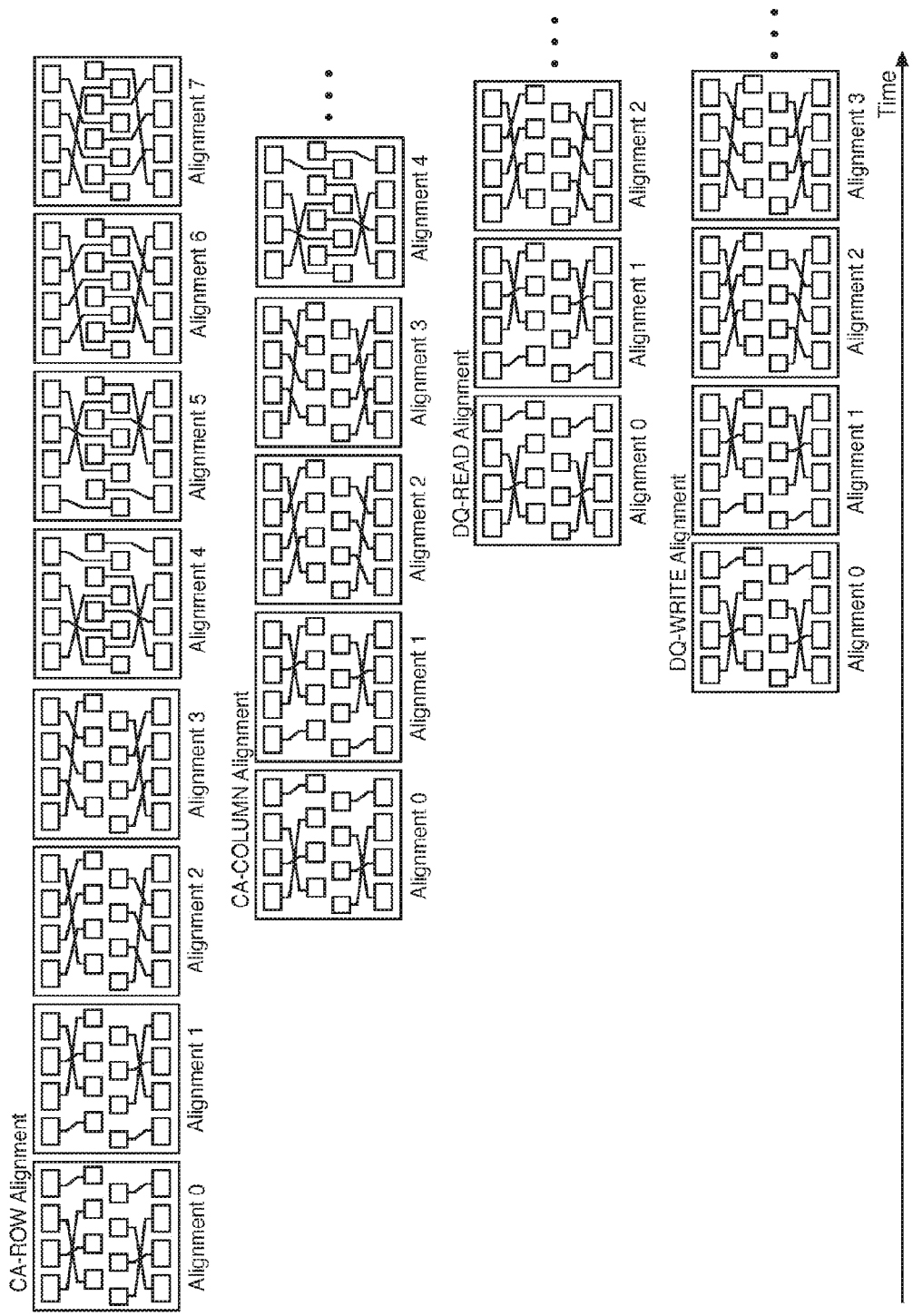
FIG. 9K is a timing diagram that illustrates an example of the static timing offsets used to implement a sequence of 5 transactions.

FIG. 9K is a timing diagram that illustrates an example of the static timing offsets used to implement a sequence of memory access transactions. FIG. 9K illustrates how the information in memory access transactions flows through the alignment circuitry 402 in alignment stripes 391-392 in three distinct sets. The three distinct sets of information include the command-address for the row, the command-address for the column, and the read or write data. The alignment circuitry 402 provides dedicated wires and circuits as well as dedicated time slots that are used to transmit the three sets of information independently.

The alignment configurations referred to as alignments 0-7 in FIG. 9K are the same alignment configurations 0-7, respectively, shown in FIGS. 9A-9H. The first row of alignment configurations 0-7 shown in FIG. 9K illustrates an example of how alignment circuitry 402 can cycle through 8 different alignment configurations 0-7 that are used to transmit the command-addresses for the rows (CA-ROW) from processor core circuits PA-PH to memory core circuits MA-MH.

The second row of alignment configurations shown in FIG. 9K illustrates an example of how alignment circuitry 402 in alignment stripes 391-392 can advance through the first five alignment configurations (0-4) of alignment configurations 0-7 that are used to transmit the command-addresses for the columns (CA-COLUMN) from processor core circuits PA-PH to memory core circuits MA-MH. The third row of alignment configurations shown in FIG. 9K illustrates an example of how alignment circuitry 402 in alignment stripes 391-392 can advance through the first three (0-2) alignment configurations of alignment configurations 0-7 that are used to transmit read data from memory core circuits MA-MH to processor core circuits PA-PH. The fourth row of alignment configurations shown in FIG. 9K illustrates an example of how alignment circuitry 402 in alignment stripes 391-392 can advance through the first four alignment configurations (0-3) of alignment configurations 0-7 that are used to transmit write data from processor core circuits PA-PH to memory core circuits MA-MH. All 8 alignment configurations 0-7 of the alignment circuitry are used to transmit the column command-addresses, the read data, and the write data. To simplify the drawing, FIG. 9K shows only a subset of the 8 alignment configurations 0-7 shown in FIG. 9I for the column command-addresses, the read data, and the write data.

All of the alignment configurations 0-7 are shown with respect to time in FIG. 9K. In the example of FIG. 9K, a first portion of alignment circuitry 402 is initially configured according to alignment 0 to transmit the command-addresses for the rows from processor core circuits PA-PH to memory core circuits MC, MB, MA, MD, MG, MF, ME, and MH, respectively. In respective subsequent time intervals, the same first portion of the alignment circuitry is configured according to alignment configurations 1-7 to transmit the command-addresses for the rows from processor core circuits PA-PH to different combinations of the memory core circuits MA-MH.

While the first portion of alignment circuitry 402 is configured to transmit the command-addresses for the rows, a second portion of the alignment circuitry is concurrently configured according to a different alignment configuration that transmits the command-addresses for the columns for pending transactions. For example, while the first portion of the alignment circuitry is configured according to alignments 2-3 for the transmission of the command-addresses for the rows, the second portion of the alignment circuitry is simultaneously configured according to alignment 0 for the transmission of the command-addresses for the columns, as shown in the first two rows of FIG. 9K.

The second portion of the alignment circuitry is configured according to an alignment configuration to transmit the command-addresses for the columns as respective parts of the same 8 transactions that previously initiated the same alignment configuration for the transmission of the row command-addresses. Each set of 8 read and write data transactions initiates the same alignment configuration of the alignment circuitry a first time for the transmission of the row command-addresses, a second time for the transmission of the column command-addresses, and a third time for the transmission of the read data or write data. For example, alignment 0 occurs three times in the timing diagram of FIG. 9K for the transmission of these three sets of signals. Although the read and write data alignment configurations are both shown in FIG. 9K, only one of these alignment configurations is used in a given read or write transaction.

While the first portion of alignment circuitry 402 is configured to transmit the row command-addresses, and the second portion of the alignment circuitry is configured to transmit the column command-addresses, a third portion of the alignment circuitry is concurrently configured according to different alignment configurations that transmit the read data or the write data for the pending transactions. The alignment configurations in FIG. 9K occur at the same time as other alignment configurations depicted directly above or below them.

Each of the 8 alignment configurations shown in FIGS. 9A-9H includes the configurations of three different portions of the alignment circuitry 402. The three different portions of the alignment circuitry are used to transmit the row command-addresses, the column command-addresses, and the read or write data for each set of 8 transactions. For example, a first portion of alignment circuitry 402 configured according to alignment configuration 0 shown in FIG. 9A when transmitting the row command-addresses is different from a second portion of the alignment circuitry configured according to alignment configuration 0 that is used for the transmission of the column command-addresses. Also, a third portion of alignment circuitry 402 configured according to alignment configuration 0 is used when transmitting the read/write data and is different from the first and second portions used in alignment configuration 0 for the transmission of the command-addresses.

Figure 9L:
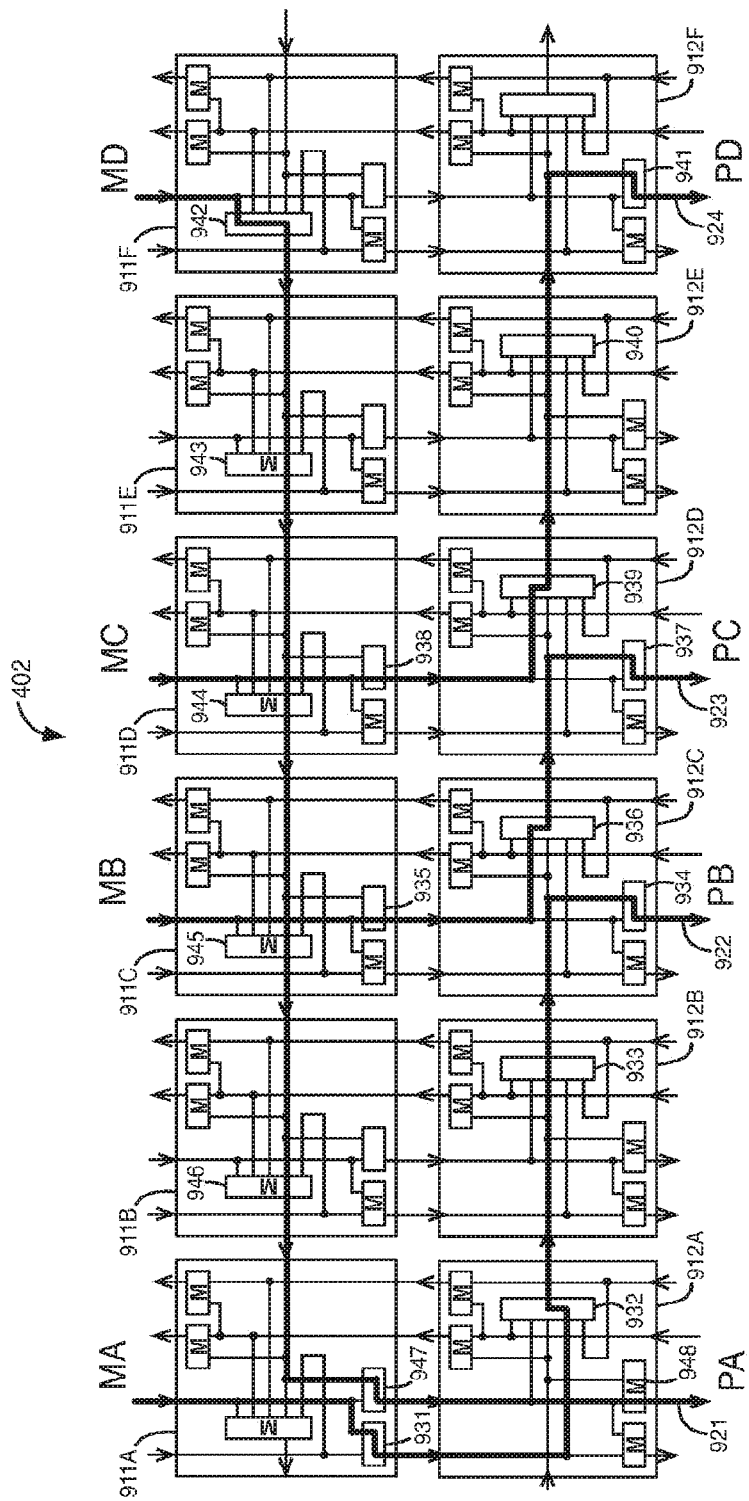
FIG. 9L is a diagram that illustrates an example of how signals can be transmitted between processor core circuits and memory core circuits according to the alignment configuration shown in FIG. 9D.

FIG. 9L illustrates an example of how alignment circuitry 402 can be configured to transmit signals between processor core circuits PA-PD and memory core circuits MA-MD according to alignment configuration 3 shown in FIG. 9D. The multiplexer blocks 911A-911F and 912A-912F shown in FIG. 9L are part of the alignment circuitry 402 in this embodiment. Multiplexer blocks 911A-911F are alternative implementations of multiplexer blocks 513 in configurable routing blocks 461 according to the configuration shown in FIGS. 5A and 5C. Multiplexer blocks 912A-912F are alternative implementations of multiplexer blocks 511 in configurable routing blocks 461 according to the configuration shown in FIGS. 5A and 5B. The thick lines in FIG. 9L represent signal paths 921-924 between memory core circuits MA-MD and processor core circuits PA-PD through multiplexer blocks 911A-911F and 912A-912F.

In the example of the alignment configuration of FIG. 9L, a signal is transmitted from memory core circuit MA to processor core circuit PB through path 922 by multiplexers 931-934. A signal is transmitted from memory core circuit MB to processor core circuit PC through path 923 by multiplexers 935-937. A signal is transmitted from memory core circuit MC to processor core circuit PD through path 924 by multiplexers 938-941. A signal is transmitted from memory core circuit MD to processor core circuit PA through path 921 by multiplexers 942-948.

FIGS. 10A-10H respectively illustrate additional examples of 8 configurations of alignment circuitry 402 that can be used to connect processor core circuits PA-PH in IC die 300 to memory core circuits MA-MH in one or more of stacked IC dies 310, 320, and 340. The 8 configurations shown in FIGS. 10A-10H are examples of configurations of alignment circuitry 402 implemented using the routing blocks of FIGS. 6A-6D. The 8 alignment configurations shown in FIGS. 10A-10H couple each of the processor core circuits PA-PH to each of the memory core circuits MA-MH.

Each of the alignment configurations 0-7 shown in FIG. 10A-10H transmits only one signal at a time in the positive or negative x-direction along each segment of the lateral tracks 402A-402E of alignment circuitry 402. The circuitry of FIGS. 6A-6D only permits the transmission of one signal at a time in the positive or negative x-direction in each segment of lateral tracks 402A-402E. Therefore, if alignment circuitry 402 is implemented using the circuitry of FIGS. 6A-6D, the alignment configurations 0-7 shown in FIG. 10A-10H can be used to configure alignment circuitry 402 to couple each of the processor core circuits PA-PH to each of the memory core circuits MA-MH.

Figure 10I:
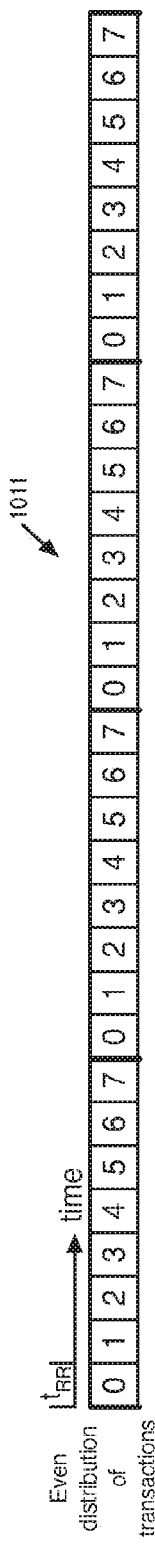
FIGS. 10I-10J are timing diagrams that illustrate examples of even and uneven distributions, respectively, of the alignment configurations of FIGS. 10A-10H.
Figure 10J:
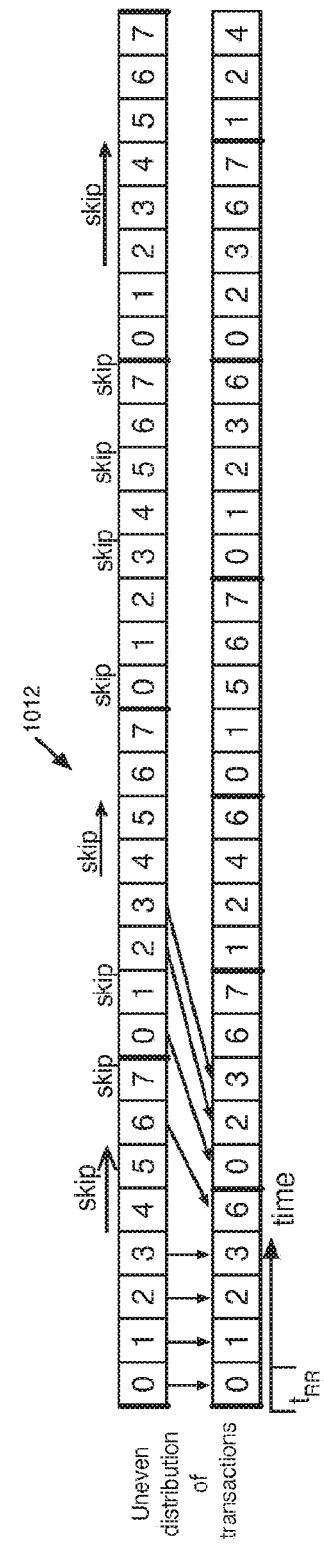

The 8 alignment configurations are represented by the numbers 0-7 in the timing diagrams 1011-1012 shown in FIGS. 10I and 10J, respectively. Central arbitration circuit 832 may, for example, cause alignment circuitry 402 to cycle repetitively through alignment configurations 0-7 in the order shown in diagram 1011 when processor core circuits PA-PH generate an even distribution of read and write requests for accessing core circuits MA-MH. In the embodiment of FIGS. 10A-10H, connections to the non-local memory core circuits MA-MH may have priority over connections to the local memory core circuits MA-MH.

Timing diagram 1012 shown in FIG. 10J illustrates an example of how the central arbitration circuit 832 can cause alignment circuitry 402 to skip those of the alignment configurations 0-7 that are not needed to execute pending requests to access memory core circuits MA-MH. This can occur when, for example, processor core circuits PA-PH generate an uneven distribution of read and write requests for accessing memory core circuits MA-MH.

Figures 11A, 11B:
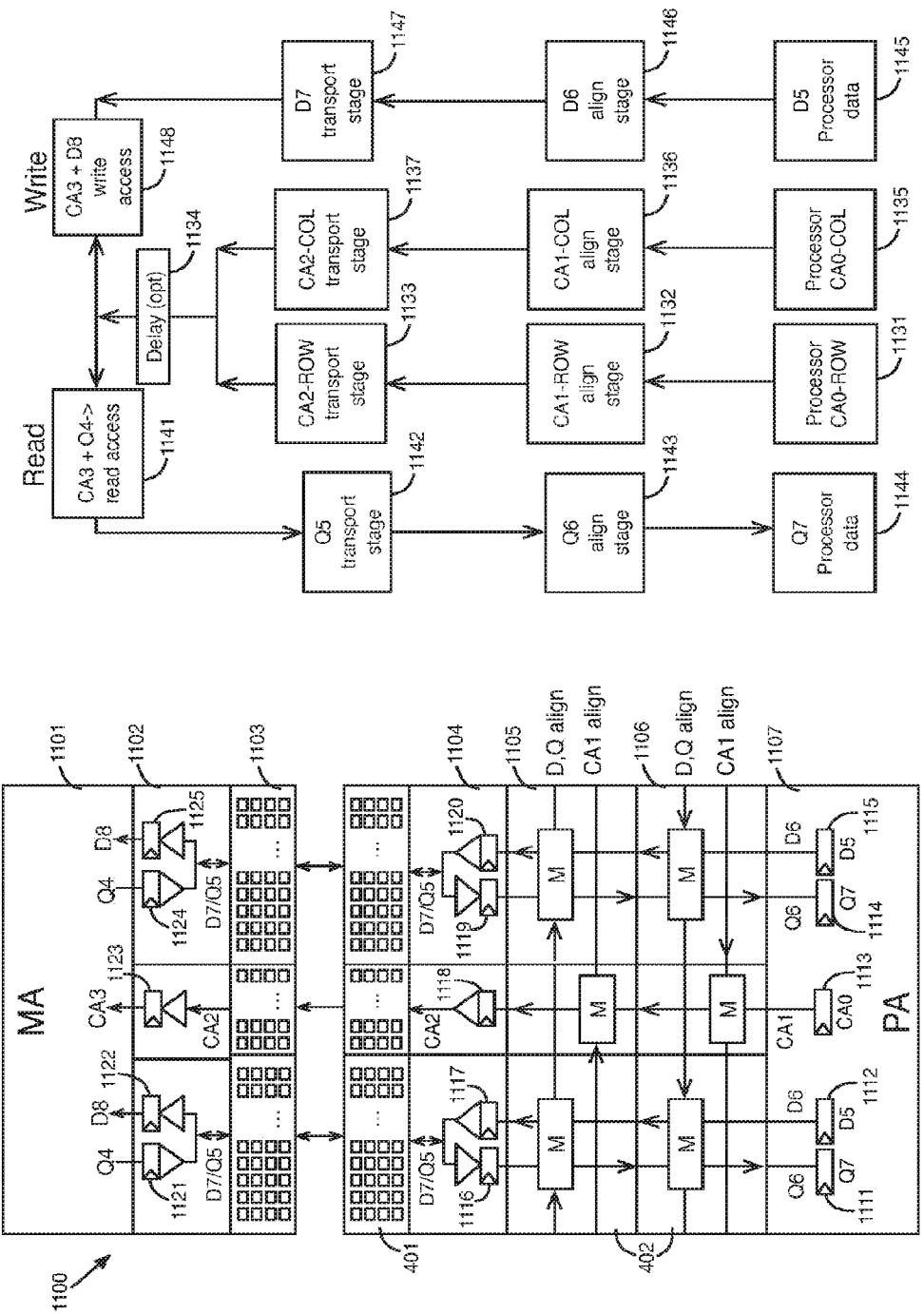
FIGS. 11A-11B illustrate examples of read and write data transitions for two stacked integrated circuit dies.

FIGS. 11A-11B illustrate examples of read and write data transactions for two stacked integrated circuit (IC) dies. FIG. 11A illustrates a portion of IC die 300 that is associated with processor core circuit PA 1107 and a portion of an IC die 1100 that is stacked on IC die 300. FIG. 11B is a flow chart that shows examples of some of the operations performed when a core circuit in IC die 300 accesses a core circuit in IC die 1100. In the examples of FIGS. 11A-11B, IC die 300 is a processor IC die, and IC die 1100 is a memory IC die.

Each read and write data transaction has a command-address for the row, a command-address for the column, and read or write data, which are transferred through alignment circuitry 402 at different time offsets after the start of a transaction. To accommodate these three sets of information, the alignment circuitry 402 is divided into three independent segments of wires and routing circuitry. Each segment can be set to the necessary alignment combination independently. The three segments of alignment circuitry 402 cycle through the same alignment sequence at the different time offsets. Typically, all eight transactions being issued by processor core circuits PA-PH at the same time and transmitted through alignment circuitry 402 at the same time are either all reads or all writes. In alternative embodiments, alignment circuitry 402 can be configured to accommodate simultaneous read and write transactions.

As shown in FIG. 11A, processor core circuit PA 1107 has 5 registers 1111-1115 that are used to store information relating to read and write data transactions with memory circuits in IC die 1100. In operation 1131, processor core circuit PA 1107 stores a first command-address (CA0) for a read or write transaction in register 1113. The first command-address indicates a row of data in memory core circuit MA 1101 within IC 1100 die that will be accessed during the read or write data transaction. Subsequently, central arbitration circuit 832 configures alignment circuitry 402 according to an alignment configuration that connects processor core circuit 1107 to memory core circuit 1101 through connection sites in connection stripe 401 and TSVs and connection sites in connection stripe 1103.

In operation 1132, the command-address (CA1) for the row stored in register 1113 is transmitted through alignment circuitry 402 to register 1118 in transmit/receive stripe 1104 of IC die 300. Only two segments 1105-1106 of two of the 5 lateral tracks of alignment circuitry 402 are shown in FIG. 11A to simplify the drawing. In operation 1133, the command-address (CA2) for the row stored in register 1118 is transmitted through the connection sites in connection stripe 401 of IC die 300 and the TSVs and connection sites in connection stripe 1103 of IC die 1100, and then stored in register 1123 in transmit/receive stripe 1102 of IC die 1100. In operation 1134, an optional delay function is performed.

In operation 1135, processor core circuit PA 1107 stores a second command-address (CA0) for the read or write transaction in register 1113. The second command-address indicates a column of data in memory core circuit MA 1101 within IC die 1100 that will be accessed to complete the read or write data transaction. In operation 1136, the command-address (CA1) for the column stored in register 1113 is transmitted through alignment circuitry 402 to register 1118 in transmit/receive stripe 1104. In operation 1137, the command-address (CA2) for the column is stored in register 1118, transmitted through connection sites in connection stripe 401 and TSVs and connection sites in connection stripe 1103, and is also stored in register 1123.

If the transaction is a read data transaction, in operation 1141, memory core circuit MA 1101 accesses the read data (Q4) using the command-addresses (CA3) for the selected row and column that are transmitted from register 1123. In operation 1142, the accessed read data (Q5) is stored in registers 1121 and 1124 in transmit/receive stripe 1102, transmitted through connection sites and TSVs in connection stripe 1103 and TSVs and connection sites in connection stripe 401, and stored in registers 1116 and 1119 in transmit/receive stripe 1104. In operation 1143, the read data (Q6) is transmitted through alignment circuitry 402 to registers 1111 and 1114 in processor core circuit 1107. In operation 1144, the read data (Q7) is stored in registers 1111 and 1114.

If the transaction is a write data transaction, processor core circuit PA 1107 stores the write data (D5) in registers 1112 and 1115, in operation 1145. In operation 1146, the write data (D6) stored in registers 1112 and 1115 are transmitted through alignment circuitry 402 to registers 1117 and 1120 in transmit/receive stripe 1104. In operation 1147, the write data (D7) stored in registers 1117 and 1120 is transmitted through connection sites in connection stripe 401 and TSVs and connection sites in connection stripe 1103, and stored in registers 1122 and 1125 in transmit/receive stripe 1102. In operation 1148, memory core circuit MA 1101 stores the write data (D8) using the command-addresses (CA3) for the selected row and column that are transmitted from register 1123.

Figure 12A:
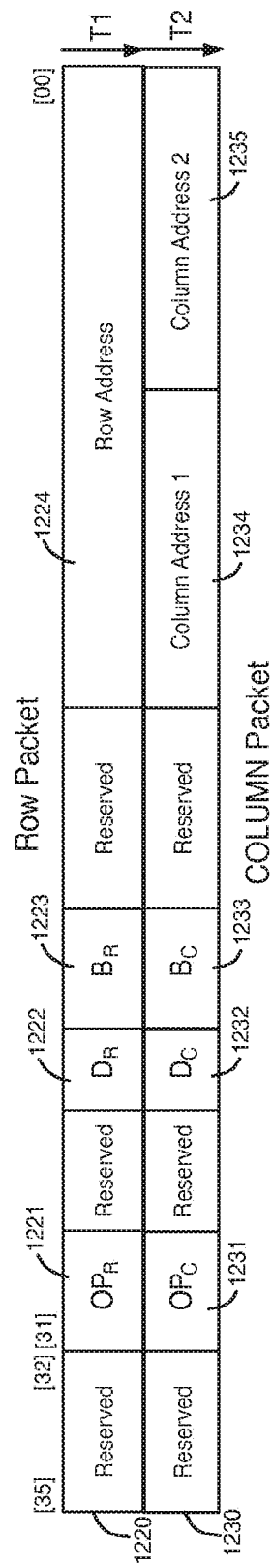
FIG. 12A illustrates an example of a data format that can be used to transmit information associated with a read or write data transaction.

FIG. 12A illustrates an example of a data format that can be used to transmit information associated with a read or write data transaction. The data format shown in FIG. 12A is the format used in the timing diagrams of FIGS. 12B, 13-17 and 20, which are described below. The data format shown in FIG. 12A uses odd and even timing slots T1 and T2 on the command-address segments of alignment circuitry 402. The row command-address is in the odd segment, and the column command-address is in the even segment. The timing offsets generated in the alignment circuitry 402 for the transmission of the row command-address and the column command-address are set based on the alternate even and odd timing slots.

The data format of FIG. 12A includes a row packet 1220 and a column packet 1230. Each of the row and column packets has 36 bits numbered [00] to [35] in the example of FIG. 12A. The row packet 1220 is transmitted in timing slot T1, and the column packet is transmitted in timing slot T2. The row packet 1220 includes operational code ($OP_R$) bits 1221, device identifier bits $D_R$ 1222, bank identifier bits $B_R$ 1223, and row address bits 1224. The column 1230 packet includes operational code ($OP_C$) bits 1231, device identifier bits $D_C$ 1232, bank identifier bits $B_C$ 1233, and column address bits 1234-1235.

Each read or write data transaction accesses the bank indicated by bits $B_R$ and $B_C$ in the memory core circuit within the integrated circuit die indicated by bits $D_R$ and $D_C$. The bank indicated by bits $B_R$ and $B_C$ accesses the row indicated by the row address bits 1224. The two sets of column address bits 1234-1235 are used to access two columns of data from the row indicated by the row address bits 1224. The operation codes $OP_R$ and $OP_C$ indicate whether to perform the pre-charge and activate functions, as will be described in further detail below. A group address G, which indicates one of the memory core circuits MA-MH, is not part of the formats shown in FIG. 12A. The group address is extracted by the memory controller circuit from the physical address of the transaction presented by the processor core circuit and is used by the arbitration circuit 832.

Other data formats can also be used to transmit data according to the techniques described herein. For example, some data formats can divide the command-address portion of the alignment circuitry 402 into a first portion that is used to transmit the command-address for the row and a second portion that is used to transmit the command-address for the column.

Figure 12B:
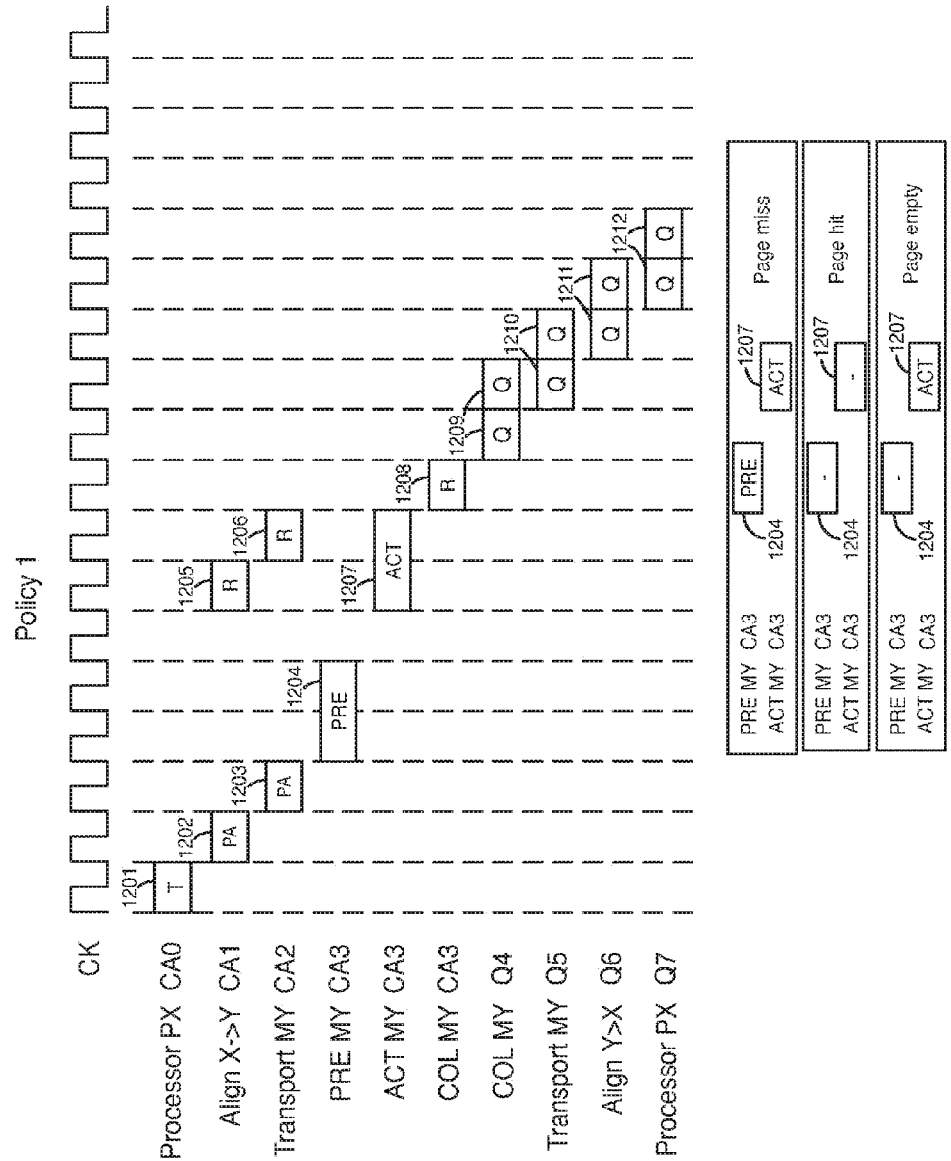
FIG. 12B is a timing diagram for an embodiment of a system that provides fixed timing relationships between the operations of a read data transaction that are not affected by the bank state of the memory core circuit.
Figure 13:
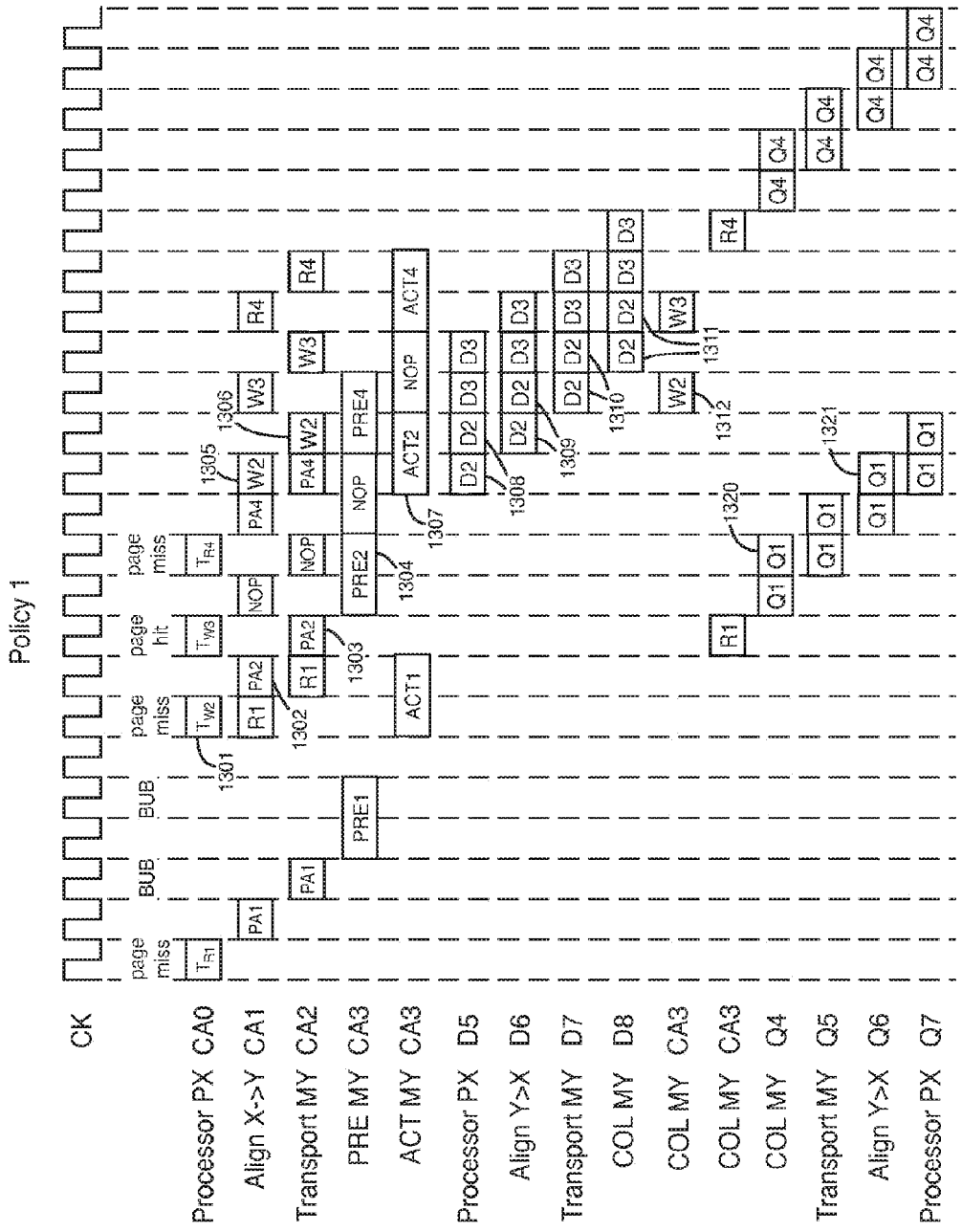
FIG. 13 is a timing diagram for a system that provides operations of read and write data transactions between a processor core circuit and a memory core circuit that have fixed timing relationships.

FIG. 12B is a timing diagram for an embodiment of a system that provides fixed timing relationships between the operations of a read data transaction between a processor core circuit PX and a memory core circuit MY that are not affected by the bank state of the memory core circuit. The protocols used in the embodiments of FIGS. 12B and 13 are referred to herein as policy 1.

The embodiment of FIG. 12B allows the row command-address, the column command-address, and data information to be transferred through the alignment circuitry 402 using the same alignment configurations. If the transaction timing varied across the eight simultaneous transactions that are started in each timing interval, then different alignment configurations would be needed for the column command-address and data transfers. These alignment configurations may or may not be supported by the alignment circuitry. In the embodiment of FIG. 12B, only eight of the $2^{24}$ possible alignment combinations between PA-PH and MA-MH are supported in any one configuration of the alignment circuitry. Supporting only a subset of the numerous possible alignment combinations in any one configuration of the alignment circuitry allows the wire and gate cost of the alignment circuitry to be reduced, while still allowing each processor core circuit PA-PH to efficiently access any region of memory in the memory core circuits MA-MH.

The processor core circuit PX can be any of processor core circuits PA-PH in IC die 300 such as, for example, processor core circuit PA. The memory core circuit MY can be any of memory core circuits MA-MH such as, for example, memory core circuit MA 1101 shown in FIG. 11A. Memory core circuit MY is located in an IC die that is stacked on the IC die containing processor core circuit PX and connected to that IC die through connection sites such as those interconnected by TSVs as described herein. In the descriptions of FIGS. 12A, 12B, 13 and 14 that follow, references to signals being transmitted through TSVs in the processor and memory IC dies will be regarded as describing transmission through connection sites in one of the IC dies and through corresponding TSVs and connection sites in the other of the IC dies.

FIG. 12B illustrates operations associated with a read data transaction that are organized into a timing pipeline. The timing of the operations in FIG. 12B are shown with respect to the cycles of a clock signal CK. During time interval 1201, the processor core circuit PX issues a request to read data stored at a specific location in memory core circuit MY. Also, processor core circuit PX generates the command-address (CA0) for the location in the memory IC that stores the requested data. During time interval 1202, the alignment circuitry 402 is configured according to an alignment configuration that connects core circuits PX and MY together, and the command-address (CA1) for the requested row of the read data is transmitted through alignment circuitry 402.

During time interval 1203, the command-address (CA2) for the row is transmitted through the TSVs in the processor and memory IC dies to a register in the transmit/receive stripe in the memory IC die. During time intervals 1204, memory core circuit MY performs a pre-charge (PRE) of the row indicated by the received command-address (CA3).

During time interval 1205, the command-addresses (CA1) for the columns are transmitted through the alignment circuitry 402. Time intervals 1202 and 1205 are odd and even cycles of the command-address alignment circuitry 402 that are time-multiplexed, with independent timing offsets. During time interval 1206, the command-addresses (CA2) for the columns are transmitted through the TSVs in the processor and memory IC dies to the register in the transmit/receive stripe in the memory IC die. During time intervals 1207, memory core circuit MY performs an activate (ACT) function of the row indicated by the received command-address (CA3). During an activate function, bits read from the row at a selected row address are transmitted to and stored in latching sense amplifiers in memory core circuit MY. Time intervals 1205 and 1206 coincide with time intervals 1207.

During time interval 1208, memory core circuit MY accesses the requested bits (i.e., the read data bits) stored in the sense amplifiers based on the command-addresses (CA3) for the selected row and columns received from processor core circuit PX. During time intervals 1209, memory core circuit MY transmits the read data bits (Q4) to registers in the transmit/receive stripe in the memory IC die. In the embodiments of FIGS. 12B, 13-17 and 20, each data transaction causes two successive column access cycles in the memory core circuit (e.g., in time intervals 1209), because the data format includes two command-addresses 1234-1235 for accessing data in two columns, as shown in FIG. 12A. Time intervals 1209 use two cycles of clock signal CK to read data from two columns of the memory. In other embodiments, each data transaction may generate a different number of column accesses.

During time intervals 1210, the read data bits (Q5) are transmitted through the TSVs in the processor and memory IC dies to registers in the transmit/receive stripe in the processor IC die. During time intervals 1211, the read data bits (Q6) are transmitted through alignment circuitry 402 to the processor core circuit PX. During time intervals 1212, the processor core circuit PX stores the read data bits (Q7).

In an embodiment, each of the memory core circuits MA-MH in the memory IC dies stacked on the processor IC die has three bank states. The three bank states are referred to as page miss, page hit, and page empty. These three bank states can equivalently be referred to as row miss, row hit and row empty.

When the bank state is page miss, a bank of sense amplifiers corresponding to the requested memory bank contains a different row of bits than the requested row of bits. The row of bits stored in the sense amplifiers is first written back to the memory array using a pre-charge command. Then, the requested row is loaded into the sense amplifiers using an activate command. Thus, during a page miss bank state, the memory core circuit performs the pre-charge and the activate functions to access the bits stored in the row indicated by the command-address.

When the bank state is page hit, the bits stored in the row of the memory core circuit indicated by the command-address were already loaded into the bank of sense amplifiers corresponding to the requested memory bank during a previous read operation. Therefore, the pre-charge and activate functions are not be performed during a page hit bank state in order to save energy.

When the bank state is page empty, no bits are stored in the bank of sense amplifiers corresponding to the requested memory bank. Then, the bits corresponding to the requested row are loaded into the bank of sense amplifiers using an activate command before the row of bits can be accessed. The pre-charge operation is not performed when the bank state is page empty.

When the bank state of the memory core circuit is page miss, the memory core circuit performs both the pre-charge operation during time intervals 1204 and the activate operation during time intervals 1207. When the bank state of the memory core circuit is page empty, the memory core circuit performs the activate operation during time intervals 1207, but it does not perform the pre-charge operation in time intervals 1204. When the bank state of the memory core circuit is page hit, the memory core circuit does not perform either of the pre-charge or activate operations in time intervals 1204 and 1207.

The memory core circuit does not perform a data access function during time intervals 1204 and 1207 in response to a page hit bank state, and the memory core circuit does not perform a data access function during time intervals 1204 in response to a page empty bank state, as shown at the bottom of FIG. 12B. In the embodiment of FIG. 12B, the operations of the read (and write) data transactions always have fixed timing relationships relative to each other, regardless of the bank state of the memory core circuit. Thus, during a page hit or page empty bank state, the operations performed in time intervals 1205-1206 and 1208-1212 are not performed earlier in time to take advantage of the fact that one or both of the pre-charge and activate operations are not performed. In this embodiment, the operations performed in time intervals 1205-1206 and 1208-1212 always occur the same number of clock cycles shown in FIG. 12B after the operations performed in time intervals 1201-1203, regardless of whether the pre-charge and activate operations are performed in time intervals 1204 and 1207.

The alignment circuitry 402 described above can support 8 transactions at a time between processor core circuits PA-PH and memory core circuits MA-MH. In the embodiment of FIG. 12B, all 8 of these transactions cause signals to be transmitted through alignment circuitry 402 during the same time intervals regardless of the bank states of the memory core circuits MA-MH being accessed. As an example, for all of the read data transactions that are performed concurrently during a selected alignment configuration, the command-addresses for each read transaction are transmitted through the alignment circuitry during the relative time intervals 1202 and 1205, and the read data for each read transaction is transmitted back to the processor core circuits in the relative time intervals 1211, regardless of the bank states of the accessed memory core circuits.

Thus, if multiple read data transactions are performed during one alignment configuration, command-addresses for these read data transactions are transmitted concurrently through alignment circuitry 402 during the same time intervals 1202 and 1205, and the read data for these read data transactions are transmitted concurrently through alignment circuitry 402 during the same time interval 1211. The central arbitration circuit 832 ensures that the appropriate alignment configuration is re-used during each of time intervals 1202, 1205, and 1211 so that the signals for the read data transactions can be transmitted through alignment circuitry 402 during the same intervals in the timing pipeline.

FIG. 13 is a timing diagram for an embodiment of a system that provides operations of read and write data transactions between a processor core circuit PX and a memory core circuit MY that have fixed timing relationships. The timing relationships between each of the operations of the read and write data transactions remain the same regardless of the bank state of the memory core circuits being accessed, as with the embodiment of FIG. 12B. The operations associated with the read and write data transactions shown in FIG. 13 are organized into a timing pipeline and are shown with respect to the cycles of clock signal CK. FIG. 13 illustrates an example of how read and write data transactions can be pipelined together with some operations of the transactions occurring at the same time.

The first transaction shown in the timing diagram of FIG. 13 is a read data transaction that accesses memory core circuit MY in a page miss bank state. The operations for the first read data transaction shown as $T_{R1}$, PA1, PRE1, ACT1, R1, and Q1 in FIG. 13 correspond to the same operations that are described above with respect to timing intervals 1201-1212.

The second transaction shown in the timing diagram of FIG. 13 is a write data transaction that accesses memory core circuit MY in a page miss state. The operations for the second write data transaction occur during time intervals 1301-1312 in FIG. 13. During time interval 1301, the processor core circuit PX issues a request to write data to memory core circuit MY, and processor core circuit PX generates the command-address (CA0) defining the location where the data will be stored in memory core circuit MY. During time interval 1302, the alignment circuitry 402 is configured according to an alignment configuration that connects core circuits PX and MY together. Also, the command-address (CA1) for the row is transmitted through the alignment circuitry 402 on the processor IC die in time interval 1302.

During time interval 1303, the command-address (CA2) for the row is transmitted through connection sites in the processor IC die and TSVs and connection sites in the memory IC die to the transmit/receive stripe in the memory IC die. During time intervals 1304, memory core circuit MY performs a pre-charge (PRE) of the row indicated by the received command-address (CA3).

During time interval 1305, the command-address (CA1) for the column in memory core circuit MY where the data will be stored is transmitted through the alignment circuitry 402. During time interval 1306, the command-address (CA2) for the column is transmitted through connection sites in the processor and memory IC dies to a register in the transmit/receive stripe in the memory IC die. During time intervals 1307, memory core circuit MY performs an activate (ACT) function of the row indicated by the command-address (CA3).

During time intervals 1308, processor core circuit PX stores the write data bits (D5) in registers 1112 and 1115 shown in FIG. 11A. During time intervals 1309, the stored write data bits (D6) are transmitted through the alignment circuitry 402 in the processor IC die. Time intervals 1309 determine the earliest time at which the write data transaction can be started at time interval 1301, because the first read data transaction utilizes the alignment circuitry 402 for its read data Q1 at time intervals 1321.

If dedicated alignment circuitry is provided for the read and write transactions, then the write transaction can be started 4 cycles earlier. In this example, the Q1 read data accesses in time intervals 1320 and the D2 write data accesses in time intervals 1311 occur in adjacent clock cycles.

During time intervals 1310, the write data bits (D7) are transmitted through connection sites in the processor and memory IC dies to registers in the transmit/receive stripe in the memory IC die. During time intervals 1311, the write data bits (D8) are transmitted from the registers in the transmit/receive stripe in the memory IC die to core region 1101 in memory core circuit MY. During time interval 1312, memory core circuit MY stores the write data bits in the memory location indicated by the command-address (CA3) for the row and column. The transactions beginning with $T_{R1}$, $T_{W2}$, $T_{W3}$, and $T_{R4}$ in FIG. 13 represent up to eight simultaneous transactions each, that occur between the 8 processor core circuits PA-PH and the 8 memory core circuits MA-MH.

The third transaction shown in FIG. 13 is a write data transaction that accesses memory core circuit MY in a page hit bank state. The operations for the third transaction shown as $T_{W3}$, NOP, D3, and W3 in FIG. 13 correspond to the operations that are described above with respect to timing intervals 1301-1312, except that the pre-charge and activate functions are not performed. The notation NOP refers to no operation being performed in the designated time intervals.

The fourth transaction shown in FIG. 13 is a read data transaction that accesses memory core circuit MY in a page miss bank state. The operations for the fourth transaction shown as $T_{R4}$, PA4, PRE4, ACT4, R4, and Q4 in FIG. 13 correspond to the same operations that are described above with respect to timing intervals 1201-1212. The fourth transaction that begins with $T_{R4}$ may be started after the third transaction that begins with $T_{W3}$ in the next odd numbered time interval. The even and odd time intervals are defined by the cycles of clock signal CK. The fourth transaction is not delayed, because the third transaction is finished using the shared resources (i.e., the alignment circuitry, the bidirectional DQ links, and the column path in the memory) before the fourth transaction uses these resources.

The delay between the first read transaction beginning with $T_{R1}$ and the second write transaction beginning with $T_{W2}$ increases the latency of the second write transaction. However, the latency of a write transaction does not usually affect system performance, because the processor application places a write transaction into the write queue and continues executing. On the other hand, a processor application often needs read data requested by a read transaction in order to continue executing.

Figure 14:
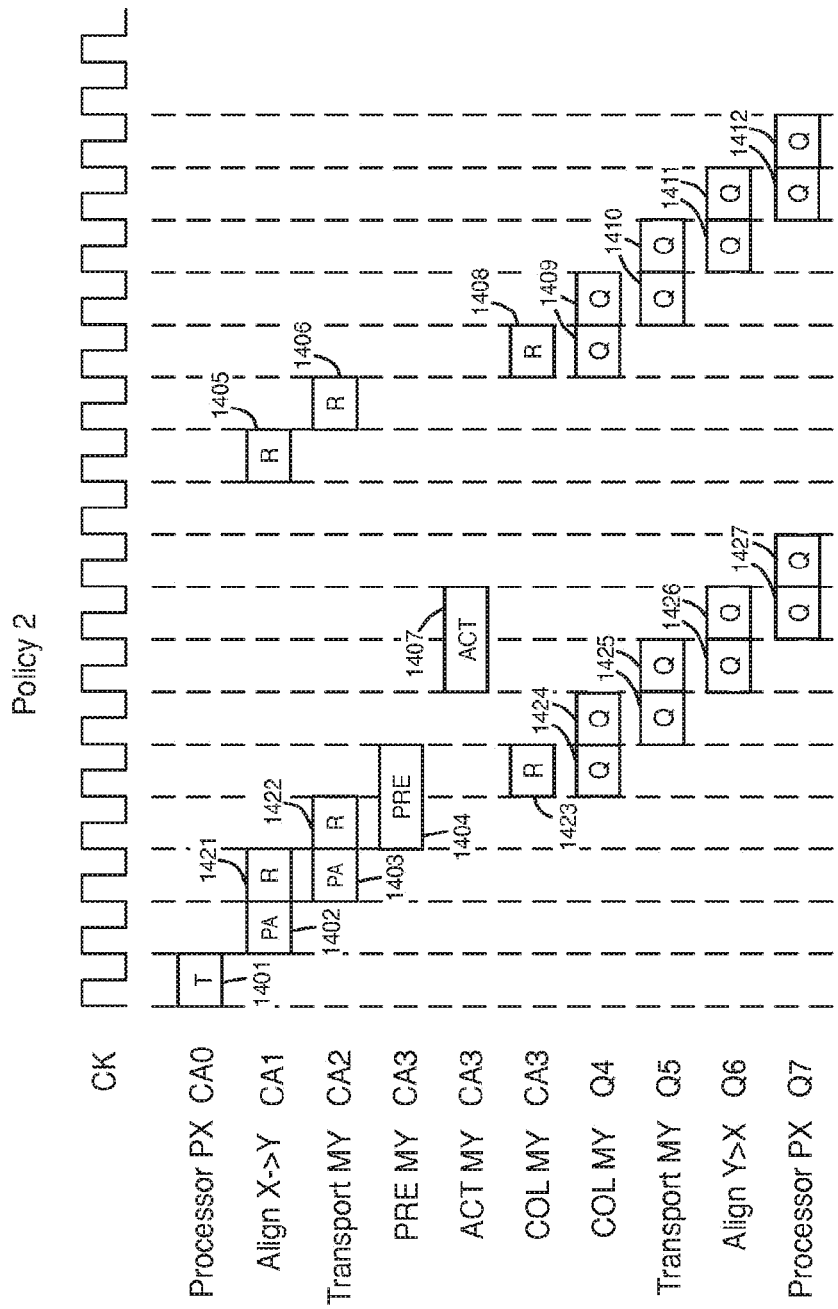
FIG. 14 is a timing diagram for an embodiment of a system that provides operations of a read data transaction between a processor core circuit and a memory core circuit having timing relationships that change based on the bank state of the memory core circuit.
Figure 15:
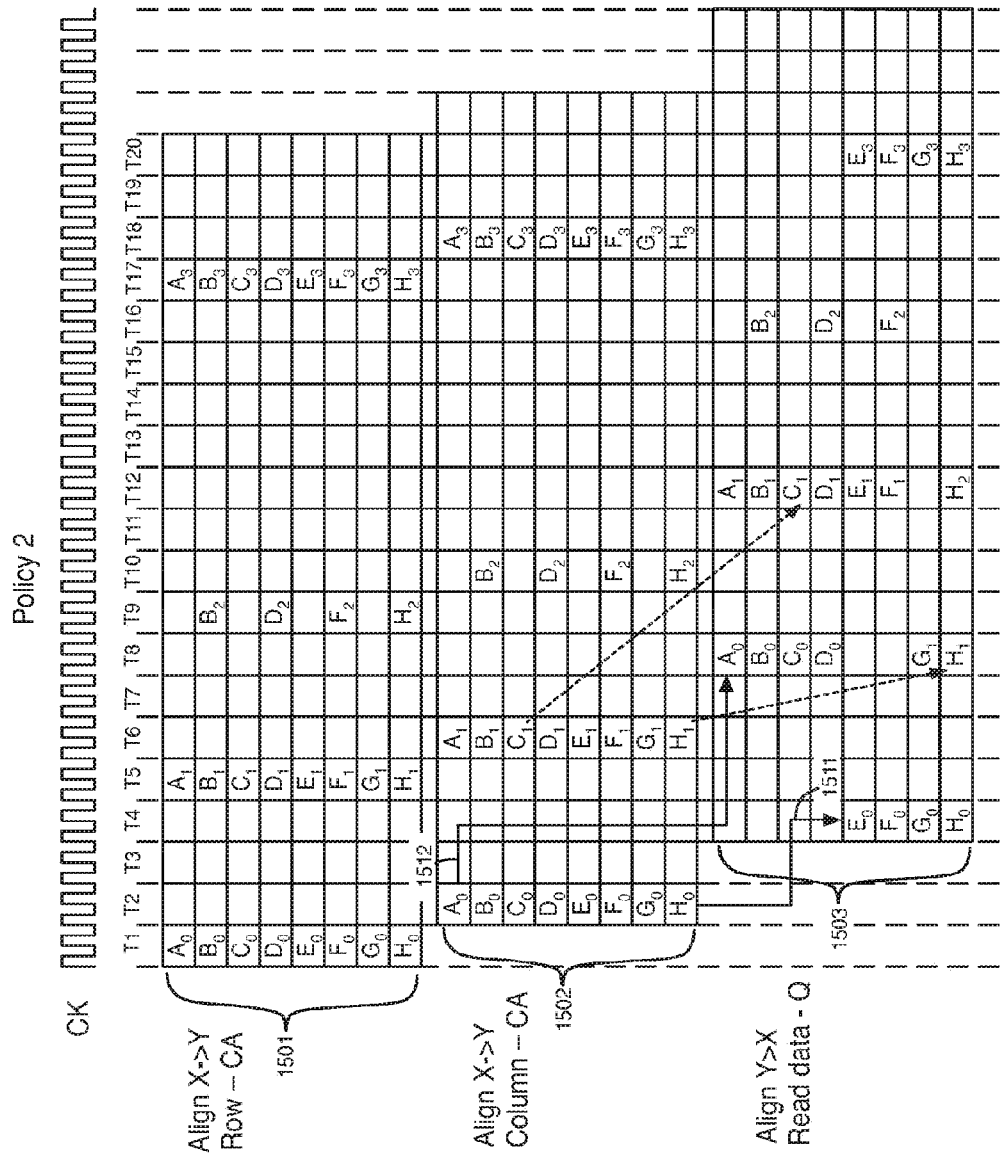
FIG. 15 is a timing diagram for an embodiment of a system that causes a new transaction to be performed during time intervals that are reserved for the page miss/empty bank states in a prior transaction, but are not used in the prior transaction.

FIG. 14 is a timing diagram for an embodiment of a system that provides operations of a read data transaction between a processor core circuit PX and a memory core circuit MY having timing relationships that change based on the bank state of the memory core circuit MY. The protocols used in the embodiments of FIGS. 14-15 are referred to herein as policy 2.

When the bank state of memory core circuit MY is a page miss or a page empty, the system performs the operations for the read data transaction in time intervals 1401-1412. When the bank state of memory core circuit MY is a page miss, the operations performed in time intervals 1401-1412 are the same operations described above with respect to time intervals 1201-1212 in FIG. 12B including the pre-charge and activate functions. When the bank state of memory core circuit MY is page empty, memory core circuit MY performs only the activate function in time interval 1407 and skips the pre-charge function in time interval 1404.

When the bank state of memory core circuit MY is a page hit, the system performs the operations for the read data transactions in time intervals 1401-1403 and 1421-1427. The command-address for the row of the read data transaction is transmitted through alignment circuitry 402 in time interval 1402 and through the connection sites to memory core circuit MY in time interval 1403. The command-address for the column of the read data transaction is transmitted through alignment circuitry 402 in time interval 1421 and through the connection sites to memory core circuit MY in time interval 1422. The operations for accessing the read data and transmitting the read data to PX that are performed in time intervals 1423-1427 are the same operations described above with respect to time intervals 1208-1212.

Many of the operations of the read data transaction occur earlier if the bank state of memory core circuit MY is a page hit than if the bank state of memory core circuit MY is a page miss or page empty. As shown in FIG. 14, the operations performed in time intervals 1421-1427 occur earlier than the corresponding operations performed in time intervals 1405-1406 and 1408-1412.

In the embodiment of FIG. 14, two time intervals 1405 and 1421 are reserved for the transmission of the command-address for the column through alignment circuitry 402. Two sets of time intervals 1411 and 1426 are reserved for the transmission of the read data through alignment circuitry 402 to processor core circuit PX. One set of the reserved time intervals 1405/1411 or 1421/1426 is selected based on the bank state of memory core circuit MY. Signals are transmitted through alignment circuitry 402 during the selected time intervals. In this embodiment, time intervals are reserved to configure alignment circuitry 402 according to alignment configurations that may not be used for the transmission of signals. As a result, the energy used to configure alignment circuitry 402 for all of the requested transactions between processor core circuit PX and memory core circuit MY may be larger in this embodiment relative to the embodiment of FIG. 12B.

One benefit provided by the embodiment of FIG. 14 is that the read data is returned earlier after a page hit. The reduction in read access time after a page hit comes at the expense of increased read bandwidth, because two read data time intervals are reserved, but only one of these read data time intervals is used for the transmission of read data. An operating mode implementing the embodiment of FIG. 14 can, for example, be invoked dynamically when the system is not being used at full bandwidth, but the system benefits from having some read transactions finish more quickly.

The unused time intervals that are reserved for the page miss/empty bank states in FIG. 14 may be used to perform another transaction in some embodiments. FIG. 15 is a timing diagram for an embodiment of a system that causes a new transaction to be performed during time intervals that are reserved for the page miss/empty bank states in a prior transaction, but are not used in the prior transaction. The embodiment of FIG. 15 is based on the timing relationships provided between the operations of the read data transactions that are shown in and described above with respect to FIG. 14.

In FIG. 15, $A_0$-$H_0$, $A_1$-$H_1$, $B_2/D_2/F_2/H_2$, and $A_3$-$H_3$ represent four different sets of read or write data transactions between processor core circuit PX and memory core circuit MY. The notations A-H indicate transactions initiated by processor core circuits PA-PH, respectively. Rows 1501 in FIG. 15 indicate the configuration of alignment circuitry 402 during the transmission of row command-addresses for the transactions from PA-PH to MA-MH. Rows 1502 indicate the configuration of alignment circuitry 402 during the transmission of column command-addresses for the transactions from PA-PH to MA-MH. Rows 1503 indicate the configuration of alignment circuitry 402 during the transmission of the read or write data between PA-PH and MA-MH. The timing of the transactions is measured with respect to the cycles of clock signal CK.

Row command-address for transactions $A_0$-$H_0$ are transmitted through alignment circuitry 402 in time interval T1, as shown in FIG. 15. Column command-addresses for transactions $A_0$-$H_0$ are transmitted through alignment circuitry 402 in time interval T2. In this example, transactions $A_0$-$D_0$ occur during page miss or page empty bank states of the memory circuits requested by these transactions, and transactions $E_0$-$H_0$ occur during page hit bank states of the memory circuits requested by these transactions. Because of these bank states of the memory circuits, the data for transactions $E_0$-$H_0$ are transmitted through alignment circuitry 402 in time interval T4 as shown by arrow 1511, and the data for transactions $A_0$-$D_0$ are transmitted through alignment circuitry 402 at a later time interval T8 as shown by arrow 1512.

Transactions $A_1$-$B_1$ and $E_1$-$F_1$ occur during page miss or page empty bank states of the memory circuits requested by these transactions. Transactions $C_1$-$D_1$ and $G_1$-$H_1$ occur during page hit bank states of the memory circuits requested by these transactions. The data for transactions $G_1$-$H_1$ is transmitted through alignment circuitry 402 in time interval T8, and the data for transactions $A_1$-$F_1$ is transmitted through alignment circuitry 402 at a later time interval T12, as shown by the dotted arrows. The data for transactions $C_1$-$D_1$ is delayed to time interval T12 because of the latency of the prior transactions $C_0$-$D_0$. Thus, the latency of prior transactions can cause the data of page hit memory accesses to be delayed and transmitted through alignment circuitry 402 at a later time.

Transactions $B_2$ and $F_2$ occur during page miss or page empty bank states of the requested memory circuits, and transactions $D_2$ and $H_2$ occur during page hit bank states of the requested memory circuits. The data for transaction $D_2$ is delayed to time interval T16 because of the latency of the prior transaction $D_1$.

FIG. 15 shows that the time interval T8 reserved for a set of page miss/page empty transactions $A_0$-$D_0$ can also be used to transmit data for a set of page hit transactions $G_1$-$H_1$ that are issued in a different time interval than transactions $A_0$-$D_0$. FIG. 15 also shows that the time interval T12 reserved for a set of page miss/page empty transactions $A_1$-$B_1$ and $E_1$-$F_1$ can also be used to transmit data for page hit transactions $C_1$-$D_1$ that are issued in the same time interval as transactions $A_1$-$B_1$ and $E_1$-$F_1$ but are delayed by prior transactions $C_0$-$D_0$.

Thus, the embodiment of FIGS. 14-15 can reduce some of the latency that is added by the multiple time intervals reserved for the same operations in the same transaction to account for the different access delays associated with different bank states of the memory circuits. The embodiment of FIGS. 14-15 allows some of the read or write data to be transmitted through alignment circuitry 402 sooner during light and moderate loads of memory access transactions.

Transactions $A_3$-$D_3$ in FIG. 15 occur during page miss or page empty bank states of the requested memory core circuits. Transactions $E_3$-$H_3$ occur during page hit bank states of the requested memory core circuits. The data for transactions $E_3$-$H_3$ is transmitted through alignment circuitry 402 sooner at time interval T20 than the data for transactions $A_3$-$D_3$.

The system of FIGS. 14 and 15 supports two pending column accesses per memory port. This feature can be supported within a single memory component. Alternatively, two memory components may be used to support this feature.

Figure 16:
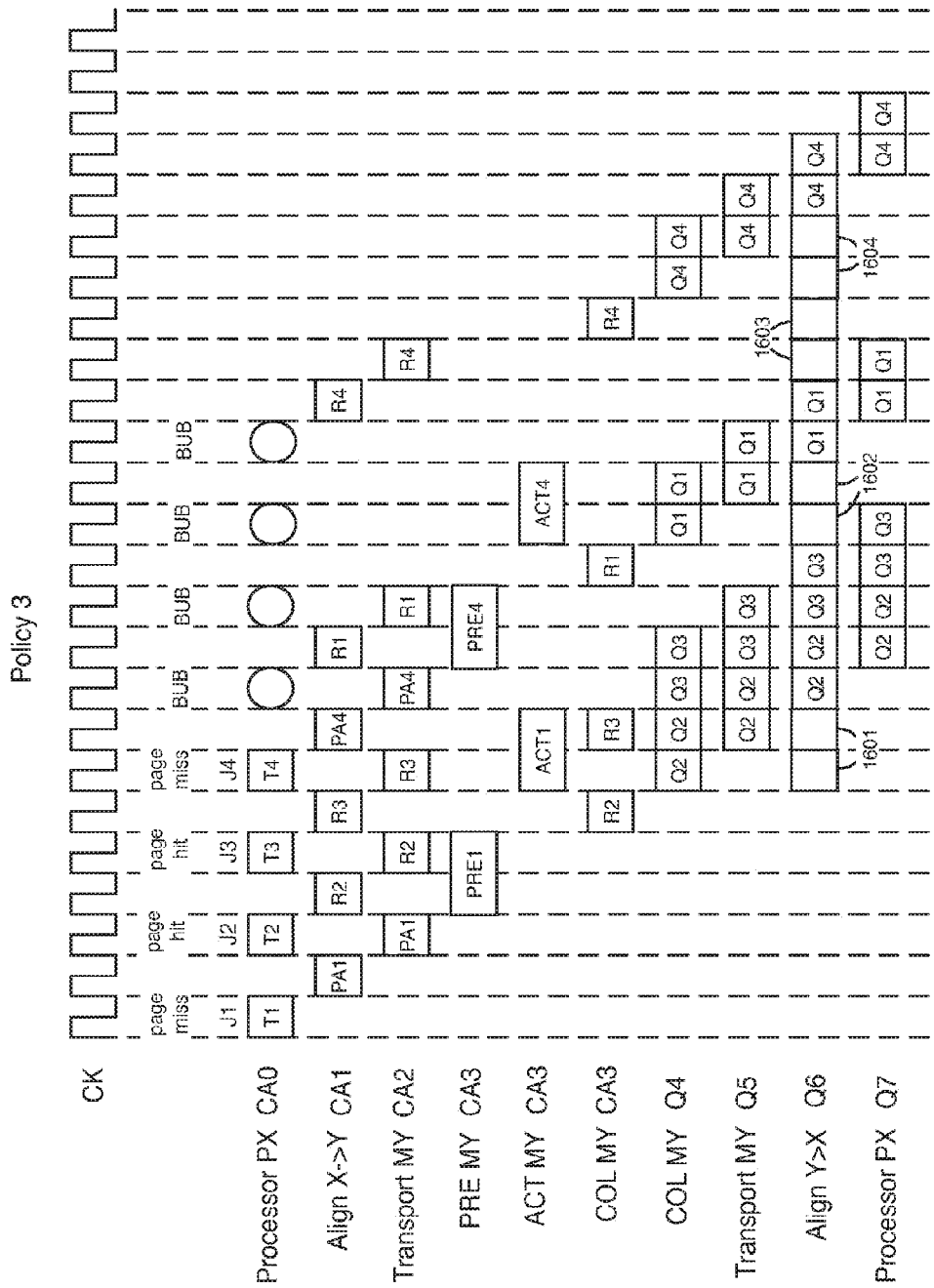
FIG. 16 is a timing diagram for an embodiment of a system that provides interleaved operations of read data transactions between processor and memory core circuits.

FIG. 16 is a timing diagram for an embodiment of a system that provides interleaved operations of read data transactions between processor and memory core circuits. In this embodiment, the operations of the read data transactions may become interleaved based on different bank states of the memory core circuits. Each of the 4 transactions beginning with operations T1-T4 in FIG. 16 are read data transactions. The protocols used in the embodiment of FIG. 16 are referred to herein as policy 3.

In both of policies 2 and 3, two sets of timing intervals are reserved for the transmission of data through the alignment circuitry in each read transaction, but the data is transmitted through the alignment circuitry during only one set of these timing intervals. The timing intervals that are selected for the transmission of data through the alignment circuitry depend on the bank state of the accessed memory.

FIG. 16 shows the timing of a pipelined sequence of read transactions, and FIG. 14 shows the timing of only one read transaction. Policy 2 is an extension of policy 3. In policy 3, the system increases bandwidth by recovering some of the unused timing intervals to transmit the read data. Policy 1 is the most efficient policy for write transactions, because latency is not important for write transactions. Latency reduction is one of the benefits of policies 2 and 3. Policy 1 reduces power relative to policy 4, which is described below with respect to FIG. 17. In some embodiments, the policy used for read transactions is different than the policy used for write transactions.

In the embodiment of FIG. 16, the system reserves time intervals for the transmission of addresses and data through alignment circuitry 402 based on the page miss and page hit bank states for each transaction between the processor and memory core circuits, as described above with respect to FIG. 14. In the embodiment of FIG. 16, the pre-charge and activate functions are suppressed in response to page hit bank states, and the read data is returned to the processor core circuits in earlier time intervals, as discussed above with respect to FIGS. 14-15. As a result, the embodiment of FIG. 16 also reduces the power consumption of the system.

In contrast to the system of FIGS. 14-15, the embodiment of FIG. 16 does not attempt to perform new transactions in the unused time intervals that are reserved for page miss/empty bank states in prior transactions. Instead, half of the transaction slots in FIG. 16 are reserved for page misses as shown by the BUB designations. Thus, the embodiment of FIG. 16 does not provide the reduction in latency that the embodiment of FIGS. 14-15 provides.

In the example of FIG. 16, the operations T1, PA1, R1, PRE1, ACT1, and Q1 of the first page miss read data transaction J1 are interleaved in time with the operations T2, R2, and Q2 of the second page hit read data transaction J2 and the operations T3, R3, and Q3 of the third page hit read data transaction J3. The fourth page miss read data transaction J4 includes operations T4, PA4, R4, PRE4, ACT4, and Q4 in FIG. 16.

Reserved time intervals 1601-1604 are unused in this example. Timing intervals 1601 would have been used for the transmission of data from memory core circuit MY through alignment circuitry 402 to processor core circuit PX if transaction J1 occurred in a page hit bank state. Timing intervals 1602 would have been used for the transmission of data from memory core circuit MY through alignment circuitry 402 to processor core circuit PX if transaction J4 occurred in a page hit bank state.

Timing intervals 1603 would have been used for the transmission of data from memory core circuit MY through alignment circuit 402 to processor core circuit PX if transaction J2 occurred in a page miss bank state. Timing intervals 1604 would have been used for the transmission of data from memory core circuit MY through alignment circuit 402 to processor core circuit PX if transaction J3 occurred in a page miss bank state.

Figure 17:
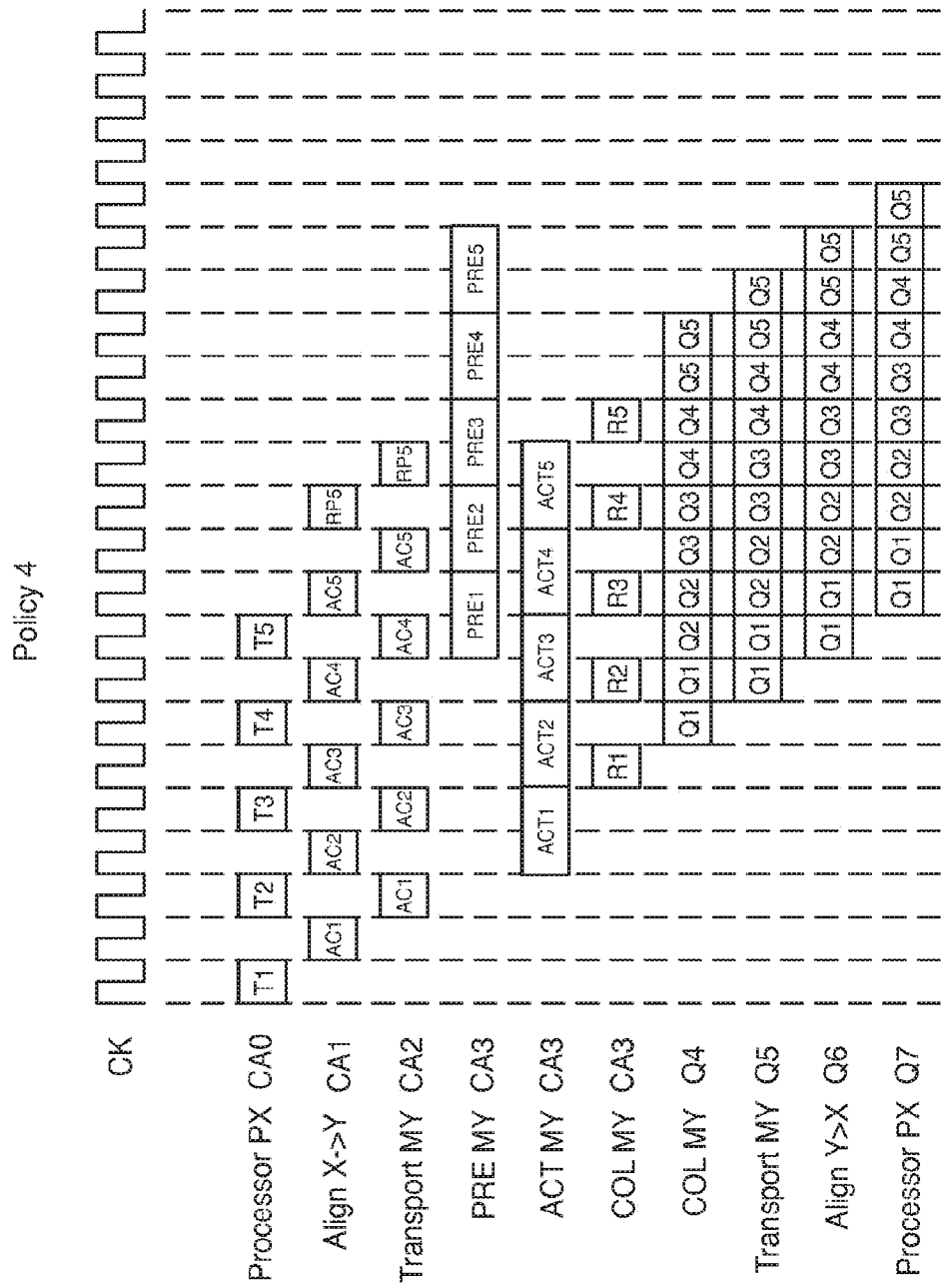
FIG. 17 is a timing diagram for an embodiment of a system that performs the operations of the read data transactions between the processor and memory core circuits as if all of the memory core circuits are always in page empty bank states.

FIG. 17 is a timing diagram for an embodiment of a system that performs the operations of the read data transactions between the processor and memory core circuits as if all of the memory core circuits were always in page empty bank states. The protocols used in the embodiment of FIG. 17 are referred to herein as policy 4. As shown in FIG. 17, the pre-charge operations (PRE1, PRE2, PRE3, etc.) are performed in each transaction after the data has been accessed from the memory circuits, regardless of the bank states of the memory core circuits. The designations AC1, AC2, AC3, AC4, and AC5 refer to the transmission of the row command-addresses through the alignment circuitry 402 and the connection sites to the memory core circuits for the 5 read data transactions shown in FIG. 17.

A system that uses the embodiment of FIG. 17 does not need state tracking circuits in IC die 300 that keep track of the bank states of the memory core circuits MA-MH, because the system functions as if the memory core circuits are always in page empty bank states. Therefore, the embodiment of FIG. 17 reduces the cost of the system and provides a larger system bandwidth, but does not provide the latency and power benefits that are provided by the embodiment of FIGS. 14-15. The embodiment of FIG. 17 uses a timer (e.g., timer circuit 2112 shown in FIG. 21 and described below) for each memory bank to ensure that two successive transactions that access one memory bank do not occur too close together in time.

Figure 18:
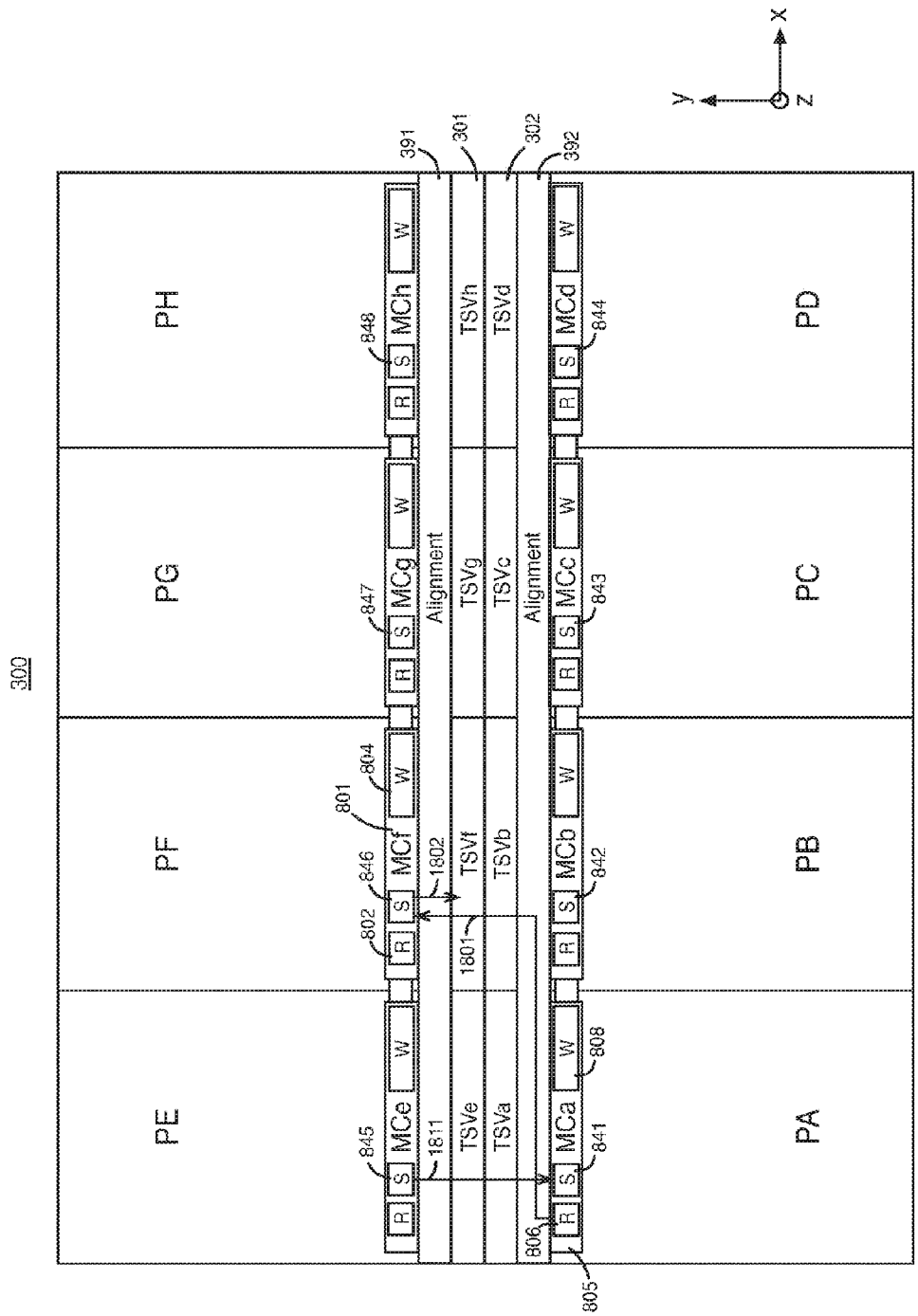
FIG. 18 illustrates a system that stores bank state information for the memory core circuits in state tracking circuits within local memory controller circuits.

FIG. 18 illustrates an embodiment of a system that stores bank state information for the memory core circuits MA-MH in local state tracking circuits within the processor core circuits PA-PH. Each of the memory controller circuits MCa-MCh in processor core circuits PA-PH includes a state tracking circuit (S). The state tracking circuits 841-848 in memory controller circuits MCa-MCh store bank state information for the local memory core circuits MA-MH, respectively. For example, the state tracking circuit 841 in memory controller circuit MCa 805 stores bank state information for memory core circuit MA, and the state tracking circuit 846 in memory controller circuit MCf 801 stores bank state information for memory core circuit MF.

In the system of FIG. 18, the bank state information of the banks in a memory core circuit is maintained only within the state tracking circuit that is adjacent to the memory interface of that memory core circuit. Copies of the memory bank states for all 8 memory core circuits do not have to be replicated in the memory controller circuit of each processor core circuit. The embodiment of FIG. 18 greatly reduces the memory space used in IC die 300 to store the memory bank state information of the memory core circuits MA-MH.

The memory controller circuits MCa-MCh can use the bank state information stored in state tracking circuits 841-848 to modify the data accesses to memory core circuits MA-MH, respectively. For example, memory controller circuits MCa-MCh can use the bank state information stored in state tracking circuits 841-848 to suppress the pre-charge and activate operations in memory core circuits MA-MH, respectively, during page hit transactions, as described above with respect to FIGS. 14-15. The memory controller circuits MCa-MCh can also use the bank state information stored in state tracking circuits 841-848 to cause memory core circuits MA-MH, respectively, to perform pre-charge and activate operations during page miss transactions, as described above with respect to FIGS. 14-15.

The state tracking circuits 841-848 also indicate when an access cannot be started, because a memory bank is still busy processing a previous access. If the memory bank is busy processing a previous access, the memory controller circuit that initiated the access is provided with an indication that the access cannot be started. The memory controller circuit then resubmits the access in the next available alignment timing interval.

An example of how a memory controller circuit in one of the processor core circuits can use the bank state information stored in one of the state tracking circuits 841-848 to perform or suppress the pre-charge and activate operations is now described. In this example, memory controller circuit MCa 805 initially stores a read data transaction in a queue entry circuit (not shown) in read queue storage circuit 806, and the transaction status of that queue entry circuit changes from full to pending. The read data transaction includes a command to access data in memory core circuit MF. Memory core circuit MF is located in one of the memory IC dies that is stacked on IC die 300. When the time interval selected by the central arbitration circuit 832 to execute the read data transaction occurs, alignment circuitry 402 in alignment stripes 391-392 is in an alignment configuration that connects processor core circuit PA to memory interface TSVf.

The alignment circuitry in regions 391-392 can be configured to connect any two of the processor core circuits PA-PH. The alignment circuitry in region 391 is connected to the alignment circuitry in region 392 through conductors that are located between groups of the connections sites in regions 301-302.

With this alignment configuration of alignment circuitry 402, memory controller circuit 805 in processor core circuit PA transmits the command-address for the read data transaction from read queue storage circuit 806 to state tracking circuit 846 in memory controller circuit MCf 801 through the alignment circuitry 402 in alignment stripes 391 and 392, as shown by arrow 1801. State tracking circuit 846 then checks the bank state of the requested bank of memory core circuit MF. State tracking circuit 846 stores the current bank state information for each of the memory banks in memory core circuit MF.

State tracking circuit 846 in memory controller circuit MCf 801 is adjacent to memory interface TSVf. Memory interface TSVf couples to memory core circuit MF. State tracking circuit 846 tracks the state of the memory banks in memory core circuit MF.

The command-address typically includes an operational code (OP code) that is associated with the transaction, as described above with reference to FIG. 12A. State tracking circuit 846 adjusts the operational code based on the bank state information stored in circuit 846. The operational code determines whether memory core circuit MF will implement or suppress one or both of the pre-charge and activate functions. For example, if the bank state information for the requested bank indicates a page hit, state tracking circuit 846 modifies the operational code to cause memory core circuit MF to suppress the pre-charge and activate functions, according to policies 1 and 2. The row command-address instructions include pre-charge and activate, activate, and no-operation (NOP) instructions that allow all three memory bank states to be supported.

When the requested bank of memory core circuit MF is not busy executing another transaction, the command-address for the read data transaction is transmitted from state tracking circuit 846 to memory core circuit MF through connection sites in connection stripe TSVf in IC die 300 and TSVs and connection sites in the corresponding connection stripe of the memory IC die, as shown by arrow 1802. The memory core circuit MF then performs or skips the pre-charge and activate functions based on the operational code. The transaction status in the queue entry of read queue circuit 806 is then changed to execute.

When the requested bank of memory core circuit MF is busy executing another transaction, the transaction status in the queue entry of read queue circuit 806 is changed back to full. The command-address for the read data transaction is then submitted in a later time interval when the requested bank of memory core circuit MF is not busy.

Figure 19:
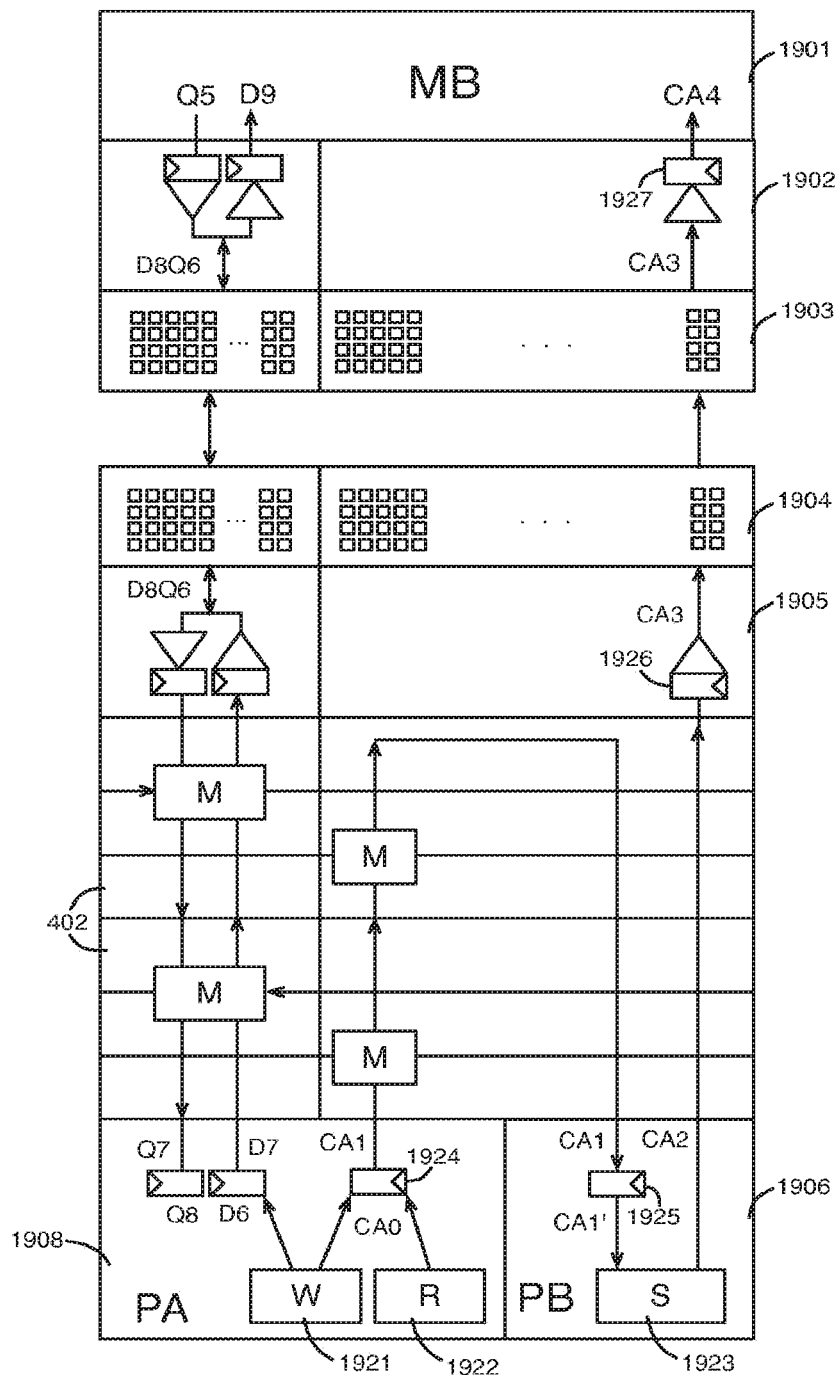
FIG. 19 illustrates an example of a read or write data transaction between a processor core circuit and a memory core circuit that uses the bank state information stored in a state tracking circuit.

FIG. 19 illustrates an example of a read or write data transaction between a processor core circuit PA and a memory core circuit MB that uses the bank state information stored in a state tracking circuit located in processor core circuit PB. The read or write data transaction described with respect to FIG. 19 is a request by processor core circuit PA to read data from or write data to memory core circuit MB. FIG. 19 illustrates portions of processor core circuits PA-PB and memory core circuit MB.

In the case of a write data transaction, processor core circuit PA 1908 transmits the command-address (CA0) for the transaction from write queue circuit 1921 to register 1924. In the case of a read data transaction, processor core circuit PA 1908 transmits the command-address (CA0) for the transaction from read queue circuit 1922 to register 1924.

The command-address (CA1) is transmitted from register 1924 through alignment circuitry 402 to register 1925 in processor core circuit PB 1906. The command-address (CA1') is then transmitted from register 1925 to state tracking circuit 1923 in processor core circuit PB 1906. State tracking circuit 1923 causes the memory core circuit MB 1901 to execute or suppress the pre-charge and activate functions in the requested bank in MB based on the bank state of that bank by setting the operational code that is part of the command-address.

State tracking circuit 1923 transmits the command-address (CA3) through alignment circuitry 402 to register 1926 in transmit/receive stripe 1905. The command-address (CA3) is then transmitted through the connection sites in connection stripe 1904 of the processor IC die and the TSVs and connection sites in connection stripe 1903 of the memory IC die to register 1927 in transmit/receive stripe 1902 in the memory IC die. Next, the command-address (CA4) is transmitted from register 1927 to memory core circuit MB 1901.

Figure 20:
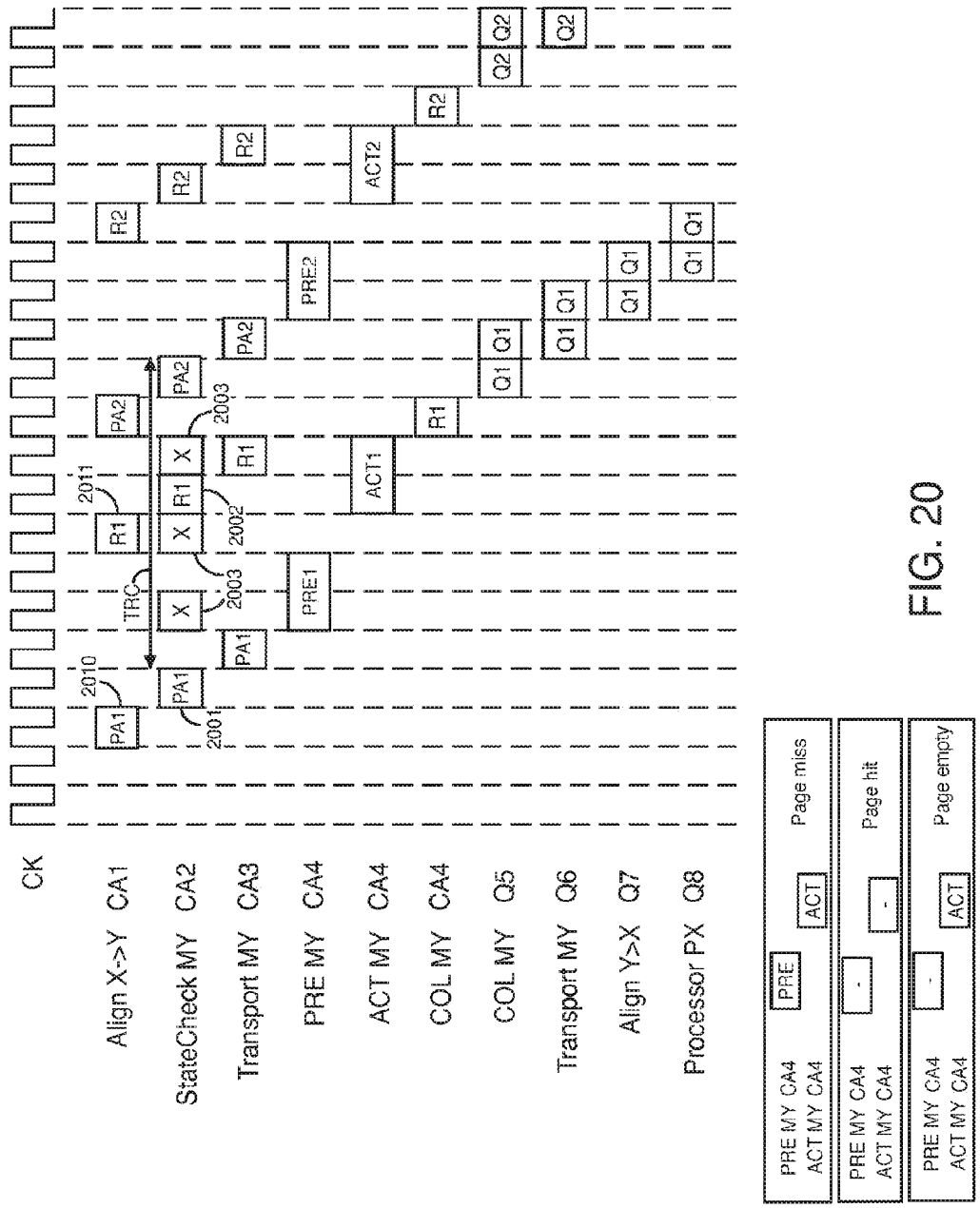
FIG. 20 is a timing diagram that illustrates the steps in read data transactions between a processor core circuit and a memory core circuit that include the step of checking the bank state information stored in a state tracking circuit.

FIG. 20 is a timing diagram that illustrates the operation in read data transactions between a processor core circuit PX and a memory core circuit MY. Processor core circuit PX represents any one of the processor core circuits PA-PH. MY memory core circuit represents any one of the memory core circuits MA-MH. The operations in the read data transactions include checking the bank state information stored in a state tracking circuit.

The operations of a first page miss read data transaction are identified as PA1, PRE1, ACT1, R1, and Q1 in FIG. 20. The operations of a second page miss read data transaction are identified as PA2, PRE2, ACT2, R2, and Q2 in FIG. 20. The second read data transaction accesses the same memory IC die and the same bank of memory core circuit MY as the first read data transaction, but the second read data transaction accesses a different row of memory core circuit MY.

PA1 in interval 2010 is the row command-address information for the first transaction. R1 in interval 2011 is the column command-address information for the first transaction. Thus, the PA1 command-address and the R1 command-address are part of the same transaction. The PA1 and R1 command-addresses occupy alternate timing slots (odd-even) that share the command-address portion of the alignment circuitry. The PA1 and R1 command-addresses are independently timed so that they are presented to the accessed memory core circuit at an optimal time.

After going through several pipeline stages of delay, the command-address information causes the pre-charge PRE1 and activate ACT1 operations to be performed in the memory core circuit. The command-address information then causes the column read operations to be performed in the memory core circuit, to produce the read data Q1.

In time interval 2001, the state tracking circuit in processor core circuit PY processes the row command-address for the read data transaction. The state tracking circuit for memory core circuit MY (located in the memory controller circuit for processor core circuit PY) may modify the operational code of the command-address to cause memory core circuit MY to suppress or to implement the pre-charge and activate functions, as described above. In time interval 2002, the state tracking circuit in processor core circuit PY processes the column command-address. The state tracking circuit rejects page miss transactions in time intervals 2003, because the first page miss read data transaction is still pending. Time period TRC shown in FIG. 20 indicates the time that memory core circuit MY takes to perform the pre-charge and activate functions and to access the requested read data in response to receiving a page miss read data transaction. If the second read data transaction shown in FIG. 20 is a page hit transaction, it can be started immediately in any of the timing intervals 2003.

Figure 21:
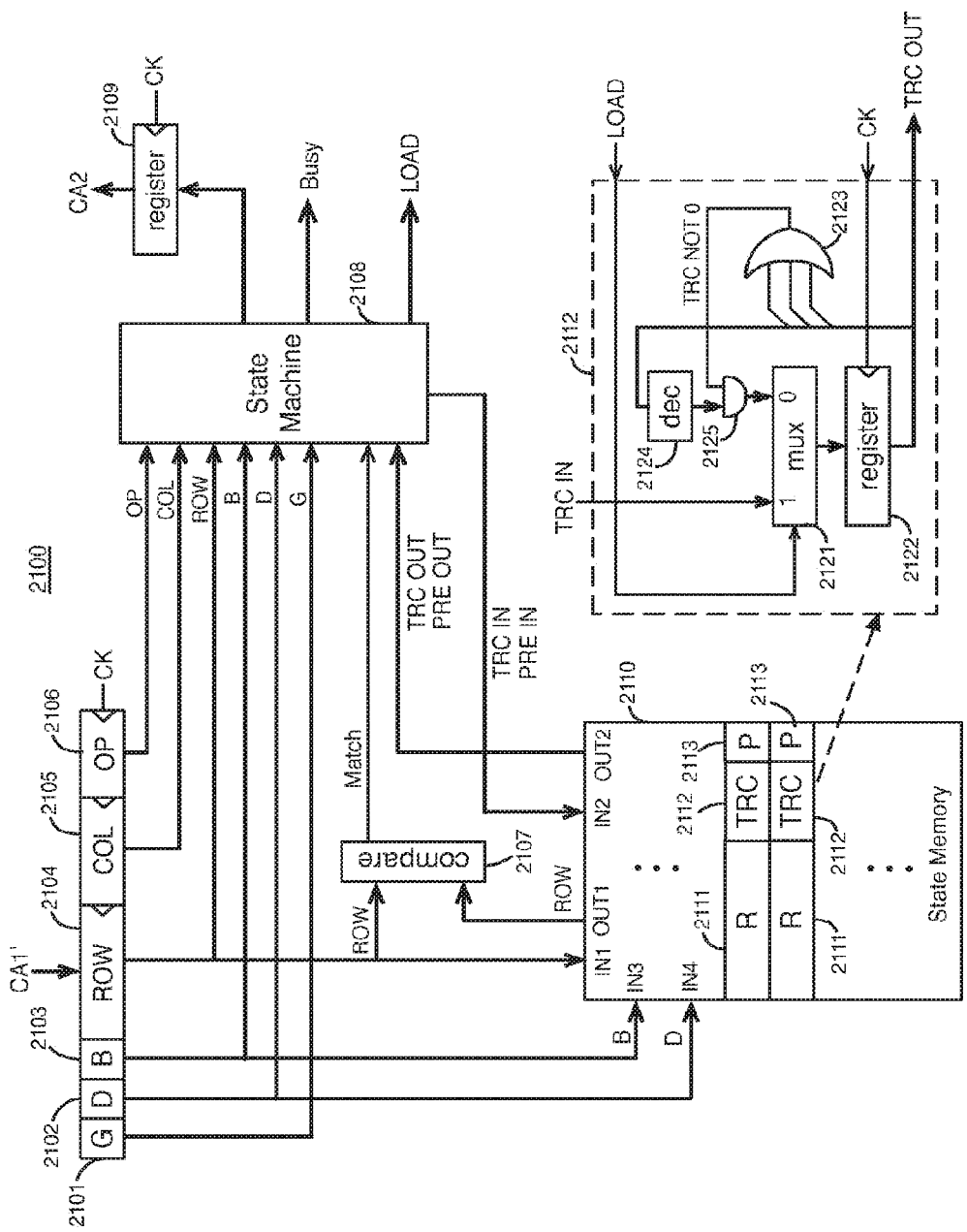
FIG. 21 is a detailed diagram of a state tracking circuit that keeps track of the bank states of a local memory core circuit.

FIG. 21 illustrates a detailed diagram of an embodiment of a state tracking circuit 2100 that can keep track of the bank states of a local memory core circuit. State tracking circuit 2100 is an example of each of the state tracking circuits 841-848 and 1923 shown in FIGS. 8A, 18, and 19. State tracking circuit 2100 includes registers 2101-2106, comparator circuit 2107, state machine logic circuitry 2108, register 2109, and state memory circuit 2110.

The command-address (CA1') is transmitted from the requesting processor core circuit to state tracking circuit 2100, as described above with respect to FIG. 19. The command-address (CA1') is stored in registers 2101-2106 in circuit 2100. Specifically, the device portion (D) of the command-address is stored in register 2102. The device portion of the command-address indicates which of the stacked memory IC dies will be accessed by the transaction. The group portion (G) of the command-address is stored in register 2101. The group portion of the command-address indicates which of the 8 memory core circuits MA-MH in the selected device (D) will be accessed by the transaction. In the embodiment of FIG. 21, state tracking circuit 2100 always accesses the same group (G). For example, the state tracking circuit 2100 in processor core circuit PA always accesses memory core circuit MA in the selected memory IC die.

The bank portion (B) of the command-address is stored in register 2103. The bank portion of the command-address indicates which bank of the memory core circuit will be accessed by the transaction. Each memory core circuit MA-MH is divided into multiple banks of memory circuits. The row portion (ROW) of the command-address is stored in register 2104, and the column portion (COL) of the command-address is stored in register 2105. The row portion of the command-address indicates which row of the bank will be accessed by the transaction, and the column portion of the command-address indicates which column of the bank will be accessed by the transaction. The operational code (OP) portion of the command-address is stored in register 2106.

Typically, each of the group (G), device (D), bank (B), row (ROW), column (COL), and operational code (OP) portions of the command-address has multiple bits. The group (G), device (D), bank (B), row (ROW), column (COL), and operational code (OP) portions of the command-address are transmitted from registers 2101-2106 to state machine logic circuitry 2108. Registers 2101-2106 and 2109 are clocked by periodic clock signal CK.

State memory circuit 2110 includes a storage circuit 2111, a timing circuit 2112, and a storage circuit 2113 for each bank in the group indicated by group portion G in each of the stacked memory IC dies. If DT is the total number of stacked memory IC dies, and BT is the total number of banks in group G (i.e., in the core circuit) within each of the stacked memory IC dies, then circuit 2110 has a DT×BT number of storage circuits 2111, a DT×BT number of timing circuits 2112, and a DT×BT number of storage circuits 2113.

The row portion (ROW) of the command-address for the current transaction is transmitted from register 2104 to the IN1 terminal of state memory circuit 2110. The bank portion (B) of the command-address for the current transaction is transmitted from register 2103 to the IN3 terminal of circuit 2110. The device (D) portion of the command-address for the current transaction is transmitted from register 2102 to the IN4 terminal of circuit 2110. Each row in state memory circuit 2110 that includes one circuit 2111, one circuit 2112, and one circuit 2113 is indexed based on the number in the device portion (D) and the number in the bank portion (B). State memory circuit 2110 uses the device (D) and bank (B) portions of the command-address stored in registers 2102-2103 to select one storage circuit 2111, one timing circuit 2112, and one storage circuit 2113 that are used for the current transaction.

Storage circuit 2111 stores the row (ROW) portion of the command-address for the previous transaction that accessed the requested bank B in the requested device D. The row portion of the command-address for the previous transaction stored in selected storage circuit 2111 is transmitted to comparator circuit 2107 from the OUT1 terminal. The row portion of the command-address for the current transaction is transmitted from register 2104 to comparator circuit 2107.

Comparator circuit 2107 compares the row portions of the command-addresses for the current and previous transactions to generate a Match output signal. The Match output signal indicates whether the row portion of the command-address for the current transaction is the same or different than the row portion of the command-address for the previous transaction. The Match signal is transmitted to the state machine logic circuitry 2108.

When the Match signal indicates that the row portions of the command-addresses for the current and previous transactions are the same, state machine logic circuitry 2108 sets the operational code (OP) portion of the command-address to a value that will cause the memory core circuit to suppress the pre-charge and activate functions in the requested bank. When the Match signal indicates that the row portion of the command-address for the current transaction is different than the row portion of the command-address for the previous transaction, state machine logic circuitry 2108 sets the operational code portion of the command-address to a value that will cause the memory core circuit to implement the pre-charge and activate functions in the requested bank.

If the system implements the embodiment described above with respect to FIG. 17, the storage circuit 2113 for the requested bank B in the requested device D stores a bit P that indicates whether the previous transaction to access bank B in device D performed a pre-charge operation of bank B. The bit P stored in circuit 2113 is transmitted to state machine logic circuitry 2108 as the PRE OUT signal. State machine logic circuitry 2108 sets the operational code (OP) based on the logic state of the PRE OUT signal. Only if a pre-charge was not performed during the previous access of bank B in device D will state machine logic circuitry 2108 set the operational code portion of the command-address to a state that causes a pre-charge of bank B. State machine logic circuitry 2108 also generates a PRE IN signal based on the PRE OUT signal. The PRE IN signal is stored in circuit 2113 for bank B and device D.

State machine logic circuitry 2108 additionally generates a LOAD signal and timing signal TRC IN based on the Match signal and the TRC OUT signal. TRC IN and TRC OUT are multi-bit values. The TRC OUT signal is generated by timing circuit 2112. When the Match signal indicates that the row portion of the command-address for the current transaction is different than the row portion of the command-address for the previous transaction, state machine logic circuitry 2108 generates a logic high pulse in the LOAD signal and sets the TRC IN signal to a predefined value. The predefined value of the TRC IN signal depends on whether the system is being implemented based on the embodiment of FIG. 12B, the embodiment of FIG. 14, or the embodiment of FIG. 16.

State memory circuit 2110 then stores the row portion (ROW) of the command-address for the current transaction in the storage circuit 2111 that is indicated by the device (D) and bank (B) portions of the command-address stored in registers 2102-2103. This process overwrites the row portion of the command-address for the previous transaction that was stored in the same storage circuit 2111.

Timing circuit 2112 is a delay circuit generating a delay in the TRC OUT signals that is based on the time TRC needed for memory core circuit G in device D to perform the pre-charge, activate, and data access (or storage) functions in bank B for the transaction. Timing circuit 2112 in state memory circuit 2110 includes multiplexer circuit 2121, register circuit 2122, Boolean OR gate 2123, decrementing circuit 2124, and Boolean AND gate 2125. Timing circuit 2112 keeps track of the time TRC that the memory core circuit in group G takes to perform the pre-charge and activate functions and to access (or store) the requested data in response to receiving a page miss transaction.

The LOAD signal is transmitted to the select input of multiplexer 2121 in timing circuit 2112. Multiplexer 2121 transmits the TRC IN signal to register circuit 2122 when the LOAD signal is in a logic high state. Register circuit 2122 stores the TRC IN signal and causes the TRC OUT signal to equal the TRC IN signal in response to clock signal CK. The TRC OUT signal is transmitted to a multi-bit input of decrementing circuit 2124 and to state machine logic circuitry 2108. Decrementing circuit 2124 decreases the value of the TRC OUT signal by one in each cycle of clock signal CK to generate a decremented output signal that is transmitted to a multi-bit input of AND gate 2125.

OR gate 2123 performs an OR Boolean function on the bits of the TRC OUT signal (e.g., the 3 bits of the TRC OUT signal shown in FIG. 21) to generate a TRC NOT 0 signal that is transmitted to a single-bit input of AND gate 2125. AND gate 2125 subjects its input signals to a Boolean AND function. When the TRC NOT 0 signal is equal to a logical high state, the output signal of AND gate 2125 has a value equal to the current value of the decremented signal output by decrementing circuit 2124. When the TRC NOT 0 signal is equal to a logical low state, the output signal of AND gate 2125 has a value of zero.

Multiplexer 2121 transmits the output signal of AND gate 2125 to register circuit 2122 after the LOAD signal transitions to a logical low state. Register circuit 2122 then stores the decremented output signal from AND gate 2125 and causes the TRC OUT signal to equal the decremented output signal in response to clock signal CK. Decrementing circuit 2124 continues to decrement the value of the TRC OUT signal until all bits of the TRC OUT signal equal zero.

When all bits of the TRC OUT signal equal zero, the time TRC has elapsed for memory core circuit G in device D to perform the pre-charge, activate, and data access (or storage) functions in bank B for the transaction. In response to all bits of the TRC OUT signal being zero, state machine logic circuitry 2108 transmits the G/D/B/ROW/COL/OP command-address signals to register 2109. If state machine logic circuitry 2108 has modified the operational code (OP), then the modified operational code is transmitted to and stored in register 2109. The G/D/B/ROW/COL/OP command-address signals (CA2) are then transmitted from register 2109 to the memory core circuit G through the connection sites in response to clock signal CK. After receiving the G/D/B/ROW/COL/OP command-address signals from register 2109, the memory core circuit begins to implement the transaction requested by the received command-address.

The relative delay between the transmission of the row command-address and the column command-address for a transaction can be created at different times. In a first embodiment, the relative delay can be inserted at the memory controller circuit before the command-address information is transferred through the alignment circuitry, as shown, for example, in FIG. 9K. In a second embodiment, the row and column command-address information can be transferred in the same time interval through the alignment circuitry to be received by registers 2101-2106, and the relative delay can be inserted by state machine logic circuitry 2108. This second embodiment allows the row command-address and column command-address to be transferred simultaneously through the alignment circuitry, using delay registers in state machine logic circuitry 2108. In a third embodiment, the row and column command-address information can be transferred in successive odd-even time intervals, in accordance with the format shown in FIG. 12A.

State tracking circuit 2100 also generates a Busy signal for each bank based on the states of the TRC OUT signal for that bank. Each Busy signal is de-asserted when a transaction accessing the memory bank has been completed.

Each of the memory controller circuits MCa-MCh optimizes the order of the read and write data transactions stored in its read and write queue circuits based on the bank state information stored in its state tracking circuit for its local memory core circuit MA-MH, respectively. Each of the memory controller circuits MCa-MCh can also optimize the order of the read and write data transactions stored in its read and write queue circuits based on the bank state information stored in a state tracking circuit in another memory controller circuit that can be accessed using only the y-direction conductors in the alignment circuitry. For example, memory controller circuit MCa in processor core circuit PA optimizes the order of the read and write data transactions stored in its read and write queue circuits based on the bank state information for memory core circuit MA stored in the state tracking circuit in memory controller MCa and based on the bank state information for memory core circuit ME stored in the state tracking circuit in memory controller MCe. If the memory controller circuits MCa-MCh optimize the order of the read and write data transactions stored in their read and write queue circuits based on the bank state information stored in state tracking circuits in other memory controller circuits, x-direction conductors in the alignment circuitry are needed for these accesses, which require significantly more die area than the y-direction conductors.

Figure 22:
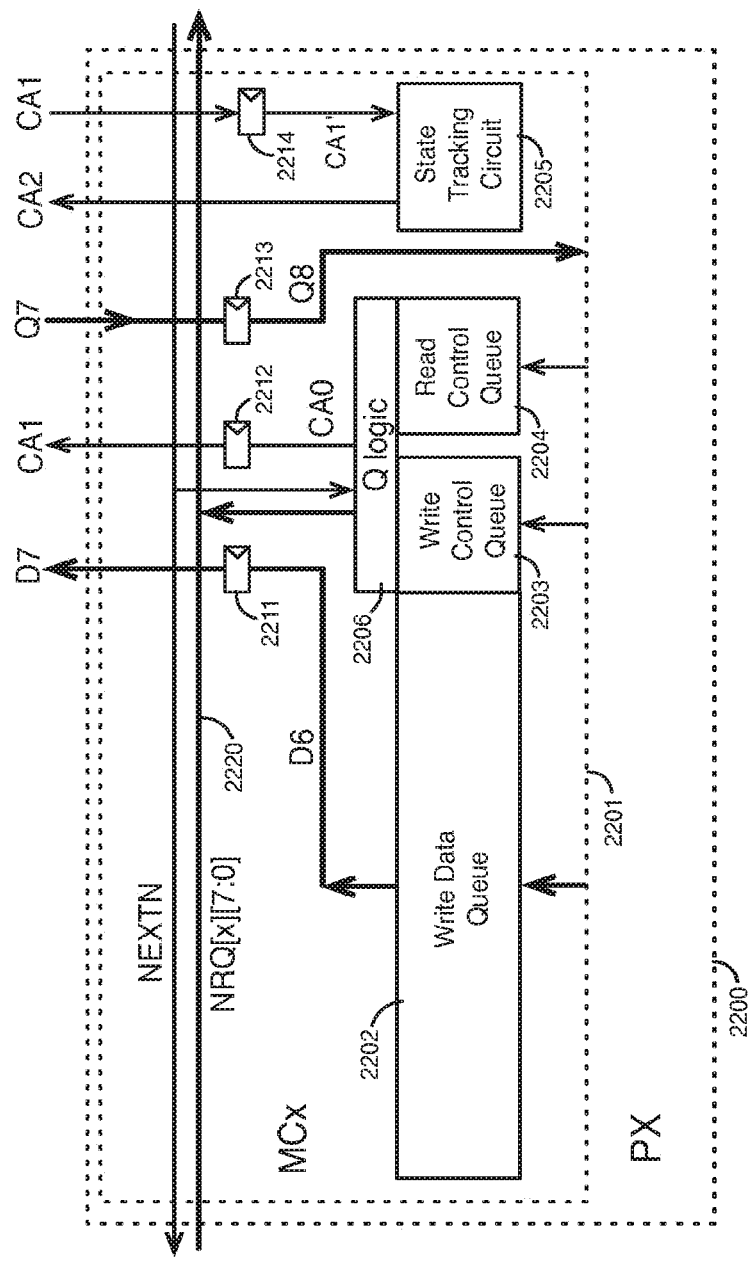
FIG. 22 illustrates a more detailed example of one of the memory controller circuits in a processor core circuit.

FIG. 22 illustrates a more detailed example of one of the memory controller circuits MCx 2201 in a processor core circuit PX 2200. The architecture of memory controller circuit MCx 2201 shown in FIG. 22 is representative of each of the memory controller circuits MCa-MCh shown and described herein.

Memory controller circuit 2201 has a write data queue circuit 2202, a write control queue circuit 2203, a read control queue circuit 2204, a state tracking circuit 2205, a Q logic circuit 2206, and registers 2211-2214. During read data transactions, command-addresses are transmitted from read control queue circuit 2204 to Q logic circuit 2206, then to registers 2212, and then to the state tracking circuit that is local to the requested memory core circuit. Read data is returned from the requested memory core circuit to registers 2213 and then transmitted to other circuitry in processor core circuit 2200.

During write data transactions, command-addresses are transmitted from write control queue circuit 2203 to Q logic circuit 2206, then to registers 2212, and then to the state tracking circuit that is local to the requested memory core circuit. The write data is transmitted from write data queue circuit 2202 to registers 2211 and then to the requested memory core circuit.

The memory core circuit that is local to processor core circuit PX 2200 is referred to as memory core circuit MX. Any of the processor core circuits in the processor IC die (other than processor core circuit PX) that attempts to access memory core circuit MX transmits the command-addresses (CA1/CA1') for its transactions to state tracking circuit 2205 in processor core circuit 2200 through registers 2214. State tracking circuit 2205 transmits the command-addresses (CA2) for these non-local transactions to the requested memory core circuit MX.

Write control queue circuit 2203 additionally generates alignment signals NRQ[x][7:0] for each of its write data transactions. Read queue circuit 2204 additionally generates alignment signals NRQ[x][7:0] for each of its read data transactions. The alignment signals NRQ[x][7:0] are transmitted to central arbitration circuit 832 using conductors and circuits that are shown in and described below with respect to FIG. 24. For each pending transaction, the alignment signals NRQ[x][7:0] define the alignment configuration needed to transmit signals for the transaction between the processor core circuit PX and the requested memory core circuit.

Figure 23:
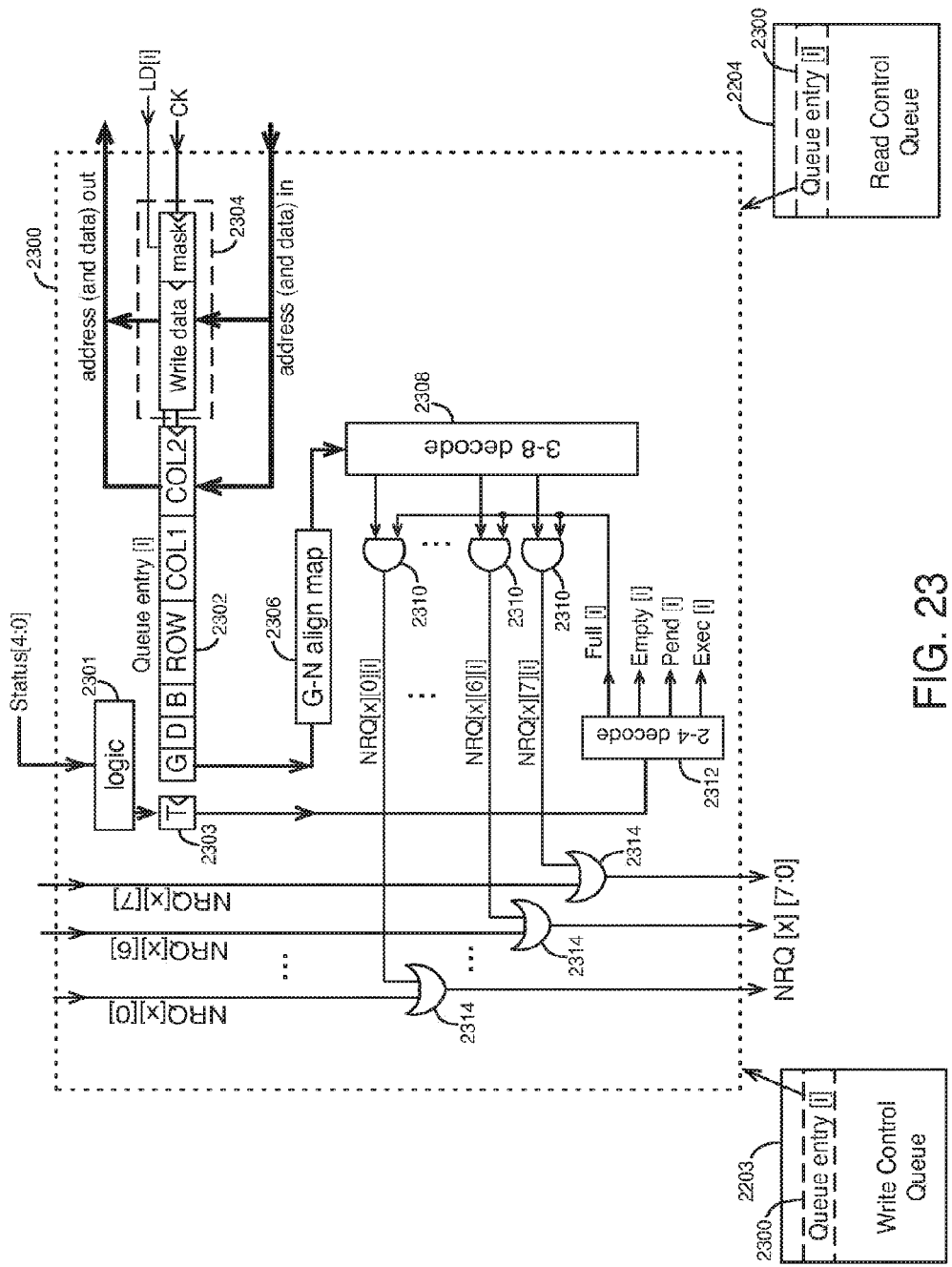
FIG. 23 is a diagram of a queue entry circuit that generates signals used to select the alignment configurations needed to transmit signals for pending transactions between the processor and memory core circuits.

FIG. 23 is a diagram of an embodiment of a queue entry circuit 2300 that generates the alignment signals NRQ[x][7:0] in write control queue circuit 2203 or in read control queue circuit 2204. The write control queue circuit 2203 in each of the memory controller circuits MCa-MCh has several queue entry circuits. Each of the queue entry circuits in write control queue circuit 2203 has the architecture of queue entry circuit 2300 shown in FIG. 23. The outputs of the queue entry circuits in write control queue circuit 2203 are combined using OR gates. Eight OR gates 2314 in each queue entry circuit 2300 in write control queue circuit 2203 combine the alignment signals NRQ[x][7:0] generated by such queue entry circuit 2300 with the combined alignment signals generated by the previous queue entry circuits in write control queue circuit 2203 to generate new combined alignment signals NRQ[x][7:0] that such queue entry circuit passes on to the next queue entry circuit in write control queue circuit 2203. Each queue entry circuit 2300 in write control queue circuit 2203 stores the command-address for a respective one of the pending write data transactions and additionally generates respective alignment signals NRQ[x][7:0].

The read control queue circuit 2204 in each of the memory controller circuits MCa-MCh has several queue entry circuits. Each of the queue entry circuits in read control queue circuit 2204 has the architecture of queue entry circuit 2300 shown in FIG. 23. The outputs of the queue entry circuits in read control queue circuit 2204 are combined using OR gates. The eight OR gates 2314 in each queue entry circuit 2300 in read control queue circuit 2204 combine the alignment signals NRQ[x][7:0] generated by such queue entry circuit 2300 with the combined alignment signals generated by the previous queue entry circuits in read control queue circuit 2204 to generate new combined alignment signals NRQ[x][7:0] that such queue entry circuit passes on to the next queue entry circuit in read control queue circuit 2204. Each queue entry circuit 2300 in read control queue circuit 2204 stores the command-address for a respective one of the pending read data transactions and additionally generates respective alignment signals NRQ[x][7:0].

Queue entry circuit 2300 has a logic circuit 2301, registers 2302, register 2303, G-N align map circuit 2306, 3-8 decoder circuit 2308, 8 AND logic gates 2310, 2-4 decoder circuit 2312, and 8 OR gates 2314. The queue entry circuits 2300 in write control queue circuit 2203 also have registers 2304. The queue entry circuits 2300 in read control queue circuit 2204 do not have registers 2304.

Signal LD[i] is asserted when the transaction corresponding to the previous command-address stored in queue entry circuit 2300 has been successfully executed and a new transaction has become available from the processor core circuit attached to the memory controller circuit. In read control queue circuit 2204, the group (G), device (D), bank (B), row (ROW), and column (COL1 and COL2) command-address bits for a read data transaction are transmitted into queue entry circuit 2300 and stored in registers 2302 in response to the LD[i] and clock CK signals.

In write control queue circuit 2203, the group (G), device (D), bank (B), row (ROW), and column (COL1 and COL2) command-address bits for a write data transaction are transmitted into queue entry circuit 2300 and stored in registers 2302 in response to the LD[i] and CK signals. Also, in the queue entry circuit 2300 in write control queue circuit 2203, the write data and write mask bits for the write data transaction are stored in registers 2304 in response to signals LD[i] and CK.

The group portion (G) of the command-address bits are transmitted from register 2302 to G-N align map circuit 2306. G-N align map circuit 2306 maps bits in the group portion (G) of the command-address to a set of bits N that identify the alignment configuration of the alignment circuitry that connects the requesting processor core circuit to the memory core circuit in group G requested by the transaction. G-N align map circuit 2306 maps the bits G to bits N based on the alignment configurations that are used in a particular embodiment. For example, G-N align map circuit 2306 can map the bits G to the bits N based on the 8 alignment configurations 0-7 shown in FIGS. 9A-9H or based on the 8 alignment configurations 0-7 shown in FIGS. 10A-10H.

Using the embodiment shown in FIGS. 9A-9H as an example, if the requesting processor core circuit is PA, and the memory core circuit that the transaction is requesting to access is MC (G=2), alignment 0 shown in FIG. 9A is the alignment configuration that connects PA and MC, and G-N align map circuit 2306 maps G=2 to N=0. If the requesting processor core circuit is PB, and the memory core circuit that the transaction is requesting to access is ME (G=4), alignment 7 shown in FIG. 9H is the alignment configuration that connects PB and ME, and G-N align map circuit 2306 maps G=4 to N=7. In the examples of FIGS. 9A-9H, 10A-10H, and 23, G-N align map circuit 2306 maps 3 bits representing a G value to 3 bits representing an N value. The output signal of G-N align map circuit 2306 is a 3-bit signal representing an N value. Each of the N values output by G-N align map circuit 2306 corresponds to a respective value of the alignment signals NRQ[x][7:0] shown in diagrams 901-902 in FIGS. 9I-9J and in diagrams 1011-1012 in FIGS. 10I-10J.

The G-N align map circuit 2306 in each of the 8 processor core circuits PA-PH uses a G-to-N mapping different than the G-to-N mapping used by the G-N align map circuits 2306 in the other 7 processor core circuits, because each of the processor core circuits PA-PH uses a different alignment configuration to connect to the same memory core circuit. For example, processor core circuit PA uses alignment 0 to connect to memory core circuit MC, while processor core circuit PB uses alignment 2 to connect to memory core circuit MC.

The 3-bit N value output by circuit 2306 is transmitted to inputs of 3-8 decoder circuit 2308. The output of circuit 2308 is an 8-bit value. Decoder 2308 decodes the 3 output bits of circuit 2306 to generate 8 decoded output bits. Each of the 8 decoded output bits of circuit 2308 is transmitted to an input of a respective AND logic gate 2310. Each AND logic gate 2310 performs an AND Boolean function between a Full[i] signal generated by decoder 2312 and a respective one of the 8 decoded output bits of circuit 2308, as shown in FIG. 23.

Each of AND gates 2310 generates a respective alignment signal NRQ[x]. Both the read control queue 2204 and the write control queue 2203 have several queue entry circuits 2300. The 8 AND gates 2310 in each queue entry circuit generate 8 alignment signals NRQ[x][0][i]-NRQ[x][7][i]. The [i] notation is a number that distinguishes this particular queue entry circuit 2300 from the other queue entry circuits in the read or write control queue circuit. The [x] notation indicates the one of the 8 processor core circuits PA-PH in which this particular queue entry circuit 2300 is located.

When the Full[i] signal is in a logical high state, the alignment signals NRQ[x][0][i]-NRQ[x][7][i] collectively constitute the 8-bit binary value generated by 3-8 decoder circuit 2308 in response to the binary N value generated by G-N align map circuit 2306. Decoder circuit 2308 asserts one of the alignment signals NRQ[x][0][i]-NRQ[x][7][i] to a logical high state corresponding to an alignment configuration that couples the requesting processor core circuit to the memory core circuit requested by the transaction. For example, circuit 2308 decodes binary N value "101" to NRQ bits "00100000," and circuit 2308 decodes binary N value "011"" to NRQ bits "00001000."

Each of the alignment signals NRQ[x][0][i]-NRQ[x][7][i] is transmitted to the input of a respective one of the 8 OR gates 2314. Each of the alignment signals NRQ[x][7:0][i-1] output by the previous queue entry circuit 2300 within the write or read control queue circuit is transmitted to the other input of the respective one of the 8 OR gates 2314. The 8 OR gates 2314 perform Boolean OR functions on the 8 alignment signals NRQ[x][0][i]-NRQ[x][7][i] output by AND gates 2310 and the 8 alignment signals NRQ[x][7:0][i-1] output by the previous queue entry circuit, respectively, to generate updated values of the alignment signals NRQ[x][7:0].

Q logic circuit 2206 (shown in FIG. 22) generates 5 Status[4:0] signals that are transmitted to logic circuit 2301. The 5 states of the Status[4:0] signals are empty-to-full, full-to-pending, pending-to-full, pending-to-execute, and execute-to-empty. One of the Status[4:0] signals being asserted indicates that the transaction corresponding to the command-address stored in queue entry circuit 2300 is transitioning from a first state (e.g., pending) to a second state (e.g., full).

Logic circuit 2301 generates 2 encoded bits that indicate the current status of the queue entry circuit 2300 based on the 5 Status signals [4:0]. These 2 encoded bits are stored in register 2303 and then transmitted from register 2303 to 2-4 decoder circuit 2312. 2-4 decoder circuit 2312 decodes the 2 encoded bits to generate four output signals Full[i], Empty[i], Pend[i], and Exec[i]. The Full[i], Empty[i], Pend[i], and Exec[i] signals indicate a full, empty, pending, or execute state, respectively, of the transaction corresponding to the command-addresses stored in queue entry circuit 2300.

The Pend[i] signal is asserted to indicate that the transaction has been transferred to the state tracking circuit in the destination memory controller circuit to determine if the requested memory bank is busy. If the Status[4:0] signals indicate that the memory bank is busy, the Full[i] signal is asserted, and the transaction is submitted during the next available alignment timing interval. If the Status[4:0] signals indicate that the memory bank is not busy, the Exec[i] signal is asserted for a short time interval to ensure that the write data and mask remain available in circuit 2304, until they are transferred through the alignment circuitry to the destination memory circuit. When this short time interval elapses, the Exec[i] signal is de-asserted, and the Empty[i] signal is asserted, indicating that a new transaction can be loaded into queue entry circuit 2300.

Only one of the Full[i], Empty[i], Pend[i], and Exec[i] signals is in a logical high state at one time. The Empty[i] signal is asserted in a logical high state after the previous transaction has been completed. The Full[i] signal is asserted in a logical high state after a command-address for a new read or write data transaction has been loaded into register 2302. Thus, alignment signals NRQ[x][0][i]-NRQ[x][7][i] are only updated in response to the Full[i] signal being asserted. The Pend[i] signal is asserted in a logical high state after updated alignment signals NRQ[x][7:0][i] signals have been generated for the command-address previously loaded into register 2302.

Q logic circuit 2206 updates the Status[4:0] signals based on signals received from the requesting processor core circuit and based on the Busy signal from the state tracking circuit that is local to the memory core circuit requested for access by the current transaction having the command-address stored in register 2302. If the Status[4:0] signals indicate that the current transaction is being executed, then the Exec[i] signal is asserted in a logical high state. If the Status[4:0] signals indicate that the current transaction is being delayed because a previous transaction accessing the same memory bank is still executing, then the Full[i] signal is again asserted in a logical high state, and the alignment signals NRQ[x][0][i]-NRQ[x][7][i] are updated based on the G portion of the command-address stored in register 2302. The Busy signal shown in FIG. 21 is used to generate the Pending-to-Full signal in the Status[4:0] signals. The Pend [i] signal is again asserted in a logical high state after updated alignment signals NRQ[x][7:0] have been generated in response to the updated alignment signals NRQ[x][0][i]-NRQ[x][7][i].

In the examples of FIG. 9A-9H or 10A-10H, each of the alignment signals NRQ[x][7:0] represents one of 8 different alignment configurations of the alignment circuitry. In an embodiment in which the number of queue entry circuits 2300 in a read or write control queue circuit is K, K OR gates 2314 in the queue entry circuits 2300 are connected in series to generate each of the 8 alignment signals NRQ[x][7:0]. As a result, OR gates 2314 cause a respective bit of the 8 alignment signals NRQ[x][7:0] to be in a logical high state if any of the queue entry circuits 2300 requests the alignment configuration represented by that alignment signal NRQ[x][7:0].

8 OR gates (not shown) in Q logic circuit 2206 perform 8 Boolean OR functions on the 8 alignment signals NRQ[x][7:0] generated by write control queue circuit 2203 and the 8 alignment signals NRQ[x][7:0] generated by read control queue circuit 2204, respectively. A respective bit of the 8 alignment signals NRQ[x][7:0] resulting from these OR functions is in a logical high state if any of the queue circuits 2300 in either of the read or write control queue circuits requests the alignment configuration represented by that bit of alignment signals NRQ[x][7:0]. The resulting alignment signals NRQ[x][7:0] generated by the OR gates in circuit 2206 are transmitted through bus 2220 shown in FIG. 22 to the central arbitration circuit 832.

Figure 24:
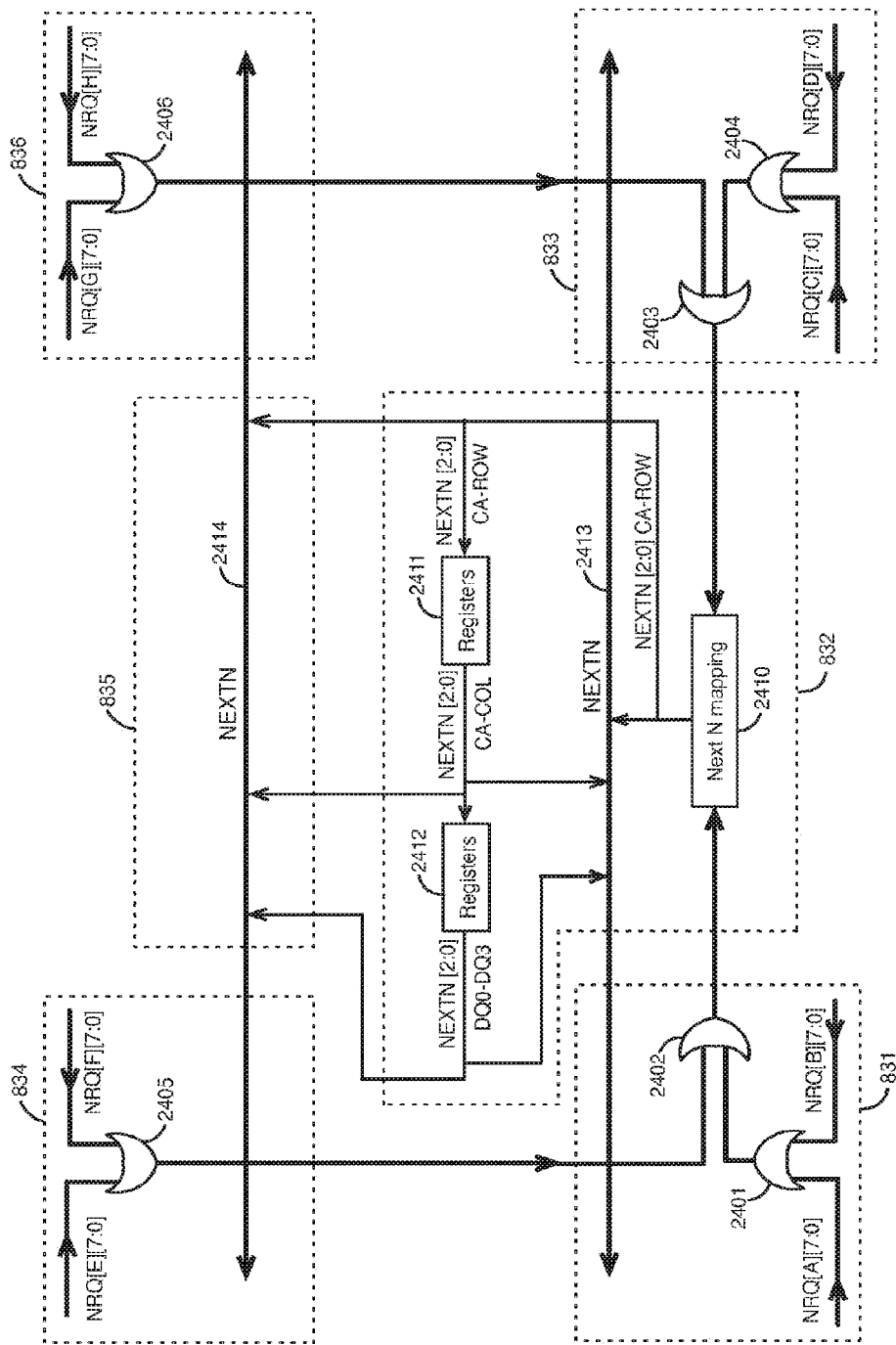
FIG. 24 is a diagram that illustrates details of the arbitration circuits that control the alignment configuration of the alignment circuitry.

FIG. 24 is a diagram that illustrates details of the arbitration circuits 831-836. The location of arbitration circuits 831-836 within IC die 300 is shown in FIG. 8A. Arbitration circuit 831 includes OR gates 2401 and 2402. Arbitration circuit 832 includes next N mapping circuit 2410 and registers 2411 and 2412. Arbitration circuit 833 includes OR gates 2403 and 2404. Arbitration circuit 834 includes OR gate 2405. Arbitration circuit 836 includes OR gate 2406. Each of OR gates 2401-2406 represents 8 OR gate circuits arranged in parallel.

OR gate 2401 performs OR functions on the alignment signals NRQ[A][7:0] generated by processor core circuit PA and the alignment signals NRQ[B][7:0] generated by processor core circuit PB, respectively. OR gate 2405 performs OR functions on the alignment signals NRQ[E][7:0] generated by processor core circuit PE and the alignment signals NRQ[F][7:0] generated by processor core circuit PF. OR gate 2402 performs OR functions on the output signals of OR gate 2401 and the output signals of OR gate 2405, respectively. The output signals of OR gate 2402 equal the result of Boolean OR functions performed on alignment signals NRQ[A][7:0], NRQ[B][7:0] NRQ[E][7:0], and NRQ[F][7:0], respectively.

OR gate 2404 performs OR functions on the alignment signals NRQ[C][7:0] generated by processor core circuit PC and the alignment signals NRQ[D][7:0] generated by processor core circuit PD, respectively. OR gate 2406 performs OR functions on the alignment signals NRQ[G][7:0] generated by processor core circuit PG and the alignment signals NRQ[H][7:0] generated by processor core circuit PH, respectively. OR gate 2403 performs OR functions on the output signals of OR gate 2404 and the output signals of OR gate 2406, respectively. The output signals of OR gate 2403 equal the result of Boolean OR functions performed on alignment signals NRQ[C][7:0], NRQ[D][7:0] NRQ[G][7:0], and NRQ[H][7:0], respectively.

The output signals of OR gates 2402 and 2403 are transmitted to respective inputs of next N mapping circuit 2410. Circuit 2410 performs OR functions on the output signals of OR gate 2402 and the output signals of OR gate 2403, respectively, to generate 8 final NRQ signals. Each of the 8 final NRQ signals represents a respective one of the 8 different alignment configurations of the alignment circuitry. Respective ones of the final NRQ signals are in logical high states when those NRQ signals represent alignment configurations that are requested by at least one of the pending transactions in any of the 8 processor core circuits PA-PH. When one or more of the 8 alignment configurations are not requested by any of the pending transactions in any of the processor core circuits, the respective final NRQ signals representing such non-requested alignment configurations are in logical low states. If the number of pending requests is small, some of the final NRQ signals may be in logical high states, and some of the final NRQ signals may be in logical low states.

Next N mapping circuit 2410 maps the 8 final NRQ signals to generate 3 NEXTN[2:0] CA-ROW signals using, for example, an 8 to 3 binary encoding technique. Each of the 8 unique binary values of the NEXTN[2:0] CA-ROW signals corresponds to a different one of the 8 alignment configurations of the alignment circuitry in alignment stripes 391-392. Next N mapping circuit 2410 repetitively cycles through the 8 possible alignment configurations of the alignment circuitry as shown, for example, in diagram 901 in FIG. 9I. Next N mapping circuit 2410 may skip combinations of the NEXTN[2:0] CA-ROW signals corresponding to those of the alignment configurations 0-7 that are not requested by any of the pending transactions in any of the processor core circuits PA-PH, as shown, for example, in diagram 902 of FIG. 9J.

Registers 2411 delay the NEXTN[2:0] CA-ROW signals to generate 3 NEXTN[2:0] CA-COL signals. Registers 2412 delay the NEXTN[2:0] CA-COL signals to generate 3 NEXTN[2:0] DQ0-DQ3 signals. The NEXTN[2:0] CA-ROW signals are used to configure the multiplexers in the portions of the alignment circuitry that transmit the row command-addresses for the transactions from the processor core circuits PA-PH to the connection sites. The NEXTN[2:0] CA-COL signals are used to configure the multiplexers in the portions of the alignment circuitry that transmit the column command-addresses for the transactions from PA-PH to the connection sites. The NEXTN[2:0] DQ0-DQ3 signals are used to configure the multiplexers in the portions of the alignment circuitry that transmit the data DQ0-DQ3 for the transactions between PA-PH and the connection sites.

As an example, the NEXTN[2:0] CA-COL, NEXTN[2:0] CA-ROW, and NEXTN[2:0] DQ0-DQ3 signals may equal the values shown in the timing diagrams of FIGS. 9I-9J. In this example, the value 0-7 of each of the 3 sets of the NEXTN[2:0] CA-COL, NEXTN[2:0] CA-ROW, and NEXTN[2:0] DQ0-DQ3 signals corresponds to one of the alignment configurations 0-7 shown in FIGS. 9A-9H, respectively. As another example, the NEXTN[2:0] CA-COL, NEXTN[2:0] CA-ROW, and NEXTN[2:0] DQ0-DQ3 signals may equal the values shown in the timing diagrams of FIGS. 10I-10J. In this example, the value 0-7 of each of the 3 sets of the NEXTN[2:0] CA-COL, NEXTN[2:0]

CA-ROW, and NEXTN[2:0] DQ0-DQ3 signals corresponds to one of the alignment configurations 0-7 shown in FIGS. 10A-10H, respectively.

Mapping circuitry (e.g., logic gates) in the processor IC die maps the NEXTN[2:0] CA-ROW, NEXTN[2:0] CA-COL, and NEXTN[2:0] DQ0-DQ3 signals to select signal values that are transmitted to the select inputs of the multiplexers in the corresponding portions of the alignment circuitry in alignment stripes 391-392. The mapping circuitry generates the select signal values for the multiplexers based on one of the footprint configurations of the connection sites shown in FIGS. 4A-4C and based on one of the 8 alignment configurations of alignment circuitry 402 that is selected by the values of the corresponding NEXTN[2:0] CA-ROW, NEXTN[2:0] CA-COL, and NEXTN[2:0] DQ0-DQ3 signals.

Registers 2411 delay the NEXTN[2:0] CA-COL signals relative to the NEXTN[2:0] CA-ROW signals, because the column command-address for each read and write data transaction is transmitted to the memory core circuit a period of time after the row command-address. Registers 2412 delay the NEXTN[2:0] DQ0-DQ3 signals relative to the NEXTN[2:0] CA-COL signals, because the read or write data for each transaction is transmitted between the processor and memory core circuits a period of time after the column command-address. FIG. 9K illustrates an example of how the alignment configurations are delayed and reused in different portions of the alignment circuitry in different time intervals to transmit the row command-address, then the column address, and then the write or read data for each transaction.

The integrated circuits included in many of the integrated circuit dies shown and described herein can be, for example, memory integrated circuits, controller integrated circuits, processor integrated circuits, analog integrated circuits, digital integrated circuits, programmable integrated circuits, etc.

According to some embodiments that are described in detail below, conductors that connect together the multiplexer blocks in the alignment circuitry are placed between the connection sites in the connection sites blocks. These embodiments can substantially reduce the area on the integrated circuit die that is used for the alignment circuitry.

Figure 25:
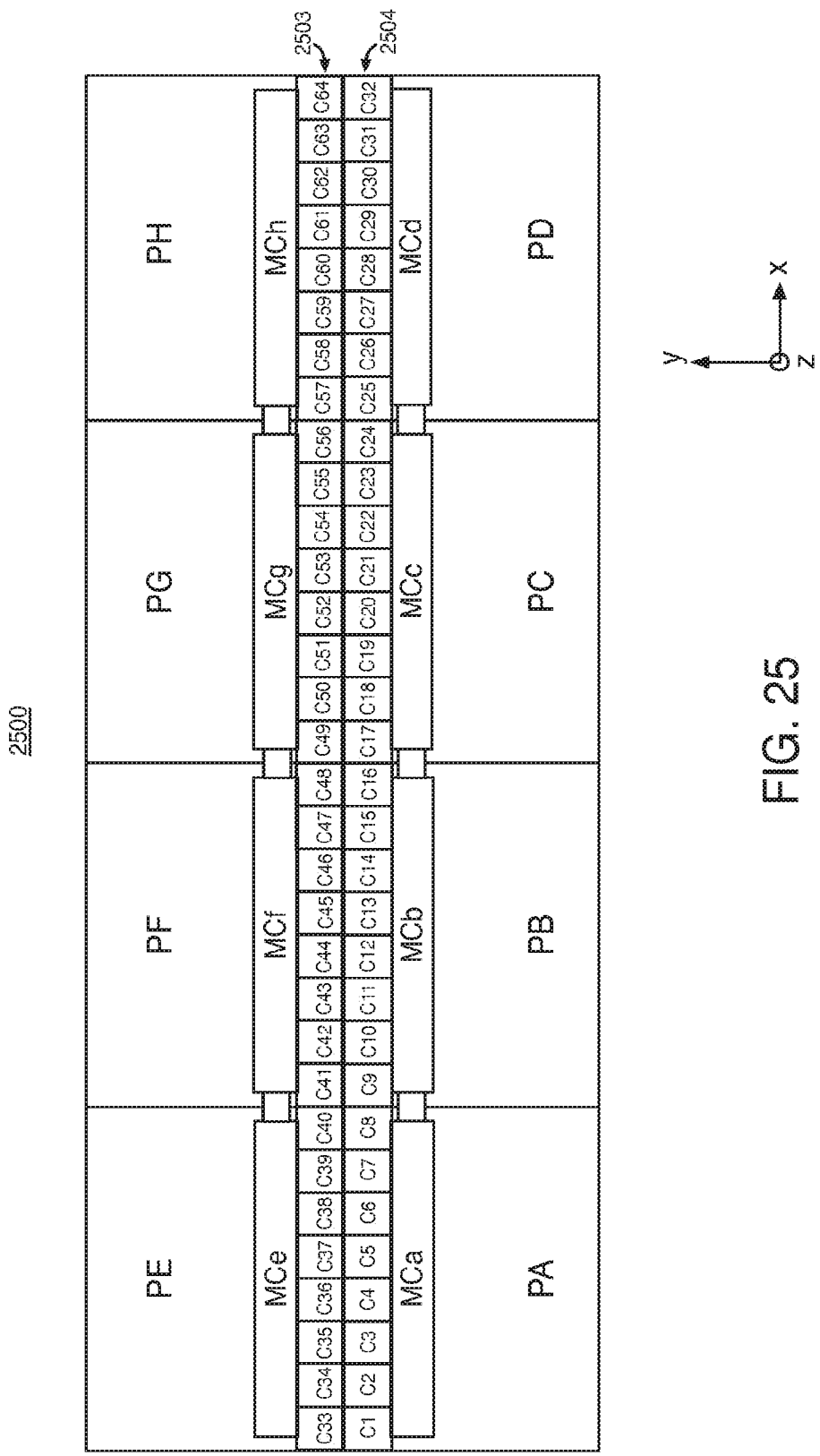
FIG. 25 is a diagram of an integrated circuit die having an alternative embodiment of alignment circuitry that provides signals between processor core circuits and connection sites.

FIG. 25 is a diagram of an integrated circuit die 2500 having an alternative embodiment of alignment circuitry that provides signals between processor core circuits PA-PH and connection sites in stripe regions 2503-2504. Integrated circuit die 2500 includes processor core circuits PA-PH, connections site blocks C1-C32, and connection site blocks C33-C64. Connection site blocks C1-C64 include connection sites and alignment circuitry. The alignment circuitry in connection site blocks C1-C64 includes multiplexer blocks and conductors. Conductors that connect together the multiplexer blocks are routed between the connection sites. Processor core circuits PA-PH include memory controller circuits MCa-MCh, respectively.

32 connection site blocks C1-C32 are located in stripe region 2504, and 32 connection site blocks C33-C64 are located in stripe region 2503. Each of the processor core circuits PA-PH is adjacent to 8 connection site blocks, as shown in FIG. 25. The connection sites in connection site blocks C1-C64 are connected to another integrated circuit die that is stacked on integrated circuit die 2500.

Figure 26:
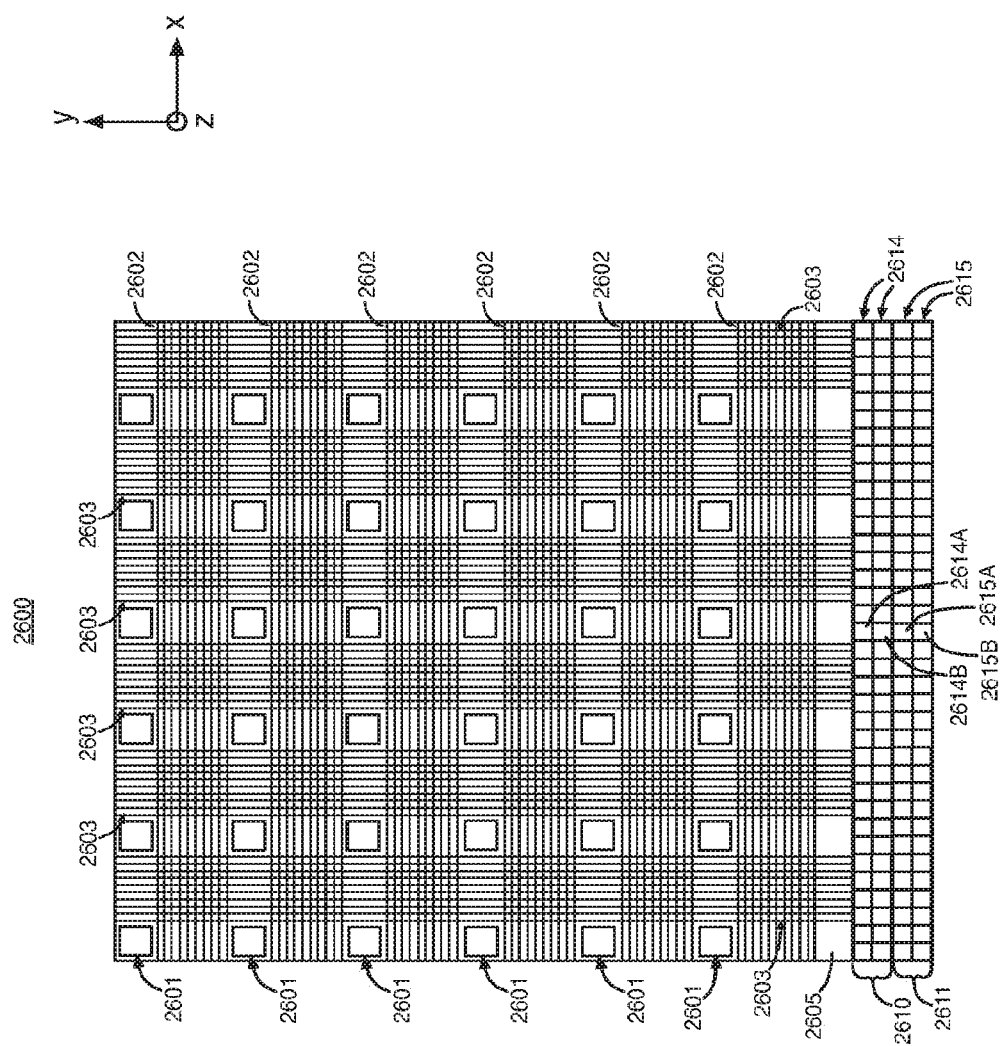
FIG. 26 illustrates a connection site block having connection sites and conductors located between the connection sites.

FIG. 26 illustrates a connection site block 2600 having connection sites and conductors that are located in between the connection sites. Connection site block 2600 is an example of each of the connection site blocks C1-C64 in integrated circuit die 2500. FIG. 26 also shows an example of a portion of the alignment circuitry on integrated circuit die 2500 that is located in connection site block 2600.

Connection site block 2600 includes 36 connection sites 2601. 36 connection sites 2601 are shown in FIG. 26 merely as an example that is not intended to be limiting. Connection sites 2601 are arranged in 6 rows in the x-direction and 6 columns in the y-direction in connection site block 2600. Connection site block 2600 also includes horizontal conductors 2602 aligned in the x-direction and vertical conductors 2603 aligned in the y-direction. The vertical conductors 2603 are located between the columns of connection sites 2601, and the upper five rows of horizontal conductors 2602 are located between the rows of connection sites 2601, as shown in FIG. 26. The vertical conductors 2603 are coupled to the horizontal conductors 2602 at selected cross over points, as discussed in further detail below. As an example that is not intended to be limiting, connection site block 2600 can have 360 horizontal conductors 2602 and 288 vertical conductors 2603.

Connection site blocks C1-C64 may experience strain when solder bonds or wire bonds are connected to the connection sites. The strain can damage any active devices, such as transistors, that are in the connection site blocks C1-C64. In the embodiment of FIG. 26, connection site block 2600 does not include active devices, such as transistors, that can be damaged during solder bonding or wire bonding.

Connection site block 2600 also includes transmit/receive stripe 2605, right alignment region 2610, and left alignment region 2611. Transmit/receive stripe 2605, right alignment region 2610, and left alignment region 2611 are part of the alignment circuitry in integrated circuit die 2500. Right alignment region 2610 includes 72 right alignment multiplexer blocks 2614, such as right alignment multiplexer blocks 2614A-2614B. Left alignment region 2611 includes 72 left alignment multiplexer blocks 2615, such as left alignment multiplexer blocks 2615A-2615B. Multiplexer blocks 2614 are shown as two rows each having 36 square boxes aligned in the x-direction in FIG. 26. Multiplexer blocks 2615 are shown as two rows each having 36 square boxes aligned in the x-direction in FIG. 26. A first half of vertical conductors 2603 extend through transmit/receive stripe 2605 to connect to right alignment multiplexer blocks 2614, and a second half of the vertical conductors 2603 extend through transmit/receive stripe 2605 and right alignment region 2610 to connect to left alignment multiplexer blocks 2615.

In the embodiment of FIGS. 25-26, right and left alignment multiplexer blocks 2614-2615 in right and left alignment regions 2610-2611 are connected together through conductors 2602-2603 located in the connection site blocks C1-C64. Horizontal conductors 2602 and vertical conductors 2603 in the connection site blocks C1-C64 conduct signals between the multiplexer blocks 2614-2615 that are in different connection site blocks C1-C64. In an embodiment, connection site blocks C1-C64 can have the same number of horizontal conductors that are in the alignment circuitry in regions 391-392 in FIG. 3D.

The embodiment of FIGS. 25-26 substantially reduces the area of the alignment circuitry on integrated circuit die 2500, because the horizontal and vertical conductors 2602-2603 connecting the multiplexer blocks 2614-2615 are in the connection site blocks C1-C64. As an example, the embodiment of FIGS. 25-26 may reduce the area of the alignment circuitry on integrated circuit die 2500 by one-third compared to the area of alignment circuitry 402 on the integrated circuit die of FIGS. 4A-4C.

Figure 27C:
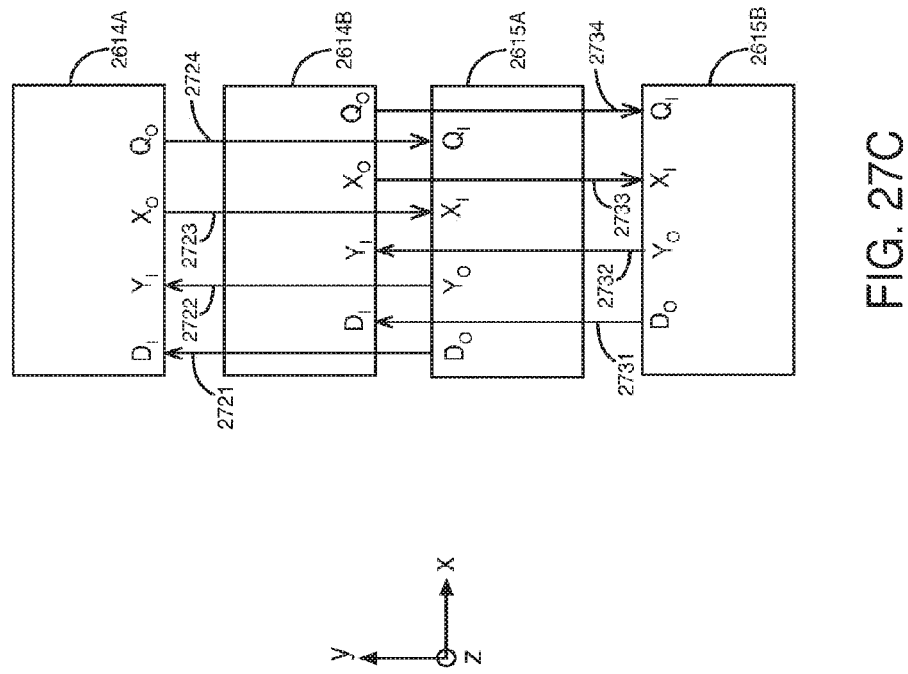
FIGS. 27A-27C illustrate embodiments of multiplexer blocks for implementing the alignment circuitry shown in FIGS. 25-26.
Figure 27A:
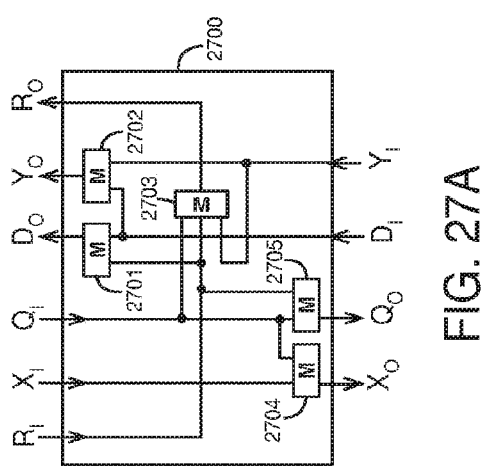

FIG. 27A illustrates an example of a right alignment multiplexer block 2700. Right alignment multiplexer block 2700 is an example of each of the right alignment multiplexer blocks 2614 in right alignment region 2610. Right alignment multiplexer block 2700 includes multiplexer circuits 2701-2705. Right alignment multiplexer block 2700 functions as described above with respect to multiplexer block 511 shown in FIG. 5B, with multiplexer circuits 2701-2705 corresponding to multiplexer circuits 521-525, respectively, in FIG. 5B.

Input signals $X_I$ and $Q_I$ of right alignment multiplexer block 2700 are provided from two of the connection sites. Output signals $D_O$ and $Y_O$ of right alignment multiplexer block 2700 are provided to two of the connection sites. Input signal $R_I$ of right alignment multiplexer block 2700 is provided from another right alignment multiplexer block 2700. Output signal $R_O$ of right alignment multiplexer block 2700 is provided to another right alignment multiplexer block 2700.

Input signal $R_I$ is provided to an input of right alignment multiplexer block 2700 from a vertical conductor aligned in the y-direction, and output signal $R_O$ is provided from an output of right alignment multiplexer block 2700 to a vertical conductor aligned in the y-direction.

Figure 27B:
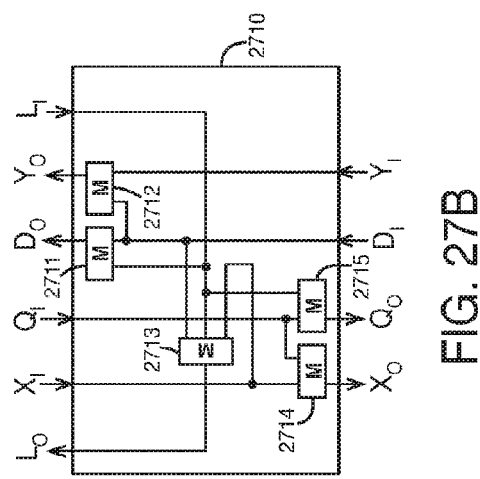

FIG. 27B illustrates an example of a left alignment multiplexer block 2710. Left alignment multiplexer block 2710 is an example of each of the left alignment multiplexer blocks 2615 in left alignment region 2611. Left alignment multiplexer block 2710 includes multiplexer circuits 2711-2715. Left alignment multiplexer block 2710 functions as described above with respect to multiplexer block 513 in FIG. 5C, with multiplexer circuits 2711-2715 corresponding to multiplexer circuits 531-535, respectively, in FIG. 5C.

Input signals $X_I$ and $Q_I$ of left alignment multiplexer block 2710 in left alignment region 2611 are the output signals $X_O$ and $Q_O$, respectively, of one of the right alignment multiplexer blocks 2700 in right alignment region 2610. Output signals $D_O$ and $Y_O$ of left alignment multiplexer block 2710 in left alignment region 2611 are the input signals $D_I$ and $Y_I$, respectively, of the same right alignment multiplexer block 2700 in right alignment region 2610. Input signals $D_I$ and $Y_I$ of left alignment multiplexer block 2710 are provided from at least one of processor core circuits PA-PH. Output signals $X_O$ and $Q_O$ of left alignment multiplexer block 2710 are provided to at least one of processor core circuits PA-PH. Input signal $L_I$ of left alignment multiplexer block 2710 is provided from another left alignment multiplexer block 2710. Output signal $L_O$ of left alignment multiplexer block 2710 is provided to another left alignment multiplexer block 2710.

Input signal $L_I$ is provided to an input of left alignment multiplexer block 2710 from a vertical conductor aligned in the y-direction, and output signal $L_O$ is provided from an output of left alignment multiplexer block 2710 to a vertical conductor aligned in the y-direction. Multiplexer circuits 2701-2705 and 2711-2715 are formed, for example, with transistors. In an embodiment, a first half of horizontal conductors 2602 in connection site block 2600 connect to the right alignment multiplexer blocks 2700 in right alignment region 2610, and a second half of horizontal conductors 2602 in connection site block 2600 connect to the left alignment multiplexer blocks 2710 in left alignment region 2611.

FIG. 27C illustrates an exemplary configuration of conductors that provide signals between the right and left alignment multiplexer blocks in a connection site block. As shown in FIG. 27C, output signals $X_O$ and $Q_O$ of right alignment multiplexer block 2614A are provided to inputs of left alignment multiplexer block 2615A as input signals $X_I$ and $Q_I$ through conductors 2723-2724, respectively. Output signals $D_O$ and $Y_O$ of left alignment multiplexer block 2615A are provided to inputs of right alignment multiplexer block 2614A as input signals $D_I$ and $Y_I$ through conductors 2721-2722, respectively. Output signals $X_O$ and $Q_O$ of right alignment multiplexer block 2614B are provided to inputs of left alignment multiplexer block 2615B as input signals $X_I$ and $Q_I$ through conductors 2733-2734, respectively. Output signals $D_O$ and $Y_O$ of left alignment multiplexer block 2615B are provided to inputs of right alignment multiplexer block 2614B as input signals $D_I$ and $Y_I$ through conductors 2731-2732, respectively. The configuration of conductors shown in FIG. 27C connects together each set of 2 right alignment multiplexer blocks and 2 left alignment multiplexer blocks that are aligned in the y-direction in connection site block 2600.

Figure 28A:
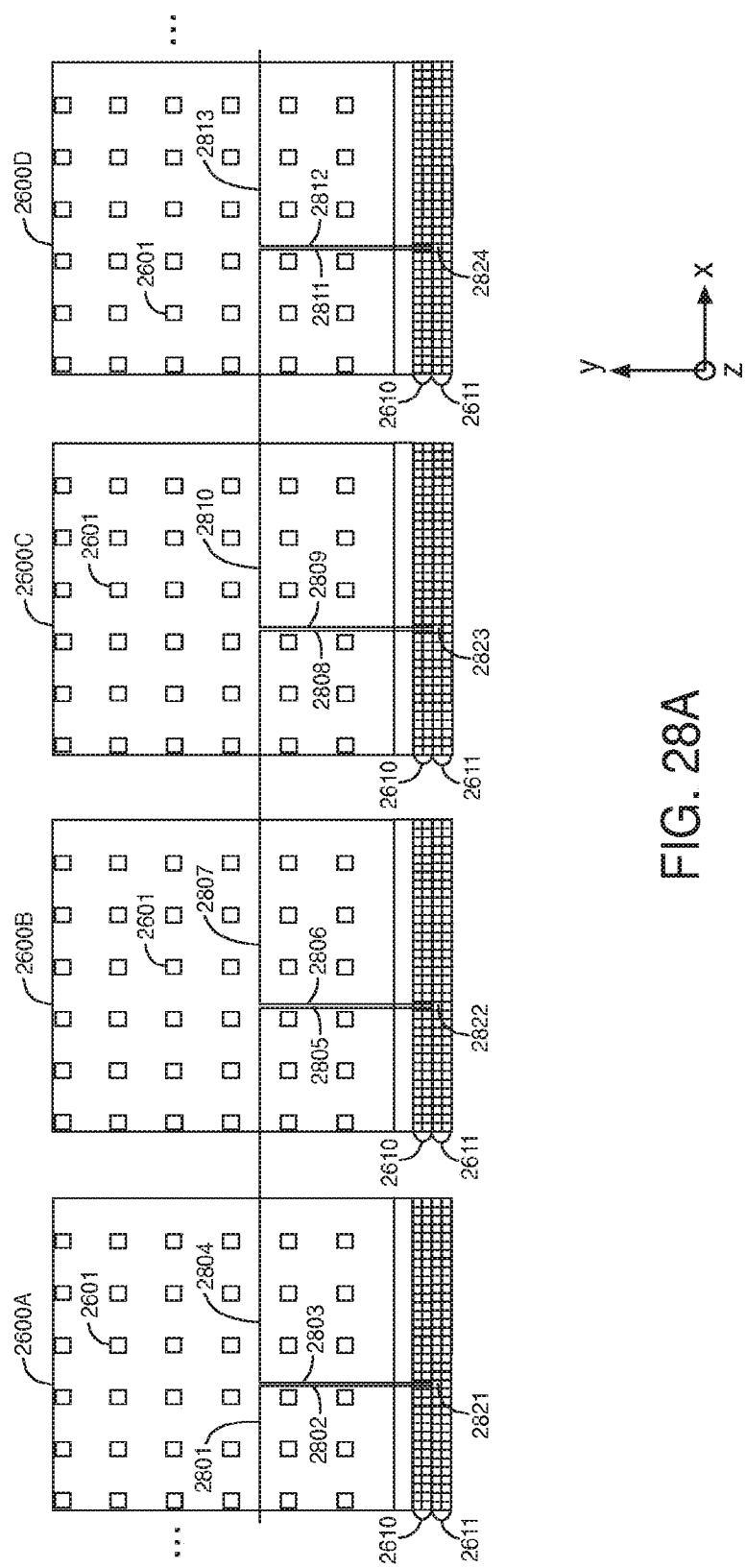
FIGS. 28A-28B illustrate exemplary configurations of vertical and horizontal conductors in connection site blocks connecting multiplexer blocks in the alignment circuitry.

FIG. 28A illustrates an exemplary configuration of vertical and horizontal conductors in connection site blocks that connect together multiplexer blocks in left alignment region 2611. FIG. 28A illustrates four connection site blocks 2600A-2600D. Each of the connection site blocks 2600A-2600D has the same circuit structure as connection site block 2600 shown in FIG. 26. Connection site blocks 2600A-2600D are examples of 4 of the connection site blocks C1-C32 in region 2504 or 4 of the connection site blocks C33-C64 in region 2503 shown in FIG. 25.

Each of the connection site blocks 2600A-2600D includes 36 connection sites 2601. Only one of the connection sites 2601 is labeled with a reference numeral in each connection site block 2600A-2600D in FIG. 28A to simplify the drawing. Connection site blocks 2600A-2600D include conductors 2801-2813 that are between connection sites 2601, as shown in FIG. 28A.

Horizontal conductor 2801 and vertical conductor 2802 connect a first left alignment multiplexer block (not shown) in a first connection site block to a second left alignment multiplexer block 2821 in connection site block 2600A. Vertical conductors 2803 and 2805 and horizontal conductor 2804 connect the second left alignment multiplexer block 2821 to a third left alignment multiplexer block 2822 in connection site block 2600B. Vertical conductors 2806 and 2808 and horizontal conductor 2807 connect the third left alignment multiplexer block 2822 to a fourth left alignment multiplexer block 2823 in connection site block 2600C. Vertical conductors 2809 and 2811 and horizontal conductor 2810 connect the fourth left alignment multiplexer block 2823 to a fifth left alignment multiplexer block 2824 in connection site block 2600D. Vertical conductor 2812 and horizontal conductor 2813 connect the fifth left alignment multiplexer block 2824 to a sixth left alignment multiplexer block (not shown) in a sixth connection site block.

Each of these 6 left alignment multiplexer blocks includes a left alignment multiplexer block 2710, as shown in FIG. 27B. The signals transmitted to and from each of the left alignment multiplexer blocks 2710 through conductors 2801-2813 are the $L_I$ and $L_O$ signals in FIG. 27B.

Six left alignment multiplexer blocks that are connected by vertical and horizontal conductors in 6 connection site blocks are described above as an example. As another example, vertical and horizontal conductors in the connection site blocks C1-C32 connect together 8 left alignment multiplexer blocks in 8 of the connection site blocks C1-C32, and vertical and horizontal conductors in the connection site blocks C33-C64 connect together 8 left alignment multiplexer blocks in 8 of the connection site blocks C33-C64.

In an exemplary implementation of FIG. 28A, signals are transmitted between one of the processor core circuits PA-PH and one of the memory core circuits MA-MH in a stacked IC die through the connection sites, as described above, e.g., with respect to FIGS. 9A-9H.

Figure 28B:
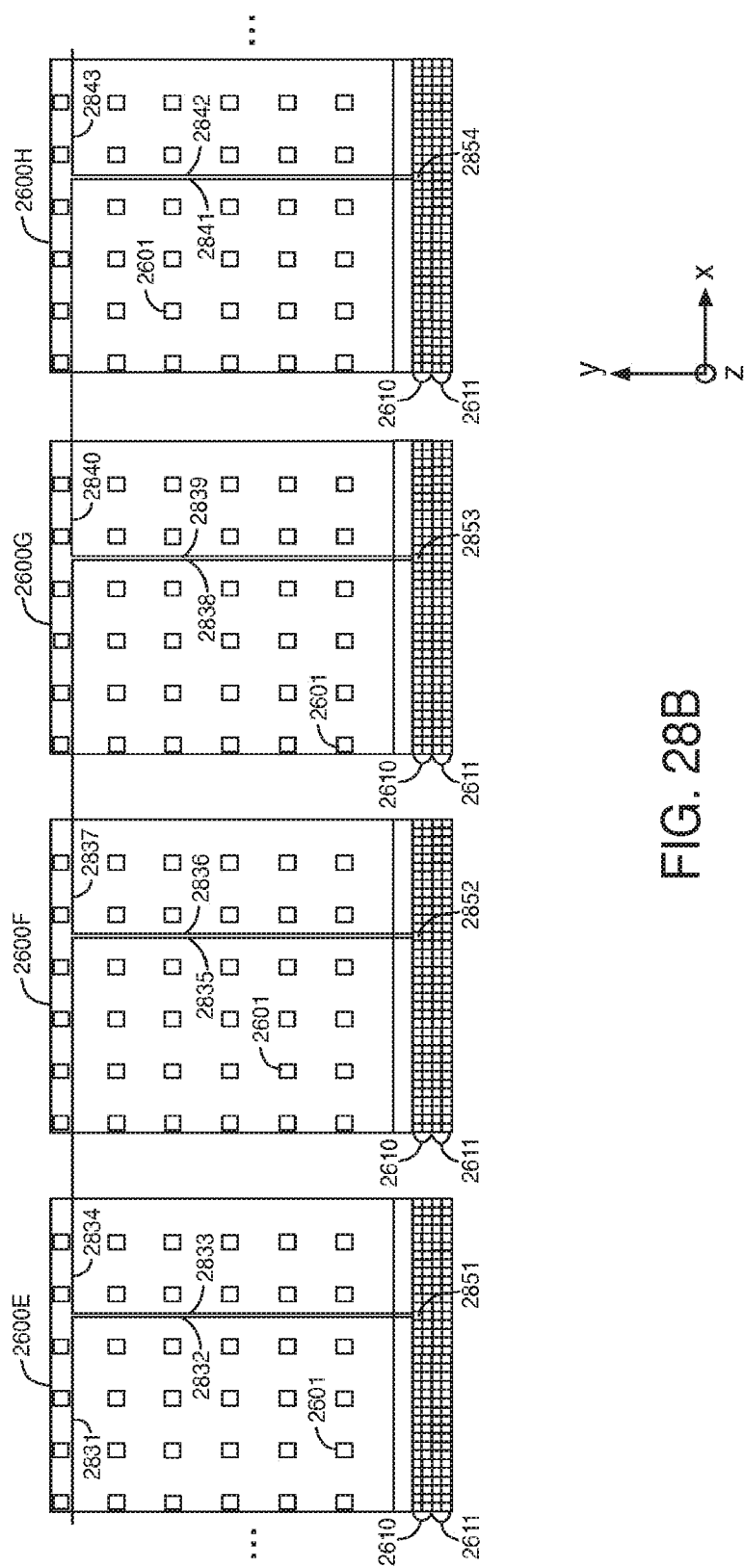

FIG. 28B illustrates an exemplary configuration of vertical and horizontal conductors in connection site blocks that connect together multiplexer blocks in right alignment region 2610. FIG. 28B illustrates four connection site blocks 2600E-2600H. Each of the connection site blocks 2600E-2600H has the same circuit structure as connection site block 2600 shown in FIG. 26. Connection site blocks 2600E-2600H are examples of 4 of the connection site blocks C1-C32 in region 2504 or 4 of the connection site blocks C33-C64 in region 2503 shown in FIG. 25. As a specific example this is not intended to be limiting, connection site blocks 2600E-2600H are connection site blocks C9, C14, C19, and C24, respectively.

Each of the connection site blocks 2600E-2600H includes 36 connection sites 2601. Only one of the connection sites 2601 is labeled with a reference numeral in each connection site block 2600E-2600H in FIG. 28B to simplify the drawing. Connection site blocks 2600E-2600H include conductors 2831-2843 that are between connection sites 2601, as shown in FIG. 28B.

Horizontal conductor 2831 and vertical conductor 2832 connect a first right alignment multiplexer block (not shown) in a first connection site block to a second right alignment multiplexer block 2851 in connection site block 2600E. Vertical conductors 2833 and 2835 and horizontal conductor 2834 connect the second right alignment multiplexer block 2851 to a third right alignment multiplexer block 2852 in connection site block 2600F. Vertical conductors 2836 and 2838 and horizontal conductor 2837 connect the third right alignment multiplexer block 2852 to a fourth right alignment multiplexer block 2853 in connection site block 2600G. Vertical conductors 2839 and 2841 and horizontal conductor 2840 connect the fourth right alignment multiplexer block 2853 to a fifth right alignment multiplexer block 2854 in connection site block 2600H. Vertical conductor 2842 and horizontal conductor 2843 connect the fifth right alignment multiplexer block 2854 to a sixth right alignment multiplexer block (not shown) in a sixth connection site block.

Each of these 6 right alignment multiplexer blocks includes a right alignment multiplexer block 2700, as shown in FIG. 27A. The signals transmitted to and from each of the right alignment multiplexer blocks 2700 through conductors 2831-2843 are the $R_I$ and $R_O$ signals in FIG. 27A.

Six right alignment multiplexer blocks connected by vertical and horizontal conductors in 6 of the connection site blocks are described above as an example. As another example, vertical and horizontal conductors in the connection site blocks connect together 8 right alignment multiplexer blocks in 8 of the connection site blocks C1-C32, and vertical and horizontal conductors in the connection site blocks connect together 8 right alignment multiplexer blocks in 8 of the connection site blocks C33-C64.

In an exemplary implementation of FIG. 28B, signals are transmitted between one of the processor core circuits PA-PH and one of the memory core circuits MA-MH in a stacked IC die through the connection sites, as described above, e.g., with respect to FIGS. 9A-9H.

In the embodiment of FIG. 28B, conductors 2831-2843 in connection site blocks 2600E-2600H are the longest conductors that connect the multiplexer blocks in the alignment circuitry. Signals that pass through conductors 2831-2843 experience the longest delays of any signals passing between the multiplexer blocks in different connection site blocks C1-C64 in IC die 2500. As an example, signals that pass through conductors 2831-2843 and the corresponding right alignment multiplexer blocks may experience delays that are 1.7 times larger than the delays of signals passing through conductors that connect the same number of multiplexer blocks 511 in alignment circuitry 402 shown in FIGS. 4A-4C.

Figure 29:
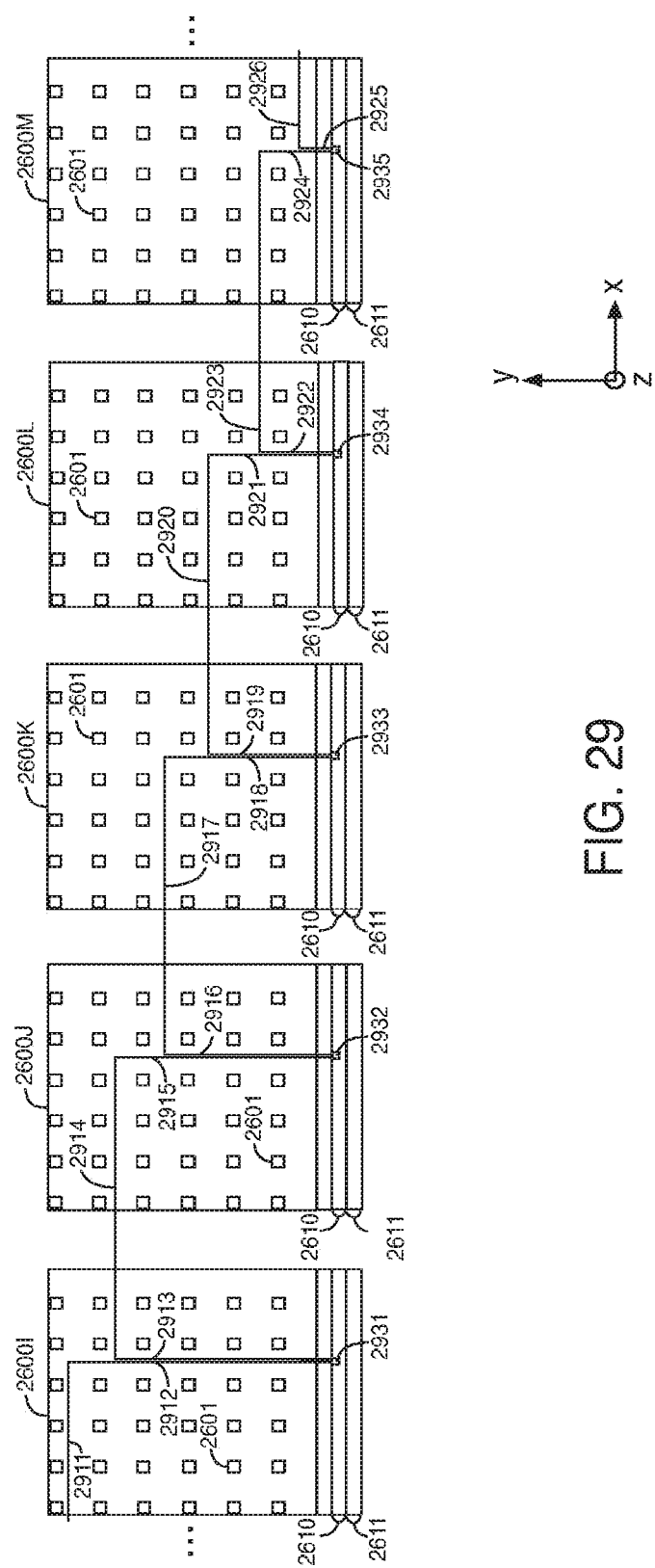
FIG. 29 illustrates an exemplary configuration of vertical and horizontal conductors in connection site blocks connecting multiplexer blocks in the alignment circuitry that reduces the longest delays of signals passing through the vertical and horizontal conductors by using vertical conductors having varying lengths.

FIG. 29 illustrates an exemplary configuration of vertical and horizontal conductors in connection site blocks that connects right alignment multiplexer blocks and that reduces the longest delays of signals passing through the vertical and horizontal conductors by using vertical conductors having varying lengths. FIG. 29 illustrates five connection site blocks 2600I-2600M. Each of the connection site blocks 2600I-2600M has the same circuit structure as connection site block 2600 shown in FIG. 26. Connection site blocks 2600I-2600M are examples of 5 of the connection site blocks C1-C32 in region 2504 or 5 of the connection site blocks C33-C64 in region 2503 shown in FIG. 25. As a specific example this is not intended to be limiting, connection site blocks 2600I-2600L are connection site blocks C9, C14, C19, C24, and C27, respectively.

Each of the connection site blocks 2600I-2600M includes 36 connection sites 2601. Only one of the connection sites 2601 is labeled with a reference numeral in each connection site block 2600I-2600M in FIG. 29 to simplify the drawing. Connection site blocks 2600I-2600M include conductors 2911-2926 that are between connection sites 2601, as shown in FIG. 29.

Horizontal conductor 2911 and vertical conductor 2912 connect a first right alignment multiplexer block (not shown) in a first connection site block to a second right alignment multiplexer block 2931 in connection site block 2600I. Vertical conductors 2913 and 2915 and horizontal conductor 2914 connect the second right alignment multiplexer block 2931 to a third right alignment multiplexer block 2932 in connection site block 2600I Vertical conductors 2916 and 2918 and horizontal conductor 2917 connect the third right alignment multiplexer block 2932 to a fourth right alignment multiplexer block 2933 in connection site block 2600K. Vertical conductors 2919 and 2921 and horizontal conductor 2920 connect the fourth right alignment multiplexer block 2933 to a fifth right alignment multiplexer block 2934 in connection site block 2600L. Vertical conductors 2922 and 2924 and horizontal conductor 2923 connect the fifth right alignment multiplexer block 2934 to a sixth right alignment multiplexer block 2935 in connection site block 2600M. Vertical conductor 2925 and horizontal conductor 2926 connect the sixth right alignment multiplexer block 2935 to a seventh right alignment multiplexer block (not shown) in a seventh connection site block.

Each of these 7 right alignment multiplexer blocks includes a right alignment multiplexer block 2700, as shown in FIG. 27A. The signals transmitted to and from each of the right alignment multiplexer blocks 2700 through conductors 2911-2926 are the $R_I$ and $R_O$ signals in FIG. 27A.

In FIG. 29, each set of three conductors connected between two right alignment multiplexer blocks, such as conductors 2913-2915, forms a 3-sided loop. The vertical conductors 2912-2913, 2915-2916, 2918-2919, 2921-2922, and 2924-2925 in each of the loops have different lengths in the y-direction compared to the vertical conductors in the other loops shown in FIG. 29. The horizontal conductor in each loop is located between different rows of the connection sites 2901 compared to the horizontal conductors in the other loops shown in FIG. 29. The average length in the y-direction of the vertical conductors 2912-2913, 2915-2916, 2918-2919, 2921-2922, and 2924-2925 equals about half the length of the connections site blocks 2600I-2600M in the y-direction.

As a result, the average delay that signals take to pass through conductors 2911-2926 and the 7 right alignment multiplexer blocks in the embodiment of FIG. 29 is about half the delay that signals take to pass through the same number of the longest conductors and multiplexer blocks in the embodiment of FIG. 28B. As an example, signals that pass through conductors 2911-2926 and the 7 right alignment multiplexer blocks of FIG. 29 may experience delays that are 1.18 times larger than the delays of signals passing through conductors that connect the same number of multiplexer blocks 511 in alignment circuitry 402 shown in FIGS. 4A-4C.

Vertical conductors having varying lengths in the y-direction as shown in FIG. 29 can be used to connect together other sets of right alignment multiplexer blocks. Vertical conductors having varying lengths in the y-direction as shown in FIG. 29 can also be used to connect together two or more left alignment multiplexer blocks.

Figure 30:
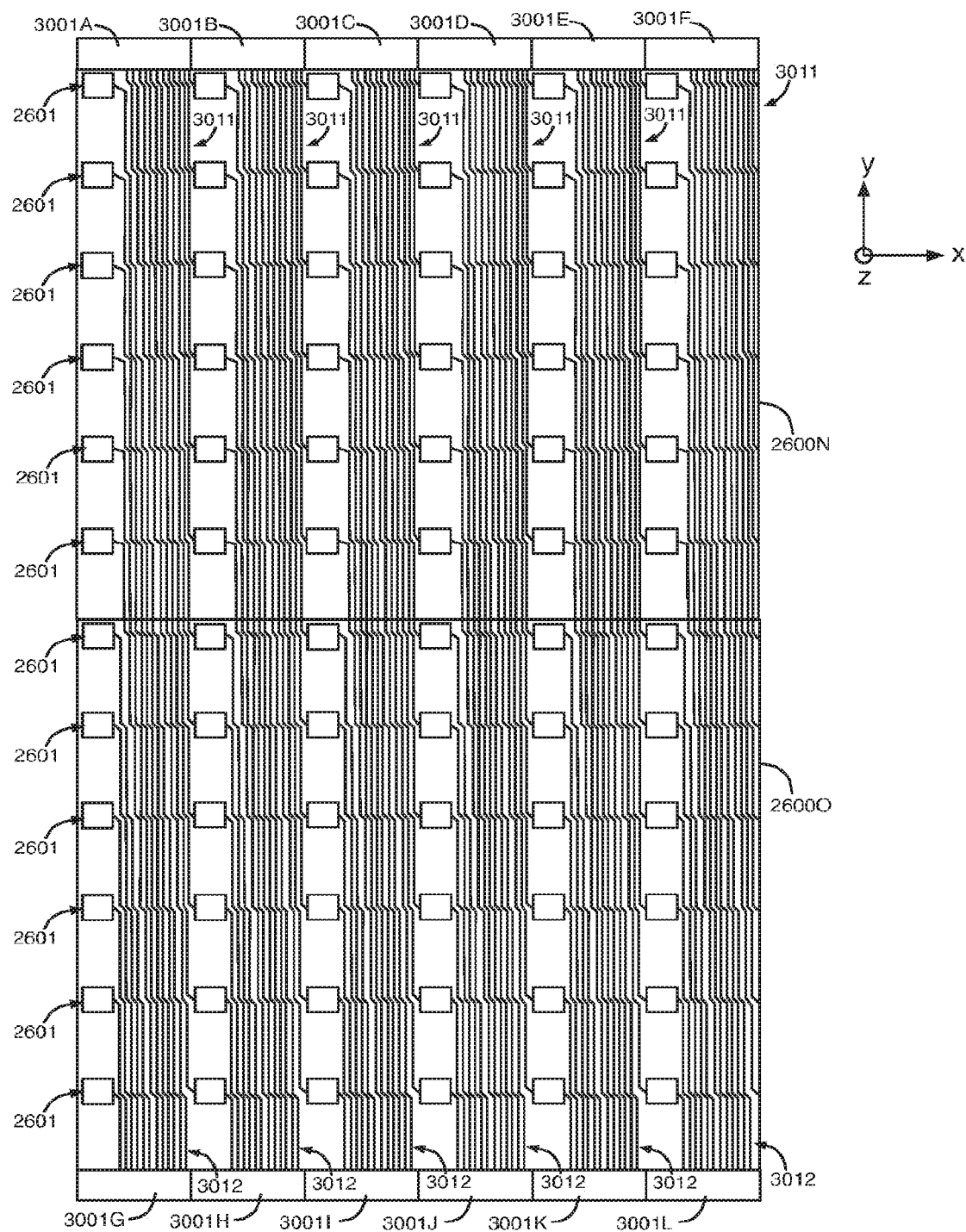
FIG. 30 illustrates examples of conductors that connect the alignment circuitry to connection sites in two connection site blocks.

FIG. 30 illustrates examples of conductors 3011-3012 that connect the right alignment multiplexer blocks in right alignment region 2610 and the left alignment multiplexer blocks in left alignment region 2611 to connection sites 2601 in two connection site blocks 2600N-2600O. Conductors 3011 connect right alignment multiplexer blocks (not shown) and left alignment multiplexer blocks (not shown) in connection site block 2600N to the connection sites 2601 in connection site block 2600N and to the connection sites 2601 in connection site block 2600O. Conductors 3012 connect right alignment multiplexer blocks (not shown) and left alignment multiplexer blocks (not shown) in connection site block 2600O to the connection sites 2601 in connection site block 2600O and to the connection sites 2601 in connection site block 2600N.

In the embodiment of FIG. 30, 6 transmit/receive circuits 3001A-3001F are located in the transmit/receive stripe in connection site block 2600N, and 6 transmit/receive circuits 3001G-3001L are located in the transmit/receive stripe in connection site block 2600O. The transmit/receive circuits 3001A-3001L buffer signals provided between the connection sites 2601 and the right and left alignment multiplexer blocks.

Figure 31:
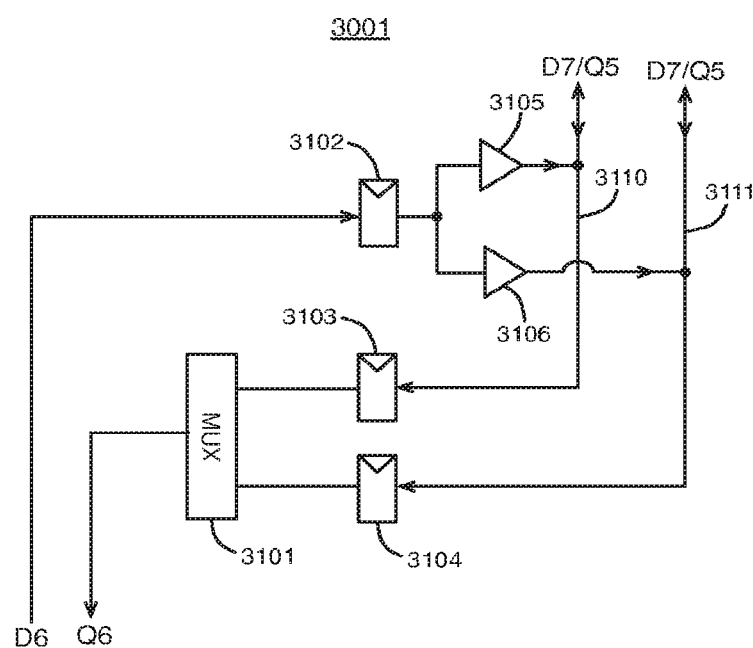
FIG. 31 illustrates an example of a transmit/receive circuit in a transmit/receive stripe in a connection site block.

FIG. 31 illustrates an example of a transmit/receive circuit 3001. The transmit/receive circuit 3001 in FIG. 31 is an example of each of the transmit/receive circuits 3001A-3001L shown in FIG. 30. As shown in FIG. 31, transmit/receive circuit 3001 includes multiplexer circuit 3101, register circuits 3102-3104, and buffer circuits 3105-3106.

A right or left alignment multiplexer block provides a signal D6 to an input of a register circuit 3102 that is located in the same connection site block as the right or left alignment multiplexer block. Register circuit 3102 stores the received signal D6. Buffer circuits 3105-3106 buffer the signal stored in register circuit 3102 to provide buffered output signals D7 on conductors 3110-3111, respectively. Signals D7 are provided to connection sites 2601 in the connection site blocks 2600N-2600O through conductors 3011 or 3012. The signal D7 output by buffer circuit 3105 is provided to a connection site in connection site block 2600N, and the signal D7 output by buffer circuit 3106 is provided to a connection site in the adjacent connection site block 2600O.

A first signal Q5 is provided from a first connection site to an input of register circuit 3103 through conductor 3110, and a second signal Q5 is provided from a second connection site to an input of register circuit 3104 through conductor 3111. Register circuits 3103 and 3104 store the first and second signals Q5, respectively. Multiplexer circuit 3101 receives the signals stored in register circuits 3103-3104 at its inputs. Multiplexer circuit 3101 selects one of the signals stored in register circuits 3103-3104 based on a select signal (not shown) to generate a signal Q6 at its output. Signal Q6 is provided from multiplexer circuit 3101 to a right or left alignment multiplexer block in one of the right and left alignment regions 2610-2611 that is located in the same connection site block as multiplexer circuit 3101.

Figure 32:
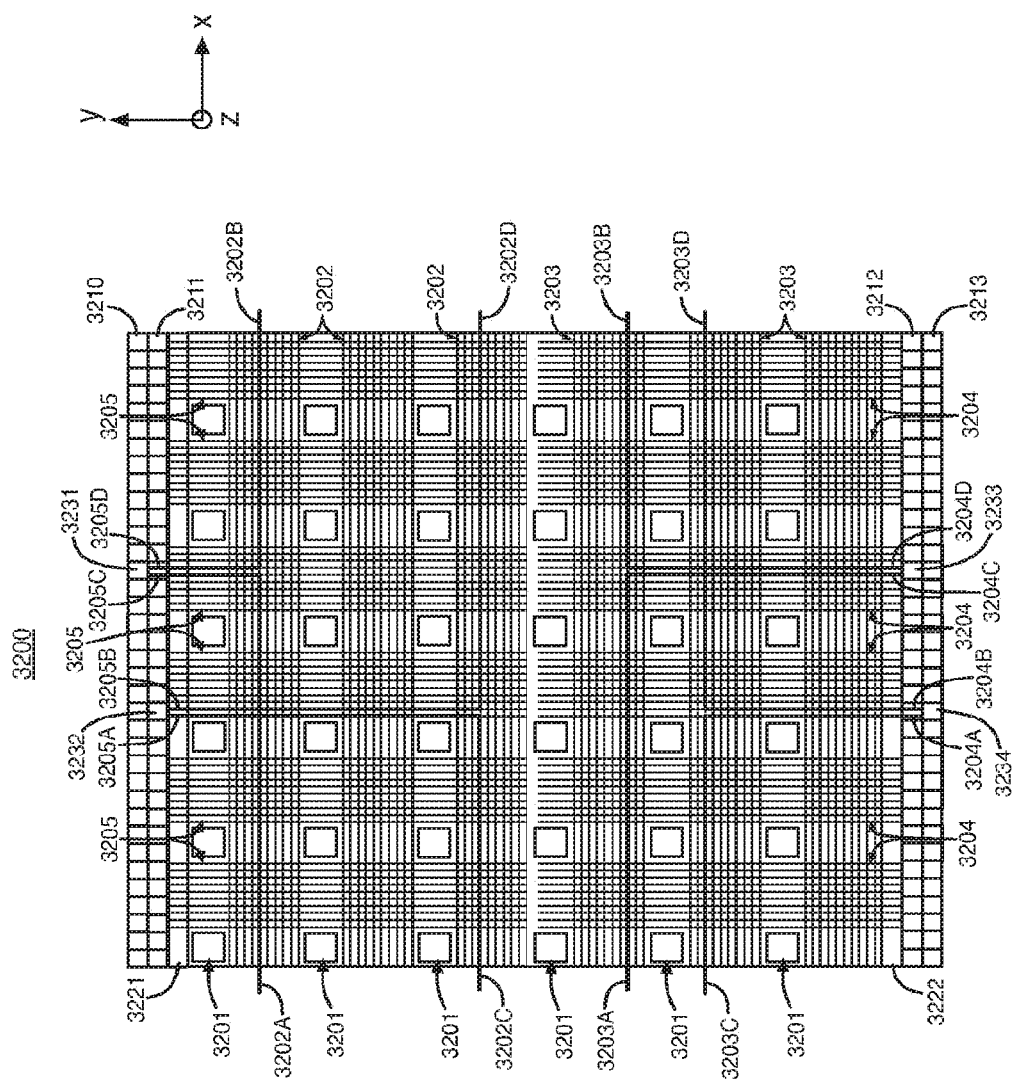
FIG. 32 illustrates an exemplary configuration having vertical conductors in a connection site block that extend up to half the length of the connection site block and that connect multiplexer blocks in the alignment circuitry.

FIG. 32 illustrates another exemplary configuration of vertical and horizontal conductors in a connection site block 3200 that connects to alignment circuitry located on two sides of the connection site block 3200. The configuration of FIG. 32 reduces the longest delays of signals passing through the vertical and horizontal conductors, because the vertical conductors are no more than half the length of the connection site block 3200 in the y-direction. Connection site block 3200 is an example of each of the connection site blocks C1-C64 in integrated circuit die 2500 shown in FIG. 25.

Connection site block 3200 includes 36 connection sites 3201. 36 connection sites 3201 are shown in FIG. 32 as an example. Connection sites 3201 are arranged in 6 rows in the x-direction and 6 columns in the y-direction in connection site block 3200. Connection site block 3200 also includes horizontal conductors 3202 and 3203 aligned in the x-direction and vertical conductors 3204 and 3205 aligned in the y-direction. Horizontal conductors 3202-3203 and vertical conductors 3204-3205 are located between the rows and columns of connection sites 3201. The vertical conductors are coupled to the horizontal conductors at selected cross over points.

Connection site block 3200 includes alignment circuitry that is divided into two sections located on opposite sides of connection site block 3200. The first section of the alignment circuitry in connection site block 3200 includes transmit/receive stripe 3221, left alignment region 3210, and right alignment region 3211. The second section of the alignment circuitry in connection site block 3200 includes transmit/receive stripe 3222, right alignment region 3212, and left alignment region 3213.

Left alignment region 3210 includes 36 left alignment multiplexer blocks, such as left alignment multiplexer block 3231. Right alignment region 3211 includes 36 right alignment multiplexer blocks, such as right alignment multiplexer block 3232. Right alignment region 3212 includes 36 right alignment multiplexer blocks, such as right alignment multiplexer block 3233. Left alignment region 3213 includes 36 left alignment multiplexer blocks, such as left alignment multiplexer block 3234.

Horizontal conductors 3202 are located only in the upper half of connection site block 3200, and horizontal conductors 3203 are located only in the lower half of connection site block 3200. Horizontal conductors 3202 and 3203 extend the entire length of connection site block 3200 in the x-direction.

Half of vertical conductors 3205 extend through transmit/receive stripe 3221 to connect to left alignment multiplexer blocks in left alignment region 3210, and half of vertical conductors 3205 extend through transmit/receive stripe 3221 to connect to right alignment multiplexer blocks in right alignment region 3211. Half of vertical conductors 3204 extend through transmit/receive stripe 3222 to connect to right alignment multiplexer blocks in right alignment region 3212, and half of vertical conductors 3204 extend through transmit/receive stripe 3222 to connect to left alignment multiplexer blocks in left alignment region 3213. Connection site block 3200 also includes vertical conductors (not shown) aligned in the y-direction that connect the processor core circuits PA-PD or PE-PH located below left alignment region 3213 to the multiplexer blocks in left alignment region 3210 and right alignment region 3211.

Vertical conductors 3205 and horizontal conductors 3202 connect the left alignment multiplexer blocks in left alignment region 3210 in each connection site block 3200 to left alignment multiplexer blocks in left alignment region 3210 in one or more other connection site blocks 3200 on the integrated circuit die. For example, vertical conductors 3205C-3205D and horizontal conductors 3202A-3202B connect left alignment multiplexer block 3231 to left alignment multiplexer blocks in left alignment regions 3210 in two other connection site blocks 3200 on the integrated circuit die.

Vertical conductors 3205 and horizontal conductors 3202 connect the right alignment multiplexer blocks in right alignment region 3211 in each connection site block 3200 to right alignment multiplexer blocks in right alignment region 3211 in one or more other connection site blocks 3200 on the integrated circuit die. For example, vertical conductors 3205A-3205B and horizontal conductors 3202C-3202D connect right alignment multiplexer block 3232 to right alignment multiplexer blocks in right alignment regions 3211 in two other connection site blocks 3200 on the integrated circuit die.

Vertical conductors 3204 and horizontal conductors 3203 connect the right alignment multiplexer blocks in right alignment region 3212 in each connection site block 3200 to right alignment multiplexer blocks in right alignment region 3212 in one or more other connection site blocks 3200 on the integrated circuit die. For example, vertical conductors 3204C-3204D and horizontal conductors 3203A-3203B connect right alignment multiplexer block 3233 to right alignment multiplexer blocks in right alignment regions 3212 in two other connection site blocks 3200 on the integrated circuit die.

Vertical conductors 3204 and horizontal conductors 3203 connect the left alignment multiplexer blocks in left alignment region 3213 in each connection site block 3200 to left alignment multiplexer blocks in left alignment region 3213 in one or more other connection site blocks 3200 on the integrated circuit die. For example, vertical conductors 3204A-3204B and horizontal conductors 3203C-3203D connect left alignment multiplexer block 3234 to left alignment multiplexer blocks in left alignment regions 3213 in two other connection site blocks 3200 on the integrated circuit die.

Vertical conductors 3205 are located only in the upper half of connection site block 3200, and vertical conductors 3204 are located only in the lower half of connection site block 3200. Each of the vertical conductors 3204 and 3205 extends up to one-half the length of connection site block 3200 in the y-direction. The average length of vertical conductors 3204-3205 in the y-direction is only about one-half the average length of the vertical conductors in the connection site blocks of FIGS. 28A-28B. As a result, the delays of signals passing through conductors 3202-3205 are substantially less than the delays of signals passing through the conductors in the connection site blocks of FIGS. 28A-28B. As an example, the delays of signals passing between multiplexer blocks through conductors 3202-3205 may be 1.35 times larger than the delays of signals passing through conductors that connect the same number of multiplexer blocks in alignment circuitry 402 of FIGS. 4A-4C.

Each vertical track of conductors in connection site block 3200 includes a vertical conductor 3204 and a vertical conductor 3205 that is directly above the vertical conductor 3204. Vertical conductors 3204 and 3205 are not connected together. Because vertical conductors 3204-3205 are located only in respective halves of connection site block 3200, and vertical conductors 3204-3205 are no more than half the length of connection site block 3200 in the y-direction, less vertical tracks of conductors are used to conduct the same number of signals in the embodiment of FIG. 32 compared to the embodiments of FIGS. 28A-29. As a result, connection site block 3200 has increased flexibility for varying its length in the y-direction. As an example that is not intended to be limiting, connection site block 3200 may have 180 conductors 3202, 180 conductors 3203, 144 conductors 3204, and 144 conductors 3205.

In an embodiment, horizontal conductors 3202, vertical conductors 3205, the left alignment multiplexer blocks in left alignment region 3210, and the right alignment multiplexer blocks in right alignment region 3211 provide a first half of the data signals DQ0-DQ3 and a first half of the command address signals CA between the connection sites and the processor core circuits PA-PH. In this embodiment, horizontal conductors 3203, vertical conductors 3204, the left alignment multiplexer blocks in left alignment region 3213, and the right alignment multiplexer blocks in right alignment region 3212 provide a second half of the data signals DQ0-DQ3 and a second half of the command address signals CA between the connection sites and the processor core circuits PA-PH.

The foregoing description of the exemplary embodiments has been presented for the purposes of illustration and description. The foregoing description is not intended to be exhaustive or limiting to the examples disclosed herein. In some instances, certain features of the embodiments can be employed without a corresponding use of other features as set forth. Many modifications, substitutions, and variations are possible in light of the above teachings, without departing from the scope of the claims.

What is claimed is:

1. An integrated circuit die, comprising:
   connection sites at least on a surface of the integrated circuit die;
   first and second core circuits;
   alignment circuitry configurable to couple the first and the second core circuits to respective subsets of the connection sites, wherein the alignment circuitry transmits a first memory access request from one of the first and the second core circuits to at least one of the connection sites; and
   arbitration circuitry that causes a first time interval reserved for transmitting first signals for the first memory access request through the alignment circuitry and a second time interval reserved for transmitting second signals for the first memory access request through the alignment circuitry to begin at respective times.

2. The integrated circuit die of claim 1, wherein the arbitration circuitry causes the first time interval and the second time interval to begin at respective times independent of bank states of an external memory device being accessed by the first memory access request.

3. The integrated circuit die of claim 2, wherein the bank states of the external memory device include page hit, page miss, and page empty states.

4. The integrated circuit die of claim 1, wherein the arbitration circuitry causes the first time interval and the second time interval to begin at respective times that differ based on bank states of an external memory device being accessed by the first memory access request.

5. The integrated circuit die of claim 1, wherein the first and the second core circuits generate memory access requests that each comprise a pre-charge command pre-pended to an activate command.

6. The integrated circuit die of claim 1, wherein the arbitration circuitry causes the first time interval to be reserved for transmitting address signals for the first memory access request through the alignment circuitry and the second time interval to be reserved for transmitting data signals for the first memory access request through the alignment circuitry.

7. The integrated circuit die of claim 1, wherein the alignment circuitry transmits a second memory access request from one of the first and the second core circuits to at least one of the connection sites, and
wherein the arbitration circuitry causes a third time interval reserved for transmitting address signals for the second memory access request through the alignment circuitry and a fourth time interval reserved for transmitting data signals for the second memory access request through the alignment circuitry to begin at respective times independent of bank states of an external memory device being accessed by the second memory access request.

8. The integrated circuit die of claim 1, wherein the alignment circuitry transmits a second memory access request from one of the first and the second core circuits to at least one of the connection sites, and
wherein the arbitration circuitry causes a third time interval reserved for transmitting address signals for the second memory access request through the alignment circuitry and a fourth time interval reserved for transmitting data signals for the second memory access request through the alignment circuitry to begin at respective times that differ based on bank states of an external memory device being accessed by the second memory access request.

9. The integrated circuit die of claim 1, wherein:
the surface is a first surface, and
the connection sites comprise through-silicon-vias that extend through the integrated circuit die from the first surface to a second surface, opposite the first surface.

10. The integrated circuit die of claim 1, wherein the integrated circuit die comprises a memory integrated circuit.

11. The integrated circuit die of claim 1, wherein the integrated circuit die comprises a processor integrated circuit.

12. The integrated circuit die of claim 1, wherein the connection sites are located within a contiguous region of a surface of the integrated circuit die, and wherein the first core circuit and the second core circuit are located outside the contiguous region.

13. A method of operation in an integrated circuit die, the method comprising:
coupling, via alignment circuitry, first and the second core circuits of the integrated circuit die to respective subsets of connection sites of the integrated circuit die, the connection sites located at least on a surface of the integrated circuit die; and
transmitting a first memory access request from one of the first and the second core circuits to at least one of the connection sites via the alignment circuitry, a first time interval reserved for transmitting first signals for the first memory access request through the alignment circuitry and a second time interval reserved for transmitting second signals for the first memory access request through the alignment circuitry beginning at respective times.

14. The method of claim 13, wherein the first time interval and the second time interval begin at respective times that are independent of bank states of an external memory device being accessed by the first memory access request.

15. The method of claim 14, wherein the bank states of the external memory device include page hit, page miss, and page empty states.

16. The method of claim 13, wherein the first time interval and the second time interval begin at respective times that differ based on bank states of an external memory device being accessed by the first memory access request.

17. The method of claim 13, wherein the first and the second core circuits generate memory access requests that each comprise a pre-charge command pre-pended to an activate command.

18. The method of claim 13, further comprising:
causing the first time interval to be reserved for transmitting address signals for the first memory access request through the alignment circuitry and the second time interval to be reserved for transmitting data signals for the first memory access request through the alignment circuitry.

19. The method of claim 13, further comprising:
transmitting a second memory access request from one of the first and the second core circuits to at least one of the connection sites, a third time interval reserved for transmitting address signals for the second memory access request through the alignment circuitry and a fourth time interval reserved for transmitting data signals for the second memory access request through the alignment circuitry beginning at respective times independent of bank states of an external memory device being accessed by the second memory access request.

20. The method of claim 13, further comprising:
transmitting a second memory access request from one of the first and the second core circuits to at least one of the connection sites, a third time interval reserved for transmitting address signals for the second memory access request through the alignment circuitry and a fourth time interval reserved for transmitting data signals for the second memory access request through the alignment circuitry beginning at respective times that differ based on bank states of an external memory device being accessed by the second memory access request.

* * * * *